(12) United States Patent
Yanagisawa et al.

(10) Patent No.: US 11,830,951 B2
(45) Date of Patent: Nov. 28, 2023

(54) SEMICONDUCTOR DEVICE INCLUDING TRANSISTOR AND CAPACITOR

(71) Applicant: Semiconductor Energy Laboratory Co., Ltd., Atsugi (JP)

(72) Inventors: Yuichi Yanagisawa, Atsugi (JP); Hisao Ikeda, Zama (JP); Tsutomu Murakawa, Isehara (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 35 days.

(21) Appl. No.: 17/432,123

(22) PCT Filed: Feb. 27, 2020

(86) PCT No.: PCT/IB2020/051663
§ 371 (c)(1),
(2) Date: Aug. 19, 2021

(87) PCT Pub. No.: WO2020/183277
PCT Pub. Date: Sep. 17, 2020

(65) Prior Publication Data
US 2022/0157992 A1    May 19, 2022

(30) Foreign Application Priority Data
Mar. 12, 2019    (JP) .................. 2019-044538

(51) Int. Cl.
*H01L 29/786* (2006.01)
*H01L 29/417* (2006.01)
(52) U.S. Cl.
CPC .... *H01L 29/7869* (2013.01); *H01L 29/41733* (2013.01); *H01L 29/78618* (2013.01); *H01L 29/78696* (2013.01)

(58) Field of Classification Search
None
See application file for complete search history.

(56) References Cited

U.S. PATENT DOCUMENTS

| 8,367,488 B2 | 2/2013 | Ichiryu et al. |
| 8,455,868 B2 | 6/2013 | Yamazaki et al. |

(Continued)

FOREIGN PATENT DOCUMENTS

| CN | 102067320 A | 5/2011 |
| CN | 102870220 A | 1/2013 |

(Continued)

OTHER PUBLICATIONS

International Search Report (Application No. PCT/IB2020/051663) dated Jun. 16, 2020.

(Continued)

*Primary Examiner* — Nilufa Rahim
(74) *Attorney, Agent, or Firm* — ROBINSON INTELLECTUAL PROPERTY LAW OFFICE; Eric J. Robinson

(57) ABSTRACT

A semiconductor device with high productivity is provided. The semiconductor device includes a first and a second transistor and a first and a second capacitor. The first and the second transistor include gate electrodes and back gate electrodes. The second transistor is provided in a layer above the first transistor, and the second capacitor is provided in a layer above the first capacitor. One electrode of the first capacitor is electrically connected to one of a source electrode and a drain electrode of the first transistor and electrically connected to one of a source electrode and a drain electrode of the second transistor. The other electrode of the first capacitor is formed in the same layer as the back gate electrode of the second transistor.

7 Claims, 30 Drawing Sheets

(56) References Cited

U.S. PATENT DOCUMENTS

| | | |
|---|---|---|
| 8,547,771 B2 | 10/2013 | Koyama |
| 8,854,865 B2 | 10/2014 | Saito |
| 9,293,594 B2 | 3/2016 | Nishimura et al. |
| 9,990,965 B2 | 6/2018 | Atsumi |
| 10,685,983 B2 | 6/2020 | Ito et al. |
| 11,004,923 B2 | 5/2021 | Lim et al. |
| 2011/0121298 A1 | 5/2011 | Ichiryu et al. |
| 2012/0292680 A1* | 11/2012 | Nagatsuka ............... H01L 27/06 257/300 |
| 2013/0214279 A1 | 8/2013 | Nishimura et al. |
| 2015/0348997 A1* | 12/2015 | Sasagawa ........... H01L 27/1259 257/43 |
| 2016/0163870 A1* | 6/2016 | Ito ....................... H01L 21/0228 257/43 |
| 2018/0138208 A1* | 5/2018 | Ito ....................... H01L 27/1207 |
| 2019/0189720 A1 | 6/2019 | Lim et al. |
| 2020/0243514 A1 | 7/2020 | Yamazaki et al. |
| 2020/0343244 A1 | 10/2020 | Onuki et al. |
| 2021/0050052 A1 | 2/2021 | Okamoto et al. |
| 2021/0225978 A1 | 7/2021 | Lim et al. |

FOREIGN PATENT DOCUMENTS

| | | |
|---|---|---|
| CN | 110034159 A | 7/2019 |
| JP | 2011-151383 A | 8/2011 |
| JP | 2012-257187 A | 12/2012 |
| JP | 2018-085503 A | 5/2018 |
| JP | 2019-109509 A | 7/2019 |
| KR | 2013-0060200 A | 6/2013 |
| KR | 2019-0073848 A | 6/2019 |
| WO | WO-2010/134234 | 11/2010 |
| WO | WO-2011/135908 | 11/2011 |

OTHER PUBLICATIONS

Written Opinion (Application No. PCT/IB2020/051663) dated Jun. 16, 2020.

* cited by examiner

FIG. 19A
FIG. 19B
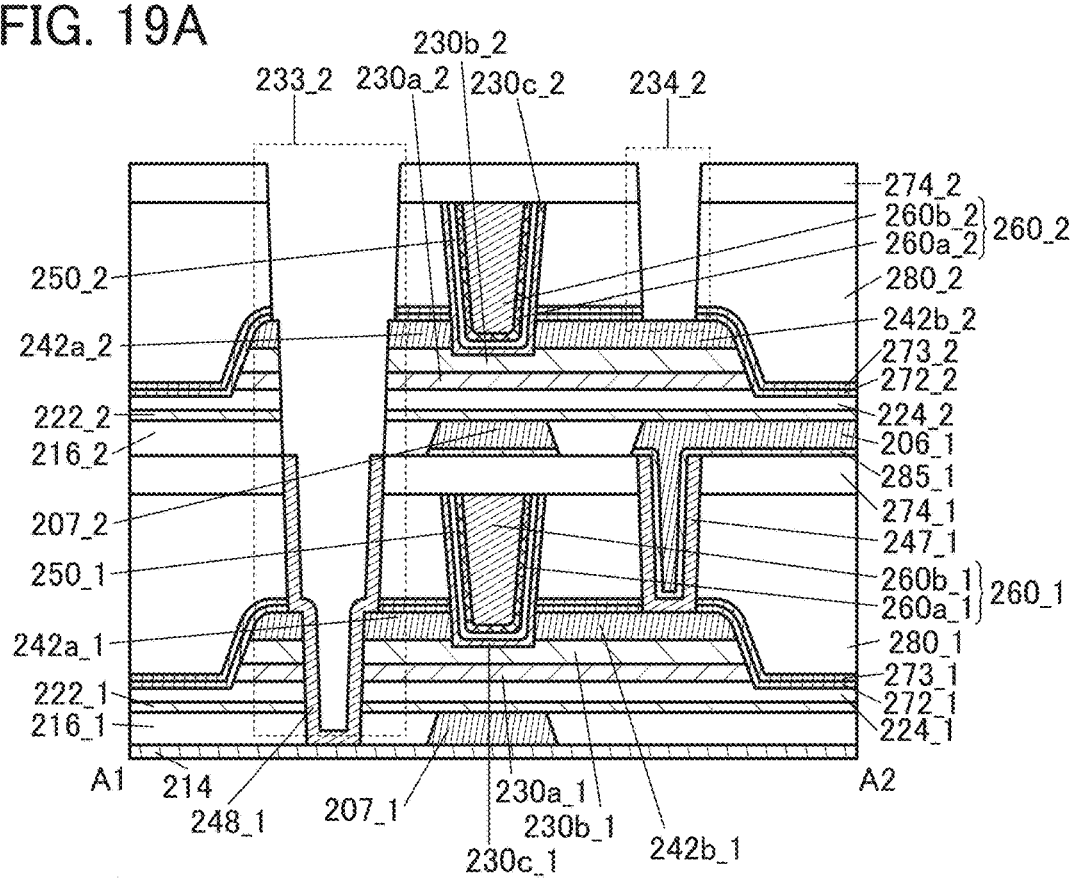
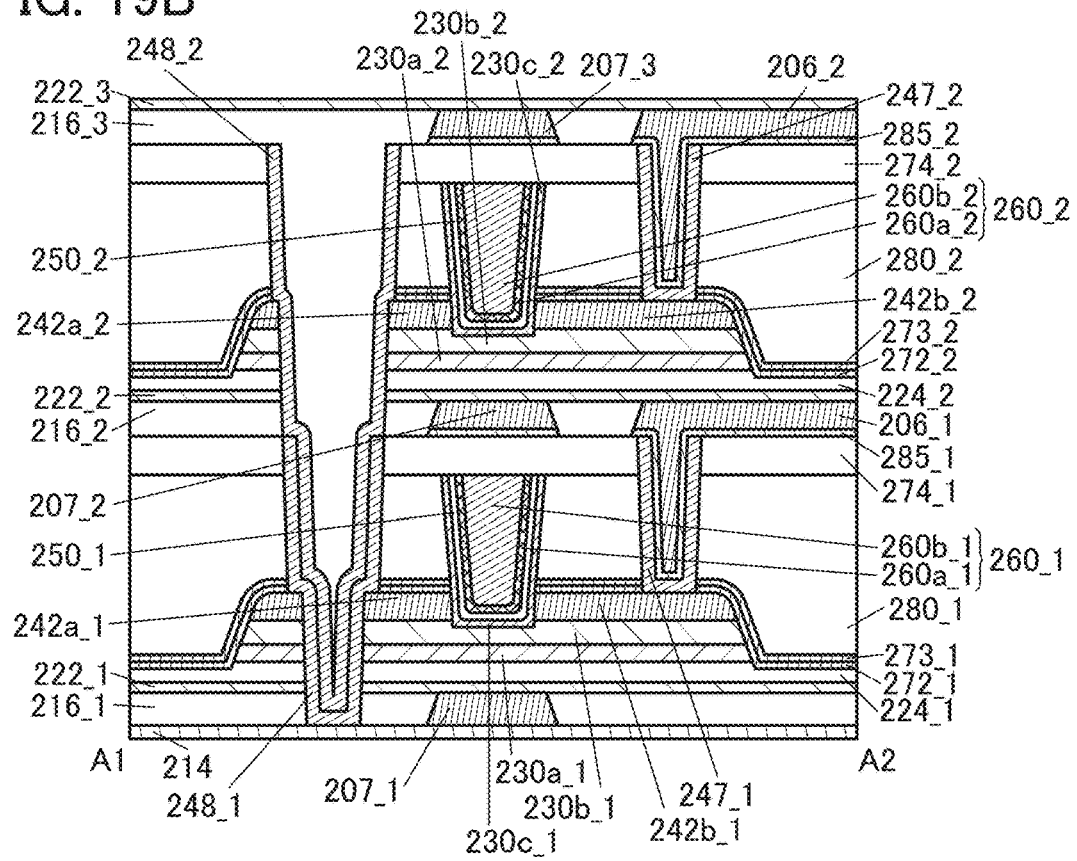

FIG. 23A
| Amorphous | Intermediate state / New crystalline phase / Crystalline | Crystal |
|---|---|---|
| completely amorphous | ·CAAC<br>·nc<br>·CAC<br>excluding single crystal and poly crystal | ·single crystal<br>·poly crystal |
FIG. 23B
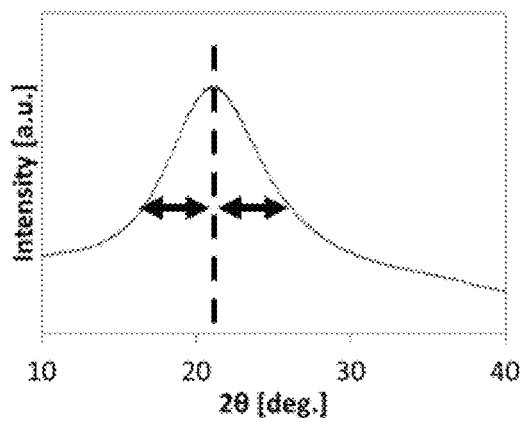
FIG. 23C
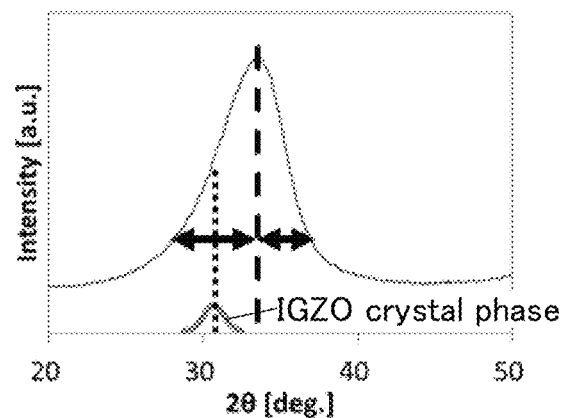
FIG. 23D
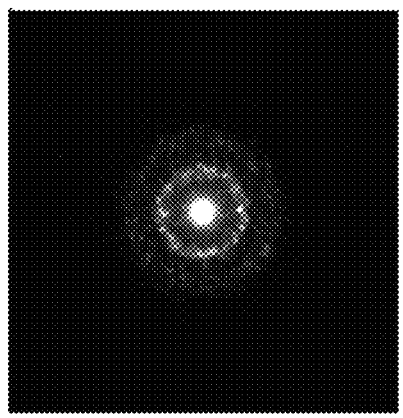

FIG. 29A
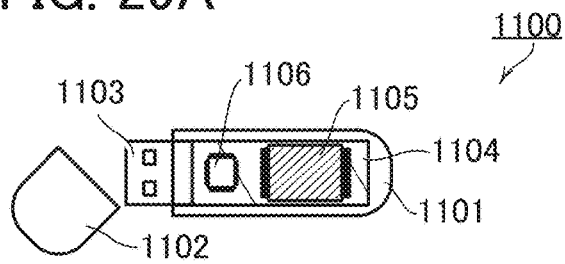
FIG. 29B
FIG. 29C
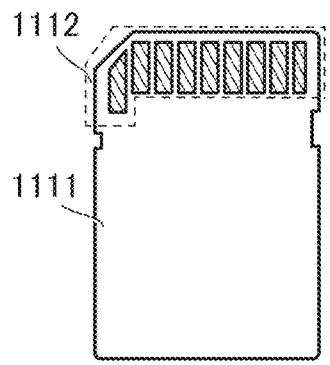
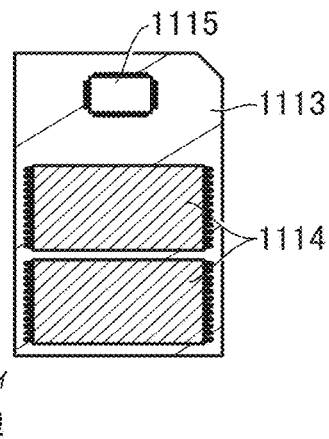
FIG. 29D
FIG. 29E
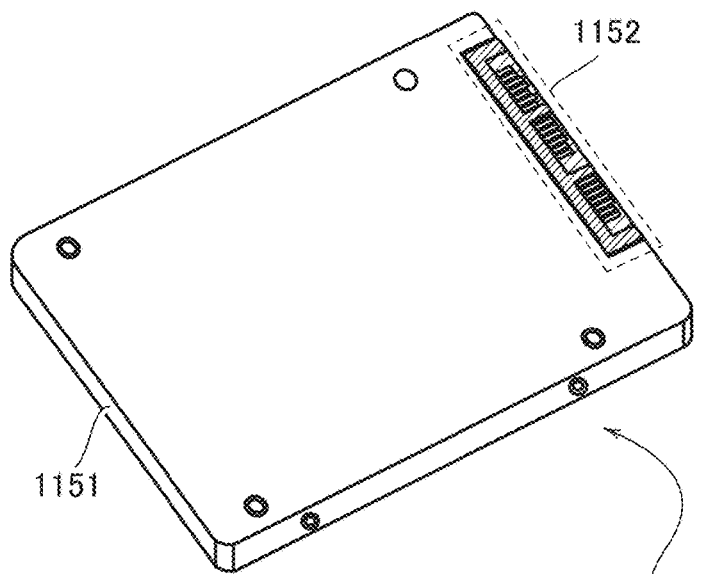
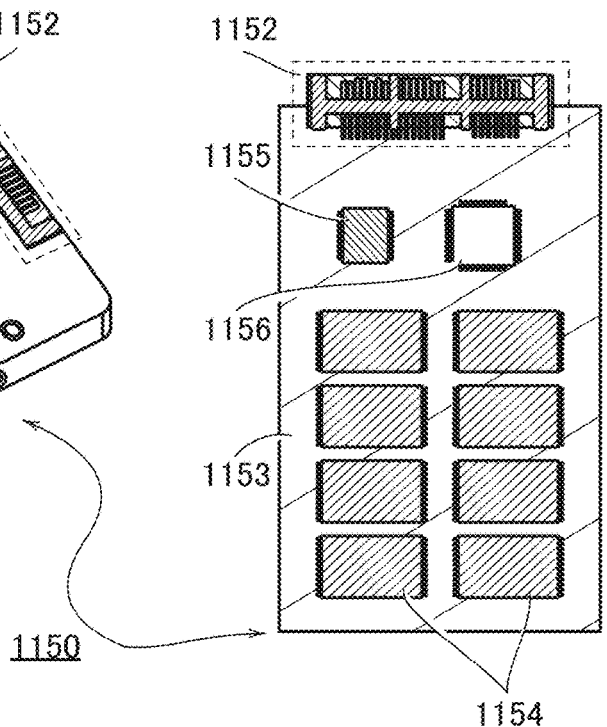

SEMICONDUCTOR DEVICE INCLUDING TRANSISTOR AND CAPACITOR

TECHNICAL FIELD

One embodiment of the present invention relates to a semiconductor device and a method for manufacturing the semiconductor device. Alternatively, one embodiment of the present invention relates to a semiconductor wafer, a module, and an electronic device.

Note that in this specification and the like, a semiconductor device generally means a device that can function by utilizing semiconductor characteristics. A semiconductor element such as a transistor, a semiconductor circuit, an arithmetic device, and a memory device are each one embodiment of a semiconductor device. It can be sometimes said that a display device (a liquid crystal display device, a light-emitting display device, and the like), a projection device, a lighting device, an electro-optical device, a power storage device, a memory device, a semiconductor circuit, an imaging device, an electronic device, and the like include a semiconductor device.

Note that one embodiment of the present invention is not limited to the above technical field. One embodiment of the invention disclosed in this specification and the like relates to an object, a method, or a manufacturing method. Alternatively, one embodiment of the present invention relates to a process, a machine, manufacture, or a composition of matter.

BACKGROUND ART

In recent years, semiconductor devices have been developed and an LSI, a CPU, and a memory are mainly used. A CPU is an aggregation of semiconductor elements in which an electrode which is a connection terminal is formed, which includes a semiconductor integrated circuit (at least a transistor and a memory) separated from a semiconductor wafer.

A semiconductor circuit (IC chip) of LSIs, CPUs, memories, and the like is mounted on a circuit board, for example, a printed wiring board, to be used as one of components of a variety of electronic devices.

A technique by which a transistor is formed using a semiconductor thin film formed over a substrate having an insulating surface has been attracting attention. The transistor is applied to a wide range of electronic devices such as an integrated circuit (IC) or an image display device (also simply referred to as a display device). A silicon-based semiconductor material is widely known as a semiconductor thin film applicable to the transistor; in addition, an oxide semiconductor has been attracting attention as another material.

It is known that a transistor using an oxide semiconductor has an extremely low leakage current in a non-conduction state. For example, a low-power-consumption CPU utilizing a characteristic of a low leakage current of the transistor using an oxide semiconductor is disclosed (see Patent Document 1). Furthermore, a memory device that can retain stored contents for a long time by utilizing a characteristic of a low leakage current of the transistor using an oxide semiconductor is disclosed, for example (see Patent Document 2).

In recent years, demand for an integrated circuit with higher density has risen with reductions in size and weight of electronic devices. Furthermore, the productivity of a semiconductor device including an integrated circuit is required to be improved.

REFERENCE

Patent Document

[Patent Document 1] Japanese Published Patent Application No. 2012-257187
[Patent Document 2] Japanese Published Patent Application No. 2011-151383

SUMMARY OF THE INVENTION

Problems to be Solved by the Invention

An object of one embodiment of the present invention is to provide a semiconductor device with high productivity. Another object of one embodiment of the present invention is to provide a semiconductor device that can be miniaturized or highly integrated. Another object of one embodiment of the present invention is to provide a semiconductor device with high storage capacity. Another object of one embodiment of the present invention is to provide a semiconductor device with high reliability. Another object of one embodiment of the present invention is to provide a semiconductor device with a high on-state current. Another object of one embodiment of the present invention is to provide a semiconductor device with a low off-state current. Another object of one embodiment of the present invention is to provide a semiconductor device having excellent frequency characteristics.

Another object of one embodiment of the present invention is to provide a semiconductor device capable of retaining data for a long time. Another object of one embodiment of the present invention is to provide a semiconductor device capable of high-speed data writing. Another object of one embodiment of the present invention is to provide a semiconductor device with high design flexibility. Another object of one embodiment of the present invention is to provide a semiconductor device in which power consumption can be reduced. Another object of one embodiment of the present invention is to provide a novel semiconductor device.

Another object of one embodiment of the present invention is to provide a method for manufacturing a semiconductor device with high productivity. Another object of one embodiment of the present invention is to provide a method for manufacturing a semiconductor device that can be miniaturized or highly integrated. Another object of one embodiment of the present invention is to provide a method for manufacturing a semiconductor device with high storage capacity. Another object of one embodiment of the present invention is to provide a method for manufacturing a semiconductor device with high reliability. Another object of one embodiment of the present invention is to provide a method for manufacturing a semiconductor device with a high on-state current. Another object of one embodiment of the present invention is to provide a method for manufacturing a semiconductor device with a low off-state current. Another object of one embodiment of the present invention is to provide a method for manufacturing a semiconductor device having excellent frequency characteristics.

Another object of one embodiment of the present invention is to provide a method for manufacturing a semiconductor device capable of retaining data for a long time. Another object of one embodiment of the present invention is to provide a method for manufacturing a semiconductor device capable of high-speed data writing. Another object of one embodiment of the present invention is to provide a method for manufacturing a semiconductor device with high design flexibility. Another object of one embodiment of the present invention is to provide a method for manufacturing a semiconductor device in which power consumption can be reduced. Another object of one embodiment of the present invention is to provide a method for manufacturing a novel semiconductor device.

Note that the description of these objects does not preclude the existence of other objects. One embodiment of the present invention does not have to achieve all these objects. Note that objects other than these will be apparent from the description of the specification, the drawings, the claims, and the like, and objects other than these can be derived from the description of the specification, the drawings, the claims, and the like.

Means for Solving the Problems

One embodiment of the present invention is a semiconductor device including a first transistor, a second transistor, and a capacitor, in which the first transistor includes a first conductor, a second conductor, a third conductor, and a first oxide; the first oxide includes a first channel formation region; the first conductor is provided below the first oxide; the second conductor is provided above the first oxide; the first conductor includes a region overlapping with the first channel formation region; the second conductor includes a region overlapping with the first channel formation region; the third conductor includes a region in contact with the first oxide; the second transistor includes a fourth conductor, a fifth conductor, and a second oxide; the second oxide includes a second channel formation region; the fourth conductor is provided above the second conductor; the fourth conductor is provided below the second oxide; the fifth conductor is provided above the second oxide; the fourth conductor includes a region overlapping with the second channel formation region; the fifth conductor includes a region overlapping with the second channel formation region; the capacitor includes a sixth conductor, a seventh conductor, and an insulator; the sixth conductor is provided below the insulator; the seventh conductor is provided above the insulator; the sixth conductor includes a region in contact with the third conductor; the seventh conductor is provided in the same layer as the fourth conductor.

Alternatively, in the above embodiment, the first transistor may further include an eighth conductor; the second transistor may further include a ninth conductor; the eighth conductor may include a region in contact with the first oxide; the ninth conductor may include a region in contact with the second oxide; a tenth conductor may be provided to include a region that is in contact with a side surface of the first oxide and a side surface of the eighth conductor; the eighth conductor and the ninth conductor may be electrically connected to each other through the tenth conductor.

Alternatively, in the above embodiment, a top surface of the sixth conductor and a top surface of the tenth conductor may be the same.

Alternatively, in the above embodiment, an eleventh conductor may be provided to include a region in contact with a side surface of the insulator, a side surface of the second oxide, and a side surface of the ninth conductor.

Alternatively, in the above embodiment, the first and second oxides may contain In, an element M (M is Al, Ga, Y, or Sn), and Zn.

Alternatively, one embodiment of the present invention is a method for manufacturing a semiconductor device, including: forming a first conductor; depositing a first insulator, a first oxide film, and a first conductive film in this order over the first conductor; forming a first oxide by processing the first conductive film and the first oxide film to have an island shape and forming a first opening reaching the first insulator; forming a second insulator over the first conductive film and the first insulator; forming a second conductor and a third conductor by forming a second opening reaching the first oxide in the second insulator and the first conductive film; forming a third insulator and a fourth conductor inside the second opening; forming a third opening including a region overlapping with the first opening and a fourth opening reaching the second conductor in the second insulator; forming a fifth conductor and a sixth conductor inside the third opening and the fourth opening, respectively; forming a fourth insulator over the sixth conductor; forming a seventh conductor including a region overlapping with the first conductor and an eighth conductor including a region overlapping with the sixth conductor over the fourth insulator; depositing a fifth insulator, a second oxide film, and a second conductive film in this order over the seventh conductor and the eighth conductor; forming a second oxide by processing the second conductive film and the second oxide film to have an island shape and forming a fifth opening reaching the fifth insulator; forming a sixth insulator over the second conductive film and the fifth insulator; forming a ninth conductor and a tenth conductor by forming a sixth opening reaching the second oxide in the sixth insulator and the second conductive film; and forming a seventh insulator and an eleventh conductor inside the sixth opening.

Alternatively, in the above embodiment, a seventh opening that includes a region overlapping with the fifth opening and reaches the fifth conductor may be formed in the sixth insulator, the fifth insulator, and the fourth insulator, and an eighth opening reaching the ninth conductor may be formed in the sixth insulator.

Alternatively, in the above embodiments, a twelfth conductor and a thirteenth conductor may be formed inside the seventh opening and the eighth opening, respectively; an eighth insulator may be formed over the thirteenth conductor; and a fourteenth conductor including a region overlapping with the seventh conductor and a fifteenth conductor including a region overlapping with the thirteenth conductor may be formed over the eighth insulator.

Alternatively, in the above embodiment, the first and second oxides contain In, an element M (M is Al, Ga, Y, or Sn), and Zn.

Effect of the Invention

According to one embodiment of the present invention, a semiconductor device with high productivity can be provided. According to another embodiment of the present invention, a semiconductor device that can be miniaturized or highly integrated can be provided. According to another embodiment of the present invention, a semiconductor device with high storage capacity can be provided. According to another embodiment of the present invention, a semiconductor device with high reliability can be provided. According to another embodiment of the present invention, a semiconductor device with a high on-state current can be provided. According to another embodiment of the present invention, a semiconductor device with a low off-state current can be provided. According to another embodiment of the present invention, a semiconductor device having excellent frequency characteristics can be provided.

According to another embodiment of the present invention, a semiconductor device capable of retaining data for a long time can be provided. According to another embodiment of the present invention, a semiconductor device capable of high-speed data writing can be provided. According to another embodiment of the present invention, a semiconductor device with high design flexibility can be provided. According to another embodiment of the present invention, a semiconductor device in which power consumption can be reduced can be provided. According to another embodiment of the present invention, a novel semiconductor device can be provided.

According to another embodiment of the present invention, a method for manufacturing a semiconductor device with high productivity can be provided. According to another embodiment of the present invention, a method for manufacturing a semiconductor device that can be miniaturized or highly integrated can be provided. According to another embodiment of the present invention, a method for manufacturing a semiconductor device with high storage capacity can be provided. According to another embodiment of the present invention, a method for manufacturing a semiconductor device with high reliability can be provided. According to another embodiment of the present invention, a method for manufacturing a semiconductor device with a high on-state current can be provided. According to another embodiment of the present invention, a method for manufacturing a semiconductor device with a low off-state current can be provided. According to another embodiment of the present invention, a method for manufacturing a semiconductor device having excellent frequency characteristics can be provided.

According to another embodiment of the present invention, a method for manufacturing a semiconductor device capable of retaining data for a long time can be provided. According to another embodiment of the present invention, a method for manufacturing a semiconductor device capable of high-speed data writing can be provided. According to another embodiment of the present invention, a method for manufacturing a semiconductor device with high design flexibility can be provided. According to another embodiment of the present invention, a method for manufacturing a semiconductor device in which power consumption can be reduced can be provided. According to another embodiment of the present invention, a method for manufacturing a novel semiconductor device can be provided.

Note that the description of these effects does not preclude the existence of other effects. One embodiment of the present invention does not have to have all these effects. Note that effects other than these will be apparent from the description of the specification, the drawings, the claims, and the like, and effects other than these can be derived from the description of the specification, the drawings, the claims, and the like.

BRIEF DESCRIPTION OF THE DRAWINGS

FIG. 19A and FIG. 19B are cross-sectional views illustrating the example of a method for manufacturing a semiconductor device.

FIG. 23A is a diagram showing the classification of crystal structures of IGZO. FIG. 23B is a diagram showing an XRD spectrum of quartz glass. FIG. 23C is a diagram showing an XRD spectrum of Crystalline IGZO. FIG. 23D is a diagram showing a nanobeam electron diffraction pattern of Crystalline IGZO.

FIG. 29A to FIG. 29E are schematic diagrams illustrating structure examples of memory devices.

FIG. 30A to FIG. 30D, FIG. 30E1, FIG. 30E2, and FIG. 30F are diagrams illustrating electronic devices.

MODE FOR CARRYING OUT THE INVENTION

Figure 1A:
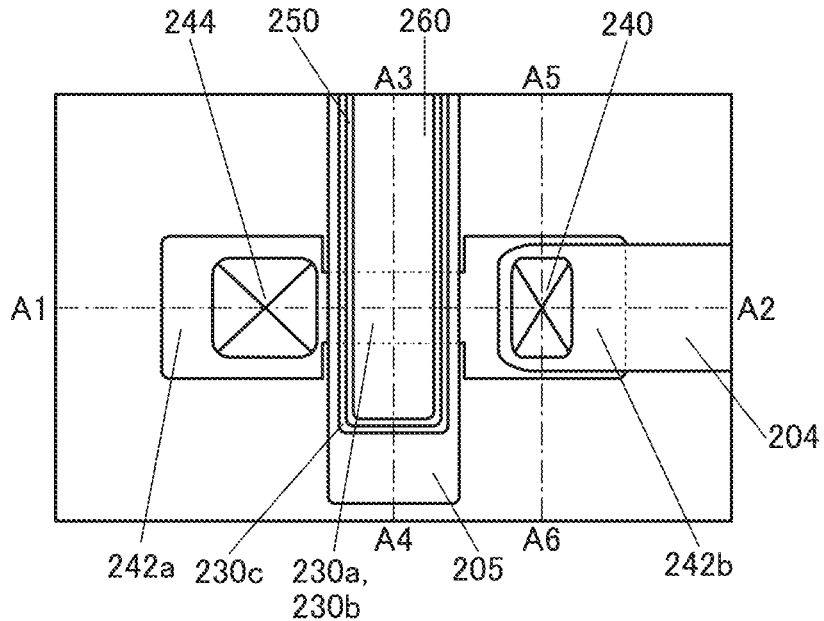
FIG. 1A is a top view illustrating a structure example of a semiconductor device.

Hereinafter, embodiments will be described with reference to the drawings. Note that the embodiments can be implemented in many different modes, and it will be readily understood by those skilled in the art that modes and details thereof can be changed in various ways without departing from the spirit and scope thereof. Thus, the present invention should not be interpreted as being limited to the description of the embodiments below.

In the drawings, the size, the layer thickness, or the region is exaggerated for clarity in some cases. Therefore, they are not limited to the illustrated scale. Note that the drawings are schematic views showing ideal examples, and embodiments of the present invention are not limited to shapes or values shown in the drawings. For example, in an actual manufacturing process, a layer, a resist mask, or the like might be unintentionally reduced in size by treatment such as etching, which might not be reflected in the drawings for easy understanding. Note that in drawings, the same reference numerals are used, in different drawings, for the same portions or portions having similar functions, and repeated description thereof is omitted in some cases. Furthermore, the same hatch pattern is used for the portions having similar functions, and the portions are not especially denoted by reference numerals in some cases.

Furthermore, especially in a top view (also referred to as a "plan view"), a perspective view, or the like, the description of some components might be omitted for easy understanding of the invention. The description of some hidden lines and the like might also be omitted.

The ordinal numbers such as first and second in this specification and the like are used for convenience and do not denote the order of steps or the stacking order of layers. Therefore, for example, description can be made even when "first" is replaced with "second", "third", or the like as appropriate. In addition, the ordinal numbers in this specification and the like do not sometimes correspond to the ordinal numbers that are used to specify one embodiment of the present invention.

Also, in this specification and the like, terms for describing arrangement such as "over" and "under" are used for convenience in describing a positional relation between components with reference to drawings. The positional relation between components is changed as appropriate in accordance with a direction in which each component is described. Thus, without limitation to terms described in this specification, the description can be changed appropriately depending on the situation.

When this specification and the like explicitly state that X and Y are connected, for example, the case where X and Y are electrically connected, the case where X and Y are functionally connected, and the case where X and Y are directly connected are regarded as being disclosed in this specification and the like. Accordingly, without being limited to a predetermined connection relation, for example, a connection relation shown in drawings or texts, a connection relation other than one shown in drawings or texts is disclosed in the drawings or the texts.

Here, X and Y each denote an object (e.g., a device, an element, a circuit, a wiring, an electrode, a terminal, a conductive film, or a layer).

In this specification and the like, the expression "electrically connected" includes the case where components are directly connected to each other and the case where components are connected through an "object having any electric function". There is no particular limitation on the "object having any electric function" as long as electric signals can be transmitted and received between components that are connected through the object. Thus, even when the expression "electrically connected" is used, there is a case where no physical connection portion is made and a wiring is just extended in an actual circuit. In addition, the expression "directly connected" includes the case where different conductors are connected to each other through a contact. Note that a wiring may be formed of conductors that contain one or more of the same elements or may be formed of conductors that contain different elements.

In addition, in this specification and the like, the terms "electrode" and "wiring" do not functionally limit these components. For example, an "electrode" is used as part of a "wiring" in some cases, and vice versa. Moreover, the terms "electrode" and "wiring" also include the case where a plurality of "electrodes" or "wirings" are formed in an integrated manner and the like.

In this specification and the like, the resistance value of a "resistor" is sometimes determined depending on the length of a wiring. Alternatively, the resistance value is sometimes determined by connection to a conductor with a resistivity different from that of a conductor used for a wiring. Alternatively, the resistance value is sometimes determined by impurity doping in a semiconductor.

In this specification and the like, a "terminal" in an electric circuit refers to a portion that inputs or outputs current or voltage or receives or transmits a signal. Accordingly, part of a wiring or an electrode functions as a terminal in some cases.

Functions of a source and a drain might be interchanged with each other when a transistor of opposite polarity is employed or when the direction of current is changed in circuit operation, for example. Therefore, the terms "source" and "drain" can sometimes be interchanged with each other in this specification and the like.

Note that in this specification and the like, depending on the transistor structure, a channel width in a region where a channel is actually formed (channel formation region) (hereinafter also referred to as an "effective channel width") is different from a channel width shown in a top view of a transistor (hereinafter also referred to as an "apparent channel width") in some cases. For example, when a gate covers a side surface of a semiconductor, an effective channel width is greater than an apparent channel width, and its influence cannot be ignored in some cases. For example, in a miniaturized transistor having a gate covering a side surface of a semiconductor, the proportion of a channel formation region formed in the side surface of the semiconductor is increased in some cases. In that case, the effective channel width is larger than the apparent channel width.

In such a case, the effective channel width is sometimes difficult to estimate by actual measurement. For example, estimation of an effective channel width from a design value requires assumption that the shape of a semiconductor is known. Accordingly, in the case where the shape of a semiconductor is not known accurately, it is difficult to measure the effective channel width accurately.

In this specification, the simple term "channel width" refers to an apparent channel width in some cases. Alternatively, in this specification, the simple term "channel width" refers to an effective channel width in some cases. Note that values of a channel length, a channel width, an effective channel width, an apparent channel width, and the like can be determined, for example, by analyzing a cross-sectional TEM image and the like.

Note that an impurity in a semiconductor refers to, for example, elements other than the main components of a semiconductor. For example, an element with a concentration lower than 0.1 atomic % can be regarded as an impurity. When an impurity is contained, for example, DOS (Density of States) in a semiconductor might be increased or crystallinity might be decreased. In the case where the semiconductor is an oxide semiconductor, examples of an impurity which changes the characteristics of the semiconductor include Group 1 elements, Group 2 elements, Group 13 elements, Group 14 elements, Group 15 elements, and transition metals other than the main components of the oxide semiconductor; hydrogen, lithium, sodium, silicon, boron, phosphorus, carbon, and nitrogen are given as examples. In the case of an oxide semiconductor, water also serves as an impurity in some cases. Also in the case of an oxide semiconductor, oxygen vacancies are formed in some cases by entry of impurities, for example. Furthermore, when the semiconductor is silicon, examples of an impurity which changes the characteristics of the semiconductor include oxygen, Group 1 elements except hydrogen, Group 2 elements, Group 13 elements, and Group 15 elements.

Note that in this specification and the like, silicon oxynitride is a material that contains more oxygen than nitrogen in its composition. Moreover, silicon nitride oxide is a material that contains more nitrogen than oxygen in its composition.

In this specification and the like, the term "insulator" can be replaced with an insulating film or an insulating layer. Furthermore, the term "conductor" can be replaced with a conductive film or a conductive layer. Moreover, the term "semiconductor" can be replaced with a semiconductor film or a semiconductor layer.

In this specification and the like, "parallel" indicates a state where two straight lines are placed at an angle greater than or equal to −10° and less than or equal to 10°. Accordingly, the case where the angle is greater than or equal to −5° and less than or equal to 5° is also included. Furthermore, "substantially parallel" indicates a state where two straight lines are placed at an angle greater than or equal to −30° and less than or equal to 30°. Moreover, "perpendicular" indicates a state where two straight lines are placed at an angle greater than or equal to 80° and less than or equal to 100°. Accordingly, the case where the angle is greater than or equal to 85° and less than or equal to 95° is also included. Moreover, "substantially perpendicular" indicates a state where two straight lines are placed at an angle greater than or equal to 60° and less than or equal to 120°.

Note that in this specification and the like, a barrier film means a film having a function of inhibiting passage of oxygen and impurities such as water and hydrogen, and the barrier film having conductivity is sometimes referred to as a conductive barrier film.

In this specification and the like, a metal oxide is an oxide of metal in a broad sense. Metal oxides are classified into an oxide insulator, an oxide conductor (including a transparent oxide conductor), an oxide semiconductor (also simply referred to as an OS), and the like. For example, in the case where a metal oxide is used in a semiconductor of a transistor, the metal oxide is referred to as an oxide semiconductor in some cases. That is, an OS FET or an OS transistor can also be referred to as a transistor including an oxide or an oxide semiconductor.

Furthermore, unless otherwise specified, an off-state current in this specification and the like refers to a drain current of a transistor in an off state (also referred to as a non-conduction state or a cutoff state). Unless otherwise specified, an off state refers to a state where the voltage $V_{gs}$ between its gate and source is lower than the threshold voltage $V_{th}$ in an n-channel transistor (higher than $V_{th}$ in a p-channel transistor).

Embodiment 1

An example of a semiconductor device including a transistor 200 and a capacitor 100 of one embodiment of the present invention and a manufacturing method thereof are described below.

In this specification and the like, when a plurality of components are denoted by the same reference numerals, and in particular need to be distinguished from each other, an identification numeral such as "_1" or "_2" is sometimes added to the reference numerals. For example, two transistors 200 are distinguished form each other by being referred to as a transistor 200_1 and a transistor 200_2. Furthermore, two capacitors 100 are distinguished form each other by being referred to as a capacitor 100_1 and a capacitor 100_2.

Structure Example 1 of Semiconductor Device

Figure 1B:
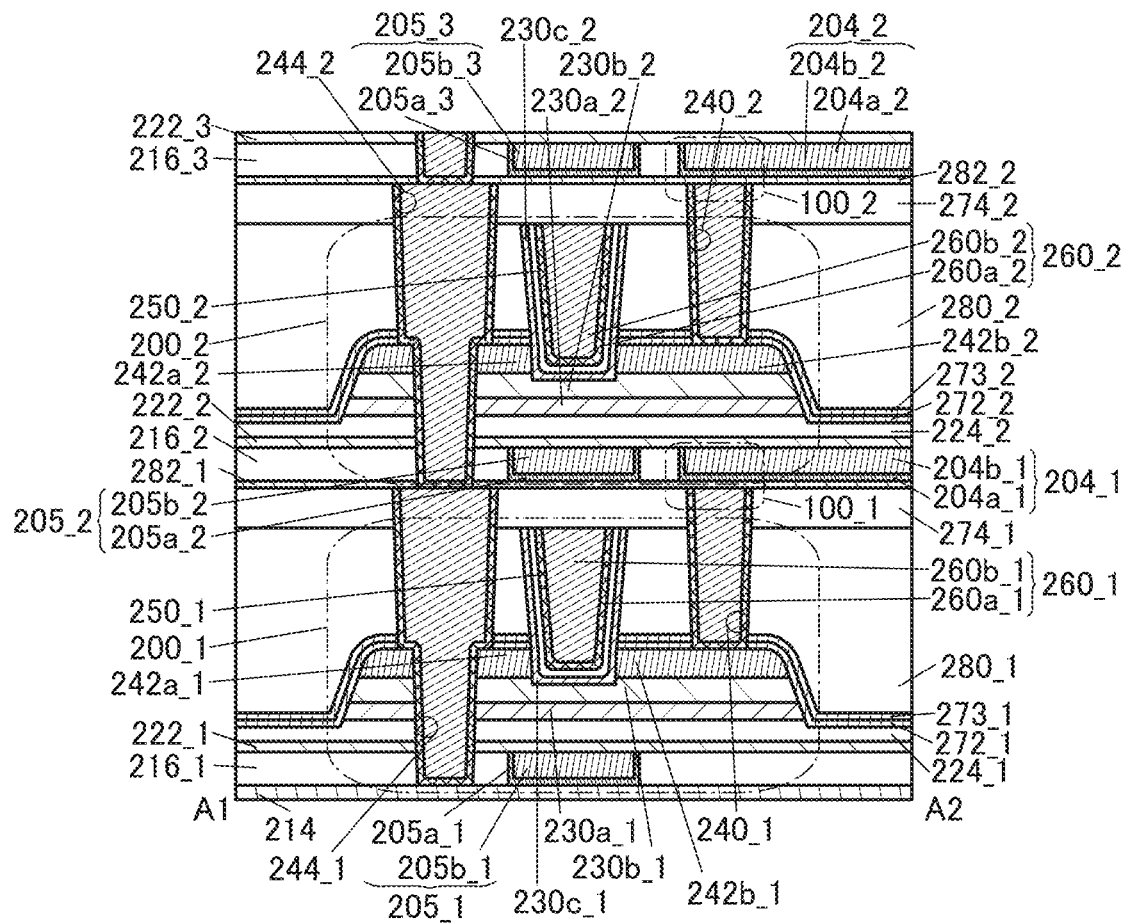
FIG. 1B is a cross-sectional view illustrating a structure example of the semiconductor device.
Figure 2A:
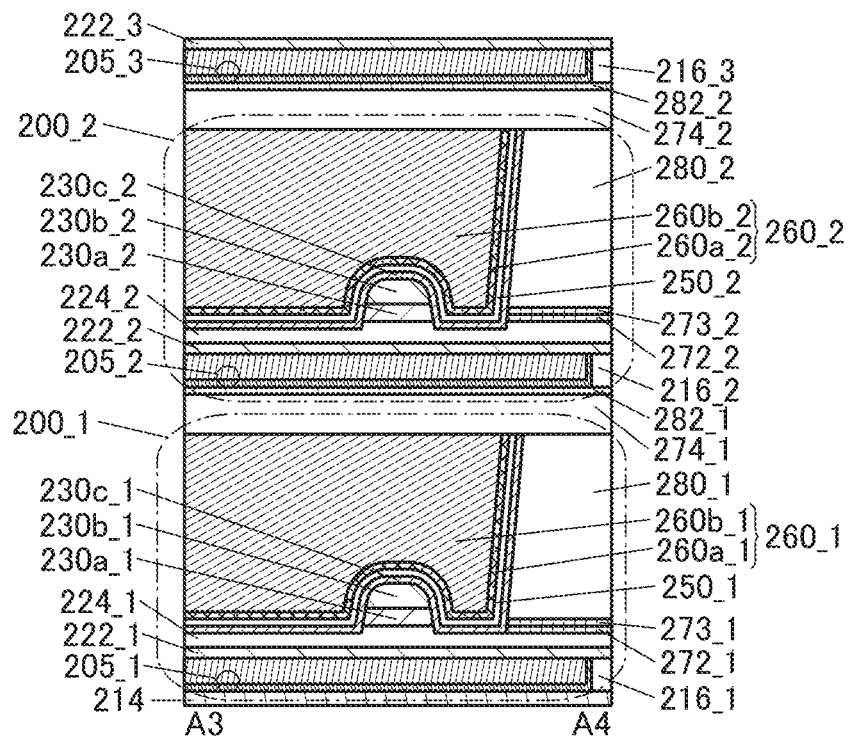
FIG. 2A and FIG. 2B are cross-sectional views illustrating the structure example of the semiconductor device.
Figure 2B:
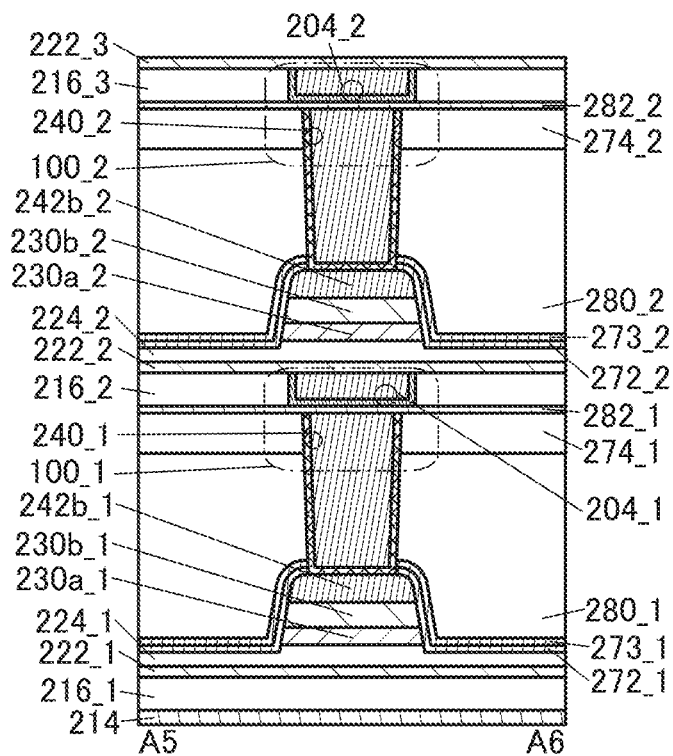

FIG. 1A is a top view illustrating a structure example of the semiconductor device including the transistor 200 and the capacitor 100. FIG. 1B, FIG. 2A, and FIG. 2B are cross-sectional views illustrating the structure example of the semiconductor device. Here, FIG. 1B is a cross-sectional view of a portion indicated by a dashed-dotted line A1-A2 in FIG. 1A, is a cross-sectional view of the transistor 200 in the channel length direction, and is a cross-sectional view of the capacitor 100 in the direction parallel to the channel length direction. FIG. 2A is a cross-sectional view of a portion indicated by a dashed-dotted line A3-A4 in FIG. 1A, and is a cross-sectional view of the transistor 200 in the channel width direction. FIG. 2B is a cross-sectional view of a portion indicated by a dashed-dotted line A5-A6 in FIG. 1A, and is a cross-sectional view of the capacitor 100 in the direction parallel to the channel width direction of the transistor 200. Note that for clarity of the drawing, some components are not illustrated in the top view of FIG. 1A. Furthermore, some components are not illustrated for clarity of the drawing also in other top views in some cases.

The semiconductor device of one embodiment of the present invention includes an insulator 214 over a substrate (not illustrated), a transistor 200_1 over the insulator 214, an insulator 280_1 over the transistor 200_1, and an insulator 274_1 over the insulator 280_1. A capacitor 100_1 and a transistor 200_2 are provided in the semiconductor device of one embodiment of the present invention to include regions overlapping with the transistor 200_1. The semiconductor device of one embodiment of the present invention further includes an insulator 280_2 over the transistor 200_2 and an insulator 274_2 over the insulator 280_2. A capacitor 100_2 is provided in the semiconductor device of one embodiment of the present invention to include a region overlapping with the transistor 200_2.

The transistor 200_1 includes an insulator 216_1 over the insulator 214; a conductor 205_1 (a conductor 205a_1 and a conductor 205b_1) positioned to be embedded in the insulator 216_1; an insulator 222_1 over the insulator 216_1 and the conductor 205_1; an insulator 224_1 over the insulator 222_1; an oxide 230a_1 over the insulator 224_1; an oxide 230b_1 over the oxide 230a_1; a conductor 242a_1 and a conductor 242b_1 over the oxide 230b_1; an insulator 272_1 including a region in contact with a top surface of the insulator 224_1, a side surface of the oxide 230a_1, a side surface of the oxide 230b_1, and top surfaces and side surfaces of the conductor 242a_1 and the conductor 242b_1; an insulator 273_1 over the insulator 272_1; an oxide 230c_1 over the oxide 230b_1; an insulator 250_1 over the oxide 230c_1; and a conductor 260_1 (a conductor 260a_1 and a conductor 260b_1) positioned over the insulator 250_1 and including a region overlapping with the oxide 230c_1. Here, the oxide 230c_1 includes a region in contact with side surfaces of the conductor 242a_1 and the conductor 242b_1, a side surface of the insulator 272_1, a side surface of the insulator 273_1, and a side surface of the insulator 280_1. The conductor 260a_1 is positioned to surround a bottom surface and a side surface of the conductor 260b_1. In addition, a top surface of the oxide 230c_1, a top surface of the insulator 250_1, and a top surface of the conductor 260_1 are positioned to be substantially aligned with a top surface of the insulator 280_1.

Hereinafter, the conductor 242a and the conductor 242b might be collectively referred to as a conductor 242.

The capacitor 100_1 includes a conductor 240_1, an insulator 282_1 over the conductor 240_1, a conductor 244_1, and the insulator 274_1, and a conductor 204_1 (a conductor 204a_1 and a conductor 204b_1) over the insulator 282_1.

An opening reaching the conductor 242b_1 is provided in the insulator 274_1, the insulator 280_1, the insulator 273_1, and the insulator 272_1; and the conductor 240_1 is provided in the opening. Furthermore, an opening reaching the insulator 214 is provided in the insulator 274_1, the insulator 280_1, the insulator 273_1, the insulator 272_1, the conductor 242a_1, the oxide 230b_1, the oxide 230a_1, the insulator 224_1, the insulator 222_1, and the insulator 216_1; and the conductor 244_1 is provided in the opening. Here, the level of a top surface of the conductor 240_1 and the level of a top surface of the conductor 244_1 can be the same as the level of a top surface of the insulator 274_1.

In this specification and the like, examples of an opening include a groove and a slit. A region where an opening is formed might be referred to as an opening portion.

The expression "being the same" in this specification and the like may refer to having the same area or having the same shape. Furthermore, the expression "being the same" may refer to having the same level in the vertical direction from the substrate surface. The same level can be restated as the same plane. In addition, the expression "being substantially the same" can be restated as "being the same" because it is assumed that the completely same shape, plane, or level is not achieved due to manufacturing process.

A first conductor of the conductor 240_1 is provided inside the opening in the insulator 274_1, the insulator 280_1, the insulator 273_1, and the insulator 272_1; and a second conductor of the conductor 240_1 is provided on the inner side. A first conductor of the conductor 244_1 is provided inside the opening in the insulator 274_1, the insulator 280_1, the insulator 273_1, the insulator 272_1, the conductor 242a_1, the oxide 230b_1, the oxide 230a_1, the insulator 224_1, the insulator 222_1, and the insulator 216_1; and a second conductor of the conductor 244_1 is provided on the inner side.

The transistor 200_2 includes an insulator 216_2 over the insulator 282_1; a conductor 205_2 (a conductor 205a_2 and a conductor 205b_2) positioned to be embedded in the insulator 216_2; an insulator 222_2 over the insulator 216_2, a conductor 204_2, and the conductor 205_2; an insulator 224_2 over the insulator 222_2; an oxide 230a_2 over the insulator 224_2; an oxide 230b_2 over the oxide 230a_2; a conductor 242a_2 and a conductor 242b_2 over the oxide 230b_2; an insulator 272_2 including a region in contact with a top surface of the insulator 224_2, a side surface of the oxide 230a_2, a side surface of the oxide 230b_2, and top surfaces and side surfaces of the conductor 242a_2 and the conductor 242b_2; an insulator 273_2 over the insulator 272_2; an oxide 230c_2 over the oxide 230b_2; an insulator 250_2 over the oxide 230c_2; and a conductor 260_2 (a conductor 260a_2 and a conductor 260b_2) positioned over the insulator 250_2 and including a region overlapping with the oxide 230c_2. Here, the oxide 230c_2 includes a region in contact with side surfaces of the conductor 242a_2 and the conductor 242b_2, a side surface of the insulator 272_2, a side surface of the insulator 273_2, and a side surface of the insulator 280_2. The conductor 260a_2 is positioned to surround a bottom surface and a side surface of the conductor 260b_2. In addition, a top surface of the oxide 230c_2, a top surface of the insulator 250_2, and a top surface of the conductor 260_2 are positioned to be substantially aligned with a top surface of the insulator 280_2.

The capacitor 100_2 includes a conductor 240_2, an insulator 282_2 over the conductor 240_2, a conductor 244_2, and the insulator 274_2, and the conductor 204_2 (a conductor 204a_2 and a conductor 204b_2) over the insulator 282_2.

An opening reaching the conductor 242b_2 is provided in the insulator 274_2, the insulator 280_2, the insulator 273_2, and the insulator 272_2; and the conductor 240_2 is provided in the opening. Furthermore, an opening reaching the insulator 244_1 is provided in the insulator 274_2, the insulator 280_2, the insulator 273_2, the insulator 272_2, the conductor 242a_2, the oxide 230b_2, the oxide 230a_2, the insulator 224_2, the insulator 222_2, the insulator 216_2, and the insulator 282_1; and the conductor 244_2 is provided in the opening. Thus, the conductor 242a_1 included in the transistor 200_1 and the conductor 242a_2 included in the transistor 200_2 are electrically connected to each other through the conductor 244_1 and the conductor 244_2. Note that the level of a top surface of the conductor 240_2 and the level of a top surface of the conductor 244_2 can be the same as the level of a top surface of the insulator 274_2.

A first conductor of the conductor 240_2 is provided inside the opening in the insulator 274_2, the insulator 280_2, the insulator 273_2, and the insulator 272_2; and a second conductor of the conductor 240_2 is provided on the inner side. A first conductor of the conductor 244_2 is provided inside the opening in the insulator 274_2, the insulator 280_2, the insulator 273_2, the insulator 272_2, the conductor 242a_2, the oxide 230b_2, the oxide 230a_2, the insulator 224_2, the insulator 222_2, the insulator 216_2, and the insulator 282_1; and a second conductor of the conductor 244_2 is provided on the inner side.

In FIG. 1B and FIG. 2B, the conductor 240 and the conductor 244 each have a structure in which the first conductor and the second conductor are stacked; however, one embodiment of the present invention is not limited thereto. For example, the conductor 240 or the conductor 244 may be a single layer or have a stacked-layer structure of three or more layers.

In the transistor 200, the conductor 260 has a function of a gate electrode of the transistor, and the conductor 242a and the conductor 242b have a function of a source electrode and a drain electrode. In the transistor 200, the conductor 260 having a function of the gate electrode is formed in a self-aligned manner to fill an opening formed by the insulator 280, the insulator 273, the insulator 272, and the conductor 242. When the conductor 260 is formed in such a manner, the conductor 260 can be surely positioned in a region between the conductor 242a and the conductor 242b without position alignment of the conductor 260.

It is preferable that at least one of the insulator 214, the insulator 222, the insulator 272, the insulator 273, and the insulator 282 have a function of inhibiting diffusion of hydrogen (e.g., at least one of a hydrogen atom, a hydrogen molecule, and the like) or a water molecule. In addition, it is preferable that at least one of the insulator 214, the insulator 222, the insulator 272, the insulator 273, and the insulator 282 have a function of inhibiting diffusion of oxygen (e.g., at least one of an oxygen atom, an oxygen molecule, and the like). For example, it is preferable that at least one of the insulator 214, the insulator 222, the insulator 272, the insulator 273, and the insulator 282 have lower permeability of one or both of oxygen and hydrogen than the insulator 224. It is preferable that at least one of the insulator 214, the insulator 222, the insulator 272, the insulator 273, and the insulator 282 have lower permeability of one or both of oxygen and hydrogen than the insulator 250. It is preferable that at least one of the insulator 214, the insulator 222, the insulator 272, the insulator 273, and the insulator 282 have lower permeability of one or both of oxygen and hydrogen than the insulator 280.

Aluminum oxide, hafnium oxide, gallium oxide, indium gallium zinc oxide, silicon nitride, or silicon nitride oxide can be used for the insulator 214, the insulator 222, the insulator 272, the insulator 273, and the insulator 282, for example.

The oxide 230 preferably includes the oxide 230a over the insulator 224, the oxide 230b over the oxide 230a, and the oxide 230c that is positioned over the oxide 230b and is at least partly in contact with a top surface of the oxide 230b. Here, it is preferable that a side surface of the oxide 230c be provided to include a region in contact with the conductor 242a, the conductor 242b, the insulator 272, the insulator 273, and the insulator 280.

Note that the transistor 200 has a structure in which three layers of the oxide 230a, the oxide 230b, and the oxide 230c are stacked in a channel formation region and its vicinity; however, the present invention is not limited thereto. For example, a single layer of the oxide 230b, a two-layer structure of the oxide 230b and the oxide 230a, a two-layer structure of the oxide 230b and the oxide 230c, or a stacked-layer structure of four or more layers may be provided. For example, a four-layer structure including the oxide 230c with a two-layer structure may be provided.

In the transistor 200, as the oxide 230 (the oxide 230a, the oxide 230b, and the oxide 230c) that includes the channel formation region, a metal oxide functioning as an oxide semiconductor (hereinafter also referred to as an oxide semiconductor) is preferably used. For example, a metal oxide having an energy gap of 2 eV or more, preferably 2.5 eV or more is preferably used as the metal oxide functioning as an oxide semiconductor. With the use of a metal oxide having such a wide energy gap, the leakage current in a non-conduction state (off-state current) of the transistor 200 can be extremely low. With the use of such a transistor, a semiconductor device with low power consumption can be provided.

For example, as the oxide 230, a metal oxide such as an In-M-Zn oxide (an element M is one kind or a plurality of kinds selected from aluminum, gallium, yttrium, tin, copper, vanadium, beryllium, boron, titanium, iron, nickel, germanium, zirconium, molybdenum, lanthanum, cerium, neodymium, hafnium, tantalum, tungsten, magnesium, and the like) is preferably used. In particular, aluminum, gallium, yttrium, or tin is preferably used as the element M. Alternatively, an In oxide, an In-M oxide, an In—Zn oxide, or an M-Zn oxide may be used as the oxide 230.

The oxide 230 includes the oxide 230a, the oxide 230b over the oxide 230a, and the oxide 230c over the oxide 230b. Including the oxide 230a below the oxide 230b makes it possible to inhibit diffusion of impurities into the oxide 230b from the components formed below the oxide 230a. Moreover, including the oxide 230c over the oxide 230b makes it possible to inhibit diffusion of impurities into the oxide 230b from the components formed above the oxide 230c.

Note that the oxide 230 preferably has a stacked-layer structure of a plurality of oxide layers that differ in the atomic ratio of metal atoms. Specifically, the atomic ratio of the element M in the constituent elements in the metal oxide used as the oxide 230a is preferably greater than the atomic ratio of the element M in the constituent elements in the metal oxide used as the oxide 230b. Moreover, the atomic ratio of the element M to In in the metal oxide used as the oxide 230a is preferably greater than the atomic ratio of the element M to In in the metal oxide used as the oxide 230b. Furthermore, the atomic ratio of In to the element M in the metal oxide used as the oxide 230b is preferably greater than the atomic ratio of In to the element M in the metal oxide used as the oxide 230a. A metal oxide that can be used as the oxide 230a or the oxide 230b can be used as the oxide 230c.

Specifically, as the oxide 230a, a metal oxide having In:Ga:Zn=1:3:4 [atomic ratio] or a composition in the vicinity thereof or 1:1:0.5 [atomic ratio] or a composition in the vicinity thereof is used. Moreover, as the oxide 230b, a metal oxide having In:Ga:Zn=4:2:3 [atomic ratio] or a composition in the vicinity thereof or 1:1:1 [atomic ratio] or a composition in the vicinity thereof is used. Furthermore, as the oxide 230c, a metal oxide having In:Ga:Zn=1:3:4 [atomic ratio] or a composition in the vicinity thereof, In:Ga:Zn=4:2:3 [atomic ratio] or a composition in the vicinity thereof, In:Ga:Zn=5:1:3 [atomic ratio] or a composition in the vicinity thereof, In:Ga:Zn=10:1:3 [atomic ratio] or a composition in the vicinity thereof, Ga:Zn=2:1 [atomic ratio] or a composition in the vicinity thereof, or Ga:Zn=2:5 [atomic ratio] or a composition in the vicinity thereof is used. Specific examples in the case where the oxide 230c has a stacked-layer structure include a stacked-layer structure of a layer having In:Ga:Zn=4:2:3 [atomic ratio] or a composition in the vicinity thereof and a layer having In:Ga:Zn=1:3:4 [atomic ratio] or a composition in the vicinity thereof, a stacked-layer structure of a layer having In:Ga:Zn=4:2:3 [atomic ratio] or a composition in the vicinity thereof and a layer having In:Ga:Zn=5:1:3 [atomic ratio] or a composition in the vicinity thereof, a stacked-layer structure of a layer having Ga:Zn=2:1 [atomic ratio] or a composition in the vicinity thereof and a layer having In:Ga:Zn=4:2:3 [atomic ratio] or a composition in the vicinity thereof, a stacked-layer structure of a layer having Ga:Zn=2:5 [atomic ratio] or a composition in the vicinity thereof and a layer having In:Ga:Zn=4:2:3 [atomic ratio] or a composition in the vicinity thereof, and a stacked-layer structure of gallium oxide and a layer having In:Ga:Zn=4:2:3 [atomic ratio] or a composition in the vicinity thereof. Note that a composition in the vicinity includes ±30% of an intended atomic ratio.

The oxide 230b preferably has crystallinity. For example, it is preferable to use a CAAC-OS (c-axis aligned crystalline oxide semiconductor) described later. An oxide having crystallinity, such as a CAAC-OS, has a dense structure with small amounts of impurities and defects (e.g., oxygen vacancies) and high crystallinity. This can inhibit oxygen extraction from the oxide 230b by the source electrode or the drain electrode. This can reduce oxygen extraction from the oxide 230b even when heat treatment is performed; thus, the transistor 200 is stable with respect to high temperatures in a manufacturing process (what is called thermal budget).

The energy of the conduction band minimum of each of the oxide 230a and the oxide 230c is preferably higher than the energy of the conduction band minimum of the oxide 230b. In other words, the electron affinity of each of the oxide 230a and the oxide 230c is preferably smaller than the electron affinity of the oxide 230b.

Here, electron affinity or conduction band minimum Ec can be obtained from an energy gap Eg and an ionization potential Ip, which is a difference between a vacuum level and an energy of valence band maximum Ev. The ionization potential Ip can be measured using, for example, an ultraviolet photoelectron spectroscopy (UPS) apparatus. The energy gap Eg can be measured using, for example, a spectroscopic ellipsometer.

Furthermore, the energy level of the conduction band minimum is gradually varied at junction portions of the oxide 230a, the oxide 230b, and the oxide 230c. In other words, the energy level of the conduction band minimum at the junction portions of the oxide 230a, the oxide 230b, and the oxide 230c continuously changes or is continuously connected. To obtain this, the density of defect states in mixed layers formed at an interface between the oxide 230a and the oxide 230b and an interface between the oxide 230b and the oxide 230c is preferably made low.

Moreover, the oxide 230b serves as a main carrier path. When the oxide 230a and the oxide 230c have the above structure, the density of defect states at the interface between the oxide 230a and the oxide 230b and the interface between the oxide 230b and the oxide 230c can be made low. This reduces the influence of interface scattering on carrier conduction, and the transistor 200 can have a high on-state current and high frequency characteristics.

An oxide semiconductor with a low carrier concentration is preferably used as the oxide 230 (e.g., the oxide 230b). In the case where the carrier concentration of the oxide semiconductor is lowered, the impurity concentration in the oxide semiconductor is lowered to decrease the density of defect states. In this specification and the like, a state with a low impurity concentration and a low density of defect states is referred to as a highly purified intrinsic or substantially highly purified intrinsic state. Examples of impurities contained in the oxide semiconductor include hydrogen, nitrogen, alkali metal, alkaline earth metal, iron, nickel, and silicon.

In particular, hydrogen contained in the oxide semiconductor reacts with oxygen bonded to a metal atom to be water, and thus sometimes forms an oxygen vacancy (also referred to as Vo) in the oxide semiconductor. In some cases, a defect where hydrogen enters an oxygen vacancy (hereinafter, sometimes referred to as VoH) functions as a donor and generates an electron serving as a carrier. In other cases, bonding of part of hydrogen to oxygen bonded to a metal atom generates electrons serving as carriers. Thus, a transistor using an oxide semiconductor that contains a large amount of hydrogen is likely to have normally-on characteristics. Hydrogen in the oxide semiconductor is easily transferred by a stress such as heat or an electric field; thus, a large amount of hydrogen in the oxide semiconductor might reduce the reliability of the transistor.

VoH can serve as a donor of the oxide semiconductor. However, it is difficult to evaluate the defects quantitatively. Thus, the oxide semiconductor is sometimes evaluated by not its donor concentration but its carrier concentration. Therefore, in this specification and the like, the carrier concentration assuming the state where an electric field is not applied is sometimes used, instead of the donor concentration, as the parameter of the oxide semiconductor. That is, "carrier concentration" in this specification and the like can be replaced with "donor concentration" in some cases.

Accordingly, in the case where an oxide semiconductor is used as the oxide 230, the amount of VoH in the oxide 230 is preferably reduced as much as possible so that the oxide 230 becomes a highly purified intrinsic or substantially highly purified intrinsic oxide. It is effective to remove impurities such as moisture and hydrogen in an oxide semiconductor (sometimes described as dehydration or dehydrogenation treatment) and to compensate for oxygen vacancies by supplying oxygen to the oxide semiconductor (sometimes described as oxygen adding treatment) in order to obtain an oxide semiconductor whose VoH is sufficiently reduced. When an oxide semiconductor with sufficiently reduced impurities such as VoH is used for a channel formation region of a transistor, the transistor can have stable electrical characteristics.

When an oxide semiconductor is used for the oxide 230, the carrier concentration of the oxide semiconductor in a region functioning as a channel formation region is preferably lower than or equal to $1 \times 10^{18}$ cm$^{-3}$, further preferably lower than $1 \times 10^{17}$ cm$^{-3}$, still further preferably lower than $1 \times 10^{16}$ cm$^{-3}$, yet still further preferably lower than $1 \times 10^{13}$ cm$^{-3}$, yet still further preferably lower than $1 \times 10^{12}$ cm$^{-3}$. Note that the lower limit of the carrier concentration of the oxide semiconductor in the region functioning as the channel formation region is not particularly limited and can be, for example, $1 \times 10^{-9}$ cm$^{-3}$.

An interlayer insulating film and a gate insulating film may be deposited using a source gas with no hydrogen atoms or less hydrogen atoms to reduce the concentration of hydrogen contained in these insulating films and to reduce hydrogen entering a channel formation region of an oxide semiconductor.

A gas containing a molecule including a silicon atom is mainly used as a deposition gas for depositing the above insulating films. In order to reduce hydrogen contained in the above insulating films, the molecule including a silicon atom preferably contains as few hydrogen atoms as possible; further preferably, the molecule including a silicon atom contains no hydrogen atom. A deposition gas other than a gas containing a molecule including a silicon atom preferably includes as few hydrogen atoms as possible, further preferably includes no hydrogen atom.

In the case where the molecule containing a silicon atom is expressed as Si$_x$—R$_y$, for example, a functional group R can be at least one of an isocyanate group (—N=C=O), a cyanate group (—O—C=N), a cyano group (—C≡N), a diazo group (=N$_2$), an azide group (—N$_3$), a nitroso group (—NO), and a nitro group (—NO$_2$). For example, $1 \leq x \leq 3$ and $1 \leq y \leq 8$ are employed. Examples of such a molecule containing a silicon atom include tetraisocyanatosilane, tetracyanatosilane, tetracyanosilane, hexaisocyanatosilane, and octaisocyanatosilane. The examples here each show the molecule in which functional groups of the same kind are bonded to the silicon atom; however, this embodiment is not limited to these examples. Different kinds of functional groups may be bonded to the silicon atom.

A halogen (Cl, Br, I, or F) can be used for the functional group R, for example. For example, $1 \leq x \leq 2$ and $1 \leq y \leq 6$ are employed. Examples of such a molecule containing a silicon atom include tetrachlorosilane ($SiCl_4$) and hexachlorodisilane ($Si_2Cl_6$). Although an example of using chlorine as the functional group is described here, halogen other than chlorine, such as bromine, iodine, or fluorine, may be used as the functional group. In addition, different kinds of halogen may be bonded to the silicon atom.

The insulator 216, the insulator 224, the insulator 280, the insulator 250, and the insulator 274 are deposited by a chemical vapor deposition (CVD) method using the gas, as described above, containing a molecule including a silicon atom. A CVD method is particularly suitable for depositing the insulator 216, the insulator 224, the insulator 280, and the insulator 274, which have large thicknesses, because the deposition rate of a CVD method is relatively fast.

As the CVD method, a plasma CVD (PECVD: Plasma Enhanced CVD) method using plasma or a thermal CVD (TCVD) method using heat is preferably used. In the case of using a thermal CVD method, an atmospheric pressure CVD (APCVD) method, in which deposition is performed under the atmospheric pressure, or a low pressure CVD (LPCVD) method, in which deposition is performed under pressure lower than the atmospheric pressure, may be used.

In the case where the insulator 216, the insulator 224, the insulator 280, the insulator 250, and the insulator 274 are deposited by a CVD method, an oxidizer is preferably used. As an oxidizer, it is preferable to use a gas that does not contain a hydrogen atom, such as $O_2$, $O_3$, NO, $NO_2$, $N_2O$, $N_2O_3$, $N_2O_4$, $N_2O_5$, CO, or $CO_2$.

The insulator 216, the insulator 224, the insulator 280, the insulator 250, and the insulator 274 may be deposited by an ALD (Atomic Layer Deposition) method. In the ALD method, a first source gas (hereinafter, referred to as a precursor and also referred to as a metal precursor) and a second source gas (hereinafter, referred to as a reactant and also referred to as a nonmetallic precursor) are alternately introduced into a chamber for reaction, and then the introduction of these source gases is repeated, whereby deposition is performed.

In an ALD method, deposition is performed while the source gases are switched, so that atomic layers can be deposited one by one using self-controllability of atoms. Thus, an ALD method enables deposition of an extremely thin film, deposition on a component with a high aspect ratio, deposition of a film with few defects such as pinholes, deposition with excellent coverage, and the like. Thus, an ALD method is particularly suitable for deposition of the insulator 250.

As the ALD method, either a thermal ALD method, in which a precursor reacts with a reactant only by thermal energy, or a PEALD (Plasma Enhanced ALD) method, which uses a reactant excited by plasma, may be used.

In the case of using an ALD method, the gas containing a molecule including a silicon atom is used as a precursor, and the oxidizer is used as a reactant. Thus, the amount of hydrogen that enters the insulator 216, the insulator 224, the insulator 280, the insulator 250, and the insulator 274 can be significantly reduced.

Note that an example in which the molecule containing a silicon atom does not contain a hydrogen atom is described above; however, this embodiment is not limited thereto. In the molecule containing a silicon atom, some of the functional groups bonded to a silicon atom may be replaced with hydrogen atoms. Note that the number of hydrogen atoms included in the molecule containing a silicon atom is preferably smaller than that of hydrogen atoms in silane ($SiH_4$). That is, the molecule containing a silicon atom preferably contains three or less hydrogen atoms per silicon atom. It is further preferable that the gas containing the molecule including a silicon atom contain three or less hydrogen atoms per silicon atom.

As described above, at least one of the insulator 216, the insulator 224, the insulator 280, the insulator 250, and the insulator 274 is deposited by a method using a gas in which hydrogen atoms are reduced or removed, whereby the amount of hydrogen contained in these insulating films can be reduced.

In the capacitor 100, the conductor 240 has a function of one electrode of the capacitor 100 and the conductor 204 has a function of the other electrode of the capacitor 100. The insulator 282 functions as a dielectric of the capacitor 100. For the conductor 204, the same material as the conductor 205 can be used.

Here, the conductor 244 has a function of a plug electrically connected to one of the source and the drain of the transistor 200, and the conductor 240 has a function of a plug electrically connected to the other of the source and the drain of the transistor 200. Thus, the conductor 240 can function as both a plug and the one electrode of the capacitor 100.

The transistor 200_1 and the transistor 200_2 are provided to be stacked as illustrated in FIG. 1B and FIG. 2A. In addition, the capacitor 100_1 and the capacitor 100_2 are provided to be stacked as illustrated in FIG. 1B and FIG. 2B. In other words, in the semiconductor device of one embodiment of the present invention, two transistors 200 are provided to be stacked, and two capacitors 100 are provided to be stacked. With such a structure, a plurality of transistors 200 and a plurality of capacitors 100 can be provided in the semiconductor device while the area occupied by the semiconductor device of one embodiment of the present invention is inhibited to increase. Thus, the semiconductor device of one embodiment of the present invention can be miniaturized or highly integrated. Note that three or more transistors 200 and three or more capacitors 100 may be provided to be stacked. In that case, as illustrated in FIG. 1B, FIG. 2A, and FIG. 2B, an insulator 216_3 is provided over the insulator 282_2, a conductor 205_3 (a conductor 205a_3 and a conductor 205b_3) is provided to be embedded in the insulator 216_3, and an insulator 222_3 is provided over the conductor 204, the conductor 205, and the insulator 216_3.

The conductor 204 included in the capacitor 100 is formed in the same layer as the conductor 205 included in the transistor 200. For example, the conductor 204_1 is formed in the same layer as the conductor 205_2. Thus, the conductor 204 and the conductor 205 can be formed in the same process, so that the manufacturing process of the semiconductor device of one embodiment of the present invention can be simplified. Therefore, the manufacturing cost of the semiconductor device of one embodiment of the present invention can be reduced, and the yield can be increased. That is, the productivity of the semiconductor device of one embodiment of the present invention can be increased.

As described above, in the semiconductor device of one embodiment of the present invention, the conductor 240 functions as both a plug and the one electrode of the capacitor 100. When part of components is shared by the transistor 200 and the capacitor 100 as described above, the manufacturing process of the semiconductor device of one embodiment of the present invention can be simplified. Therefore, the manufacturing cost of the semiconductor device of one embodiment of the present invention can be reduced, and the yield can be increased. That is, the productivity of the semiconductor device of one embodiment of the present invention can be increased.

The structure of the semiconductor device including the transistor 200 and the capacitor 100 of one embodiment of the present invention is described in detail below.

The conductor 205 is positioned to include a region overlapping with the oxide 230 and the conductor 260. The conductor 205 is preferably provided to be embedded in the insulator 216.

Here, the conductor 260 functions as a first gate electrode (also referred to as a top gate electrode) in some cases. The conductor 205 functions as a second gate electrode (also referred to as a back gate electrode) in some cases. In that case, Vth of the transistor 200 can be controlled by changing a potential applied to the conductor 205 independently of a potential applied to the conductor 260. In particular, by applying a negative potential to the conductor 205, Vth of the transistor 200 can be higher than 0 V, and the off-state current can be reduced. Thus, a drain current at the time when a potential applied to the conductor 260 is 0 V can be smaller in the case where a negative potential is applied to the conductor 205 than in the case where the negative potential is not applied to the conductor 205.

As illustrated in FIG. 1A, the conductor 205 is preferably provided to be larger than a region of the oxide 230 that does not overlap with the conductor 242a and the conductor 242b. In particular, as illustrated in FIG. 2A, the conductor 205 preferably extends to a region outside an end portion of the oxide 230 that intersects with the channel width direction. That is, the conductor 205 and the conductor 260 preferably overlap with each other with the insulator therebetween on the outside of a side surface of the oxide 230 in the channel width direction. A large conductor 205 can sometimes reduce local charging (referred to as charge up) in treatment using plasma after the formation of the conductor 205 in the manufacturing process. However, one embodiment of the present invention is not limited thereto. The conductor 205 includes a region overlapping with at least the oxide 230 positioned between the conductor 242a and the conductor 242b.

As illustrated in FIG. 2A, when a bottom surface of the insulator 224 is used as a reference, the level of a bottom surface of the conductor 260 in a region where the oxide 230a and the oxide 230b do not overlap with the conductor 260 preferably includes a region being placed lower than the level of a bottom surface of the oxide 230b. The difference between the level of the bottom surface of the conductor 260 in the region and the level of the bottom surface of the oxide 230b is greater than or equal to 0 nm and less than or equal to 100 nm, preferably greater than or equal to 3 nm and less than or equal to 50 nm, further preferably greater than or equal to 5 nm and less than or equal to 20 nm.

As described above, the conductor 260, which functions as the gate electrode, covers the side surface and the top surface of the oxide 230b of the channel formation region, with the oxide 230c and the insulator 250 therebetween; this structure enables the electric field of the conductor 260 to easily affect the entire oxide 230b of the channel formation region. Thus, the on-state current of the transistor 200 can be increased and the frequency characteristics of the transistor 200 can be improved. In this specification and the like, a transistor structure in which a channel formation region is electrically surrounded by electric fields of a first gate and a second gate is referred to as a surrounded channel (S-channel) structure.

The conductor 205a and the conductor 204a are preferably conductors that inhibit passage of oxygen and impurities such as water or hydrogen. For example, titanium, titanium nitride, tantalum, or tantalum nitride can be used. Moreover, a conductive material containing tungsten, copper, or aluminum as its main component is preferably used for the conductor 205b and the conductor 205b. Although the conductor 205 is illustrated as having two layers, the conductor 205 can have a multilayer structure with three or more layers.

Here, the oxide semiconductor, the insulator or conductor positioned below the oxide semiconductor, and the insulator or conductor positioned over the oxide semiconductor are preferably successively deposited without exposure to the air, in which case a substantially highly purified intrinsic oxide semiconductor film with a reduced concentration of impurities (in particular, hydrogen and water) can be deposited.

At least one of the insulator 214, the insulator 222, the insulator 272, the insulator 273, and the insulator 282 preferably functions as a barrier insulating film that inhibits impurities such as water or hydrogen from entering the transistor 200 from the substrate side or from above. Thus, for at least one of the insulator 214, the insulator 222, the insulator 272, the insulator 273, and the insulator 282, an insulating material having a function of inhibiting diffusion of impurities such as hydrogen atoms, hydrogen molecules, water molecules, nitrogen atoms, nitrogen molecules, nitrogen oxide molecules (e.g., $N_2O$, NO, or $NO_2$), or copper atoms (through which the impurities are less likely to pass) is preferably used. Alternatively, it is preferable to use an insulating material having a function of inhibiting diffusion of oxygen (e.g., at least one of an oxygen atom, an oxygen molecule, and the like) (through which the oxygen is less likely to pass).

For example, for the insulator 214, the insulator 222, the insulator 272, the insulator 273, and the insulator 282, aluminum oxide, hafnium oxide, or the like is preferably used. Accordingly, it is possible to inhibit diffusion of impurities such as water or hydrogen to the transistor 200 side from the substrate side through the insulator 214. Alternatively, it is possible to inhibit diffusion of oxygen contained in the insulator 224 and the like to the substrate side through the insulator 214. Moreover, it is possible to inhibit diffusion of impurities such as water or hydrogen to the transistor 200 side from the insulator 280, the insulator 274, and the like, which are positioned above the insulator 272 and the insulator 273.

The insulator 216, the insulator 280, and the insulator 274 preferably have a lower permittivity than the insulator 214. When a material with a low permittivity is used for the interlayer film, the parasitic capacitance generated between wirings can be reduced. For example, for the insulator 216, the insulator 280, and the insulator 274, silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide, is used as appropriate.

For example, an insulator containing what is called a high-k material such as aluminum oxide, hafnium oxide, tantalum oxide, zirconium oxide, lead zirconate titanate (PZT), strontium titanate ($SrTiO_3$), or $(Ba,Sr)TiO_3$ (BST) is preferably used as the insulator 282. Accordingly, the storage capacity of the capacitor 100 can be secured while the physical thickness of the insulator 282 is maintained. Thus, leakage current can be inhibited from flowing between the conductor 240 and the conductor 204, which are included in the capacitor 100, through the insulator 282.

The insulator 222 and the insulator 224 have a function of a gate insulator.

Here, it is preferable that the insulator 224 including a region in contact with the oxide 230 have a function of releasing oxygen by heating. In this specification and the like, oxygen that is released by heating is referred to as excess oxygen in some cases. For example, silicon oxide or silicon oxynitride can be used as appropriate for the insulator 224. When an insulator containing oxygen is provided in contact with the oxide 230, oxygen vacancies in the oxide 230 can be reduced and the reliability of the transistor 200 can be improved.

Specifically, an oxide material that releases part of oxygen by heating is preferably used for the insulator 224. An oxide that releases oxygen by heating is an oxide film in which the number of released oxygen molecules is greater than or equal to $1.0\times10^{18}$ molecules/cm$^3$, preferably greater than or equal to $1.0\times10^{19}$ molecules/cm$^3$, further preferably greater than or equal to $2.0\times10^{19}$ molecules/cm$^3$, or greater than or equal to $3.0\times10^{20}$ molecules/cm$^3$ in thermal desorption spectroscopy analysis (TDS analysis). Note that the temperature of the film surface in the TDS analysis is preferably in a range of higher than or equal to 100° C. and lower than or equal to 700° C., or higher than or equal to 100° C. and lower than or equal to 400° C.

The insulator 222 preferably functions as a barrier insulating film for inhibiting impurities such as water or hydrogen from entering the transistor 200 from the substrate side. For example, the insulator 222 preferably has a lower hydrogen permeability than the insulator 224. Accordingly, entry of impurities such as water or hydrogen from the outside into the transistor 200 can be inhibited.

Furthermore, it is preferable that the insulator 222 have a function of inhibiting diffusion of oxygen (e.g., at least one of an oxygen atom, an oxygen molecule, and the like) (through which the above oxygen is less likely to pass). For example, the insulator 222 preferably has a lower oxygen permeability than the insulator 224. The insulator 222 preferably has a function of inhibiting diffusion of oxygen or impurities, in which case diffusion of oxygen contained in the oxide 230 into a layer under the insulator 222 can be reduced. Furthermore, the conductor 205 can be inhibited from reacting with oxygen contained in the insulator 224 or the oxide 230.

As the insulator 222, an insulator containing an oxide of one or both of aluminum and hafnium, which is an insulating material, is preferably used. As the insulator containing an oxide of one or both of aluminum and hafnium, aluminum oxide, hafnium oxide, an oxide containing aluminum and hafnium (hafnium aluminate), or the like is preferably used. When the insulator 222 is formed using such a material, the insulator 222 functions as a layer that inhibits release of oxygen from the oxide 230 and entry of impurities such as hydrogen from the periphery of the transistor 200 into the oxide 230.

Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. Silicon oxide, silicon oxynitride, or silicon nitride may be stacked over the above insulator.

Alternatively, for example, a single layer or stacked layers of an insulator containing the high-k material, such as aluminum oxide, hafnium oxide, tantalum oxide, zirconium oxide, lead zirconate titanate (PZT), strontium titanate ($SrTiO_3$), or $(Ba,Sr)TiO_3$ (BST), may be used as the insulator 222. For example, in the case where the insulator 222 is a stack, a three-layer structure in which zirconium oxide, aluminum oxide, and zirconium oxide are formed in this order, or a four-layer structure in which zirconium oxide, aluminum oxide, zirconium oxide, and aluminum oxide are formed in this order is used. For the insulator 222, a compound or the like containing hafnium and zirconium may be used. When the semiconductor device is miniaturized and highly integrated, a dielectric used for a gate insulator and a capacitor become thin, which might cause a problem such as leakage current from a transistor and the capacitor. When a high-k material is used for an insulator functioning as the dielectric used for a gate insulator and a capacitor, a gate potential at the time of operating the transistor can be reduced and the capacity of the capacitor can be secured while the physical thickness is maintained.

Note that the insulator 222 and the insulator 224 may each have a stacked-layer structure of two or more layers. In such cases, without limitation to a stacked-layer structure formed of the same material, a stacked-layer structure formed of different materials may be employed.

When oxygen in the oxide 230 is diffused into the conductor 242 (the conductor 242a and the conductor 242b), another layer is sometimes formed between the conductor 242a and the oxide 230b, and between the conductor 242b and the oxide 230b. The layer contains more oxygen than the conductor 242 does, and thus the layer is assumed to have an insulating property. In this case, a three-layer structure of the conductor 242, the layer, and the oxide 230b can be regarded as a three-layer structure of a metal, an insulator, and a semiconductor and is sometimes referred to as an MIS (Metal-Insulator-Semiconductor) structure or a diode-junction structure having an MIS structure as its main part.

The above layer is not necessarily formed between the conductor 242 and the oxide 230b; for example, the layer may be formed between the conductor 242 and the oxide 230c or formed between the conductor 242 and the oxide 230b and between the conductor 242 and the oxide 230c.

The conductor 242 (the conductor 242a and the conductor 242b) having functions of the source electrode and the drain electrode is provided over the oxide 230b. The thickness of the conductor 242 is greater than or equal to 1 nm and less than or equal to 50 nm, preferably greater than or equal to 2 nm and less than or equal to 25 nm, for example.

For the conductor 242, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal elements; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that hold their conductivity even after absorbing oxygen.

The insulator 272 is provided to include a region in contact with the top surface of the conductor 242 and preferably has a function of a barrier layer. Such a structure can inhibit the conductor 242 from absorbing excess oxygen contained in the insulator 280. Furthermore, by inhibiting oxidation of the conductor 242, an increase in the contact resistance between the transistor 200 and a wiring can be inhibited. Consequently, the transistor 200 can have favorable electrical characteristics and reliability.

Thus, the insulator 272 preferably has a function of inhibiting diffusion of oxygen. For example, the insulator 272 preferably has a function of further inhibiting diffusion of oxygen as compared to the insulator 280. An insulator containing an oxide of one or both of aluminum and hafnium is preferably deposited as the insulator 272, for example. An insulator containing aluminum nitride may be used as the insulator 272, for example.

As illustrated in FIG. 1B, the insulator 272 includes a region in contact with the top surface of the conductor 242a and the side surface of the conductor 242a. Moreover, the insulator 272 includes a region in contact with the top surface of the conductor 242b and the side surface of the conductor 242b. Furthermore, the insulator 273 is positioned over the insulator 272. Such a structure can inhibit the conductor 242 from absorbing oxygen added to the insulator 280, for example.

The insulator 250 has a function of a gate insulator. The insulator 250 is preferably positioned to include a region in contact with the oxide 230c. For the insulator 250, silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide can be used. In particular, silicon oxide and silicon oxynitride are preferable because they are thermally stable.

Like the insulator 224, the insulator 250 is preferably formed using an insulator from which oxygen is released by heating. When the insulator from which oxygen is released by heating is provided as the insulator 250 to be in contact with the top surface of the oxide 230c, oxygen can be effectively supplied to the channel formation region of the oxide 230b. Furthermore, as in the insulator 224, the concentration of impurities such as water or hydrogen in the insulator 250 is preferably reduced. The thickness of the insulator 250 is preferably greater than or equal to 1 nm and less than or equal to 20 nm.

A metal oxide may be provided between the insulator 250 and the conductor 260. The metal oxide preferably has a function of inhibiting oxygen diffusion from the insulator 250 into the conductor 260. Providing the metal oxide that has a function of inhibiting diffusion of oxygen inhibits diffusion of oxygen from the insulator 250 into the conductor 260. That is, the reduction in the amount of oxygen supplied from the insulator 250 to the oxide 230 can be inhibited. Moreover, oxidation of the conductor 260 due to oxygen in the insulator 250 can be inhibited.

The metal oxide has a function of part of the gate insulator in some cases. Therefore, when silicon oxide, silicon oxynitride, or the like is used for the insulator 250, a metal oxide that is a high-k material with a high dielectric constant is preferably used as the metal oxide. The gate insulator having a stacked-layer structure of the insulator 250 and the metal oxide can be thermally stable and have a high dielectric constant. Thus, a gate potential that is applied during operation of the transistor can be reduced while the physical thickness of the gate insulator is maintained. In addition, the equivalent oxide thickness (EOT) of the insulator functioning as the gate insulator can be reduced.

Specifically, a metal oxide containing one kind or two or more kinds selected from hafnium, aluminum, gallium, yttrium, zirconium, tungsten, titanium, tantalum, nickel, germanium, magnesium, and the like can be used. It is particularly preferable to use an insulator containing an oxide of one or both of aluminum and hafnium, such as aluminum oxide, hafnium oxide, or an oxide containing aluminum and hafnium (hafnium aluminate).

Alternatively, the metal oxide has a function of part of the gate in some cases. In this case, a conductive material containing oxygen is preferably provided on the channel formation region side. When the conductive material containing oxygen is provided on the channel formation region side, oxygen released from the conductive material is easily supplied to the channel formation region.

It is particularly preferable to use, for the conductor functioning as the gate electrode, a conductive material containing oxygen and a metal element contained in a metal oxide where the channel is formed. A conductive material containing any of the above metal elements and nitrogen may be used. Indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon is added may be used. Indium gallium zinc oxide containing nitrogen may also be used. With the use of such a material, hydrogen contained in the metal oxide where the channel is formed can be captured in some cases. Alternatively, hydrogen entering from a surrounding insulator or the like can be captured in some cases.

Although the conductor 260 has a two-layer structure in FIG. 1B and FIG. 2A, a single-layer structure or a stacked-layer structure of three or more layers may be employed.

For the conductor 260a, it is preferable to use a conductive material having a function of inhibiting diffusion of impurities such as hydrogen atoms, hydrogen molecules, water molecules, nitrogen atoms, nitrogen molecules, nitrogen oxide molecules ($N_2O$, $NO$, $NO_2$, and the like), and copper atoms. Alternatively, it is preferable to use a conductive material having a function of inhibiting diffusion of oxygen (e.g., at least one of an oxygen atom, an oxygen molecule, and the like).

In addition, when the conductor 260a has a function of inhibiting diffusion of oxygen, the conductivity of the conductor 260b can be inhibited from being lowered because of oxidation due to oxygen contained in the insulator 250. As a conductive material having a function of inhibiting diffusion of oxygen, for example, tantalum, tantalum nitride, ruthenium, or ruthenium oxide is preferably used.

Moreover, a conductive material containing tungsten, copper, or aluminum as its main component is preferably used for the conductor 260b. The conductor 260b also functions as a wiring and thus is preferably formed using a conductor having high conductivity. For example, a conductive material containing tungsten, copper, or aluminum as its main component can be used. The conductor 260b may have a stacked-layer structure, for example, a stacked-layer structure of any of the above conductive materials and titanium or titanium nitride.

The insulator 280 preferably contains, for example, silicon oxide, silicon oxynitride, silicon nitride oxide, silicon oxide to which fluorine is added, silicon oxide to which carbon is added, silicon oxide to which carbon and nitrogen are added, porous silicon oxide, or the like. In particular, silicon oxide and silicon oxynitride, which have thermal stability, are preferable. Materials such as silicon oxide, silicon oxynitride, and porous silicon oxide, in each of which a region containing oxygen released by heating can be easily formed, are particularly preferable. The insulator 280 may have a stacked-layer structure of the above materials, for example, a structure in which silicon oxynitride deposited by a CVD method is stacked over silicon oxide deposited by a sputtering method. Furthermore, silicon nitride may be stacked thereover.

The concentration of impurities such as water or hydrogen in the insulator 280 is preferably reduced. In addition, the top surface of the insulator 280 may be planarized.

The insulator 274 functioning as an interlayer film is preferably provided over the insulator 280. As in the insulator 224 or the like, the concentration of impurities such as water or hydrogen in the insulator 274 is preferably reduced.

A conductive material containing tungsten, copper, or aluminum as its main component is preferably used for the conductor 240 and the conductor 244. Note that although the conductor 240 and the conductor 244 have a polygonal shape such as a quadrangular shape with rounded corners in the top view of FIG. 1A, the shape is not limited thereto. For example, the conductor 240 and the conductor 244 may have a circular shape, an almost circular shape such as an elliptical shape, or a polygonal shape such as a quadrangular shape.

Manufacturing Method Example 1 of
Semiconductor Device

Next, an example of a method for manufacturing the semiconductor device including the transistor 200 and the capacitor 100 illustrated in FIG. 1A, FIG. 1B, FIG. 2A, and FIG. 2B is described with reference to the drawings. The drawings are cross-sectional views corresponding to the portion indicated by the dashed-dotted line A1-A2 illustrated in FIG. 1A and correspond to the channel length direction of the transistor 200.

Figure 3A:
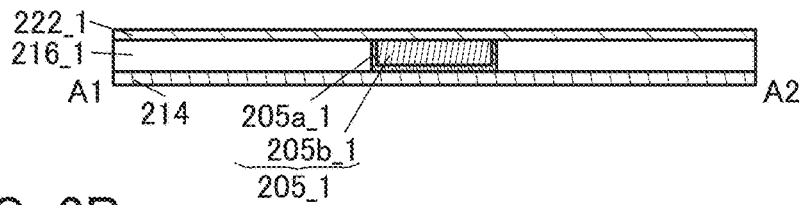
FIG. 3A to FIG. 3E are cross-sectional views illustrating an example of a method for manufacturing a semiconductor device.

First, a substrate (not illustrated) is prepared, and the insulator 214 is deposited over the substrate (see FIG. 3A). The insulator 214 can be deposited by a sputtering method, a chemical vapor deposition (CVD) method, a molecular beam epitaxy (MBE) method, a pulsed laser deposition (PLD) method, an atomic layer deposition (ALD) method, or the like.

Note that CVD methods can be classified into a plasma CVD (PECVD: Plasma Enhanced CVD) method using plasma, a thermal CVD (TCVD) method using heat, a photo CVD method using light, and the like. Moreover, the CVD methods can be classified into a metal CVD (MCVD) method and a metal organic CVD (MOCVD) method depending on a source gas to be used. In addition, according to the pressure in deposition, the CVD methods can be classified into an atmospheric pressure CVD (APCVD) method, in which deposition is performed under the atmospheric pressure, a low pressure CVD (LPCVD) method, in which deposition is performed under pressure lower than the atmospheric pressure.

A plasma CVD method enables a high-quality film to be obtained at a relatively low temperature. Furthermore, a thermal CVD method is a deposition method that does not use plasma and thus enables less plasma damage to an object to be processed. For example, a wiring, an electrode, an element (a transistor, a capacitor, or the like), or the like included in a semiconductor device might be charged up by receiving electric charge from plasma. In that case, accumulated electric charge might break the wiring, the electrode, the element, or the like included in the semiconductor device. In contrast, such plasma damage does not occur in the case of a thermal CVD method, which does not use plasma, and thus the yield of the semiconductor device can be increased. In addition, a thermal CVD method does not cause plasma damage during deposition, so that a film with few defects can be obtained.

As the ALD method, a thermal ALD method, in which a precursor and a reactant react with each other only by a thermal energy, a PEALD (Plasma Enhanced ALD) method, in which a reactant excited by plasma is used, and the like can be used.

In an ALD method, one atomic layer can be deposited at a time using self-regulating characteristics of atoms. Thus, an ALD method has advantages such as deposition of an extremely thin film, deposition on a component with a high aspect ratio, deposition of a film with a small number of defects such as pinholes, deposition with good coverage, and low-temperature deposition. The use of plasma in a PEALD method is sometimes preferable because deposition at a lower temperature is possible. Note that a precursor used in an ALD method sometimes contains impurities such as carbon. Thus, a film formed by an ALD method may contain impurities such as carbon in a larger amount than a film formed by another deposition method. Note that impurities can be quantified by X-ray photoelectron spectroscopy (XPS).

Unlike a deposition method in which particles ejected from a target or the like are deposited, a CVD method and an ALD method are deposition methods in which a film is formed by reaction at a surface of an object to be processed. Thus, a CVD method and an ALD method are deposition methods that enable favorable step coverage almost regardless of the shape of an object to be processed. In particular, an ALD method has excellent step coverage and excellent thickness uniformity and thus is suitable for covering a surface of an opening with a high aspect ratio, for example. On the other hand, an ALD method has a relatively low deposition rate, and thus is preferably used in combination with another deposition method with a high deposition rate, such as a CVD method, in some cases.

Each of a CVD method and an ALD method enables the composition of a film that is to be deposited to be controlled with a flow rate ratio of source gases. For example, by each of a CVD method and an ALD method, a film with a certain composition can be deposited depending on the flow rate ratio of the source gases. Moreover, with each of a CVD method and an ALD method, by changing the flow rate ratio of the source gases while depositing the film, a film whose composition is continuously changed can be deposited. In the case where the film is deposited while changing the flow rate ratio of the source gases, as compared to the case where the film is deposited using a plurality of deposition chambers, the time taken for the deposition can be shortened because the time taken for transfer and pressure adjustment is omitted. Thus, the productivity of the semiconductor device can be increased in some cases.

Next, the insulator 216_1 is deposited over the insulator 214 (see FIG. 3A). The insulator 216_1 can be deposited by a sputtering method, a CVD method, an MBE method, a PLD method, an ALD method, or the like. The insulator 216_1 is preferably deposited by the method using the gas in which hydrogen atoms are reduced or removed. Thus, the hydrogen concentration of the insulator 216_1 can be reduced.

Next, an opening reaching the insulator 214 is formed in the insulator 216_1. The opening may be formed by wet etching; however, dry etching is preferable for microfabrication. As the insulator 214, it is preferable to select an insulator that functions as an etching stopper film used in forming the opening by etching the insulator 216_1. For example, in the case where a silicon nitride film, an aluminum oxide film, or a hafnium oxide film is used for the insulator 214, a silicon oxide film or a silicon oxynitride film is preferably used for the insulator 216_1 in which the opening is formed.

After the formation of the opening, a conductive film to be the conductor 205a_1 is deposited. The conductive film desirably includes a conductor that has a function of inhibiting passage of oxygen. For example, tantalum nitride, tungsten nitride, or titanium nitride can be used. Alternatively, a stacked-layer film with tantalum, tungsten, titanium, molybdenum, aluminum, copper, or a molybdenum-tungsten alloy can be used. The conductive film to be the conductor 205a_1 can be deposited by a sputtering method, a CVD method, an MBE method, a PLD method, an ALD method, or the like.

The conductive film to be the conductor 205a_1 can have a multilayer structure. For example, tantalum nitride can be deposited by a sputtering method, and titanium nitride can be stacked over the tantalum nitride. Even when a metal that is easily diffused, such as copper, is used for a conductive film to be the conductor 205b_1 described later, the use of such metal nitride for the conductor 205a_1 can inhibit diffusion of the metal to the outside from the conductor 205a_1.

Next, the conductive film to be the conductor 205b_1 is deposited. The conductive film can be deposited by a plating method, a sputtering method, a CVD method, an MBE method, a PLD method, an ALD method, or the like. For the conductive film to be the conductor 205b_1, a low-resistance conductive material such as copper can be used.

Next, CMP treatment (Chemical Mechanical Polishing) is performed, thereby removing part of the conductive film to be the conductor 205a_1 and part of the conductive film to be the conductor 205b_1 to expose the insulator 216_1. As a result, the conductor 205a_1 and the conductor 205b_1 remain only in the opening portion. Thus, the conductor 205_1 whose top surface is flat can be formed (see FIG. 3A). Note that the insulator 216_1 is partly removed by the CMP treatment in some cases.

Although the conductor 205_1 is formed to be embedded in the opening in the insulator 216_1 in the above description, one embodiment of the present invention is not limited thereto. For example, a surface of the conductor 205_1 may be exposed in the following manner: the conductor 205_1 is formed over the insulator 214, the insulator 216_1 is deposited over the conductor 205_1, and then the insulator 216_1 is subjected to the CMP treatment so that the insulator 216_1 is partly removed.

Next, the insulator 222_1 is deposited over the conductor 205_1 and the insulator 216_1 (see FIG. 3A). An insulator containing an oxide of one or both of aluminum and hafnium is preferably deposited as the insulator 222_1. Note that as the insulator containing an oxide of one or both of aluminum and hafnium, aluminum oxide, hafnium oxide, an oxide containing aluminum and hafnium (hafnium aluminate), or the like is preferably used. The insulator containing an oxide of one or both of aluminum and hafnium has a barrier property against oxygen, hydrogen, and water. When the insulator 222_1 has a barrier property against hydrogen and water, hydrogen and water contained in components provided around the transistor 200 are inhibited from diffusing into the transistor 200 through the insulator 222_1, and generation of oxygen vacancies in the oxide 230a_1, the oxide 230b_1, and the oxide 230c_1 can be inhibited.

The insulator 222_1 can be deposited by a sputtering method, a CVD method, an MBE method, a PLD method, an ALD method, or the like.

Next, the insulator 224_1 is deposited over the insulator 222_1. The insulator 224_1 can be deposited by a sputtering method, a CVD method, an MBE method, a PLD method, an ALD method, or the like. For example, silicon oxide or silicon oxynitride can be used for the insulator 224_1. The insulator 224_1 is preferably deposited by the method using the gas in which hydrogen atoms are reduced or removed. Thus, the hydrogen concentration of the insulator 224_1 can be reduced. The hydrogen concentration of the insulator 224_1 is preferably reduced as described above because the insulator 224_1 includes a region in contact with the oxide 230a_1 in a later step.

Subsequently, heat treatment is preferably performed. The heat treatment is performed at a temperature higher than or equal to 250° C. and lower than or equal to 650° C., preferably higher than or equal to 300° C. and lower than or equal to 500° C., further preferably higher than or equal to 320° C. and lower than or equal to 450° C. The heat treatment is performed in a nitrogen or inert gas atmosphere, or an atmosphere containing an oxidizing gas at higher than or equal to 10 ppm, higher than or equal to 1%, or higher than or equal to 10%. The heat treatment may be performed under a reduced pressure. Alternatively, the heat treatment may be performed in such a manner that heat treatment is performed in a nitrogen or inert gas atmosphere, and then another heat treatment is performed in an atmosphere containing an oxidizing gas at higher than or equal to 10 ppm, higher than or equal to 1%, or higher than or equal to 10% in order to compensate for released oxygen.

For example, treatment can be performed at 400° C. in a nitrogen atmosphere for one hour, and successively another treatment can be performed at 400° C. in an oxygen atmosphere for one hour. By the heat treatment, impurities such as water and hydrogen contained in the insulator 224 can be removed.

Heat treatment may be performed after the deposition of the insulator 222_1 and before the deposition of the insulator 224_1. For the heat treatment, the above-described heat treatment conditions can be employed.

Here, plasma treatment containing oxygen may be performed under a reduced pressure so that an excess-oxygen region can be formed in the insulator 224_1. For the plasma treatment containing oxygen, an apparatus including a power source for generating high-density plasma using microwaves is preferably used, for example. Alternatively, the apparatus may include a power source for applying a high-frequency wave such as RF to the substrate side. The use of high-density plasma enables high-density oxygen radicals to be generated, and application of the RF to the substrate side allows oxygen radicals generated by the high-density plasma to be efficiently introduced into the insulator 224_1. Alternatively, after plasma treatment containing an inert gas is performed using this apparatus, plasma treatment containing oxygen may be performed to compensate for released oxygen. Note that impurities such as water and hydrogen contained in the insulator 224_1 can be removed by selecting the conditions of the plasma treatment appropriately. In that case, the heat treatment does not need to be performed.

Here, aluminum oxide may be deposited over the insulator 224_1, for example, by a sputtering method and the aluminum oxide may be subjected to CMP until the insulator 224_1 is reached. The CMP can planarize and smooth a surface of the insulator 224_1. When the CMP is performed while the aluminum oxide is positioned over the insulator 224_1, the endpoint of the CMP can be easily detected. Although part of the insulator 224_1 is polished by the CMP and the thickness of the insulator 224_1 is reduced in some cases, the thickness is adjusted when the insulator 224_1 is deposited. Planarizing and smoothing the surface of the insulator 224_1 can sometimes prevent deterioration of the coverage with an oxide deposited later and a decrease in the yield of the semiconductor device. Moreover, it is preferable to deposit aluminum oxide over the insulator 224_1 by a sputtering method, in which case oxygen can be added to the insulator 224_1.

Figure 3B:
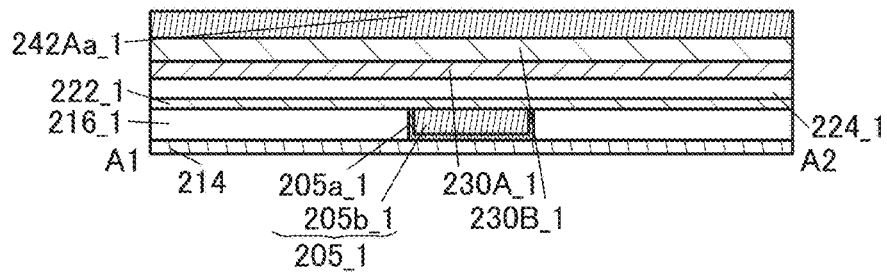

Next, an oxide film 230A_1 and an oxide film 230B_1 are deposited in this order over the insulator 224_1 (see FIG. 3B). It is preferable to deposit the above oxide films successively without exposure to an atmospheric environment. When the oxide film 230A_1 and the oxide film 230B_1 are deposited without exposure to the air, impurities or moisture from an atmospheric environment can be prevented from being attached on the oxide films. Accordingly, the vicinity of an interface between the oxide film 230A_1 and the oxide film 230B_1 can be kept clean.

The oxide film 230A_1 and the oxide film 230B_1 can be deposited by a sputtering method, a CVD method, an MBE method, a PLD method, an ALD method, or the like.

For example, in the case where the oxide film 230A_1 and the oxide film 230B_1 are deposited by a sputtering method, oxygen or a mixed gas of oxygen and a rare gas is used as a sputtering gas. Increasing the proportion of oxygen contained in the sputtering gas can increase the amount of excess oxygen in the deposited oxide films.

In particular, when the oxide film 230A_1 is deposited, part of oxygen contained in the sputtering gas is supplied to the insulator 224_1 in some cases. Thus, the proportion of oxygen contained in the sputtering gas for the oxide film 230A_1 is preferably 70% or higher, further preferably 80% or higher, and still further preferably 100%.

In the case where the oxide film 230B_1 is formed by a sputtering method, when the proportion of oxygen contained in the sputtering gas is higher than or equal to 1% and lower than or equal to 30%, preferably higher than or equal to 5% and lower than or equal to 20%, an oxygen-deficient oxide semiconductor is formed. A transistor in which an oxygen-deficient oxide semiconductor is used for its channel formation region can have relatively high field-effect mobility. Furthermore, when the deposition is performed while the substrate is being heated, the crystallinity of the oxide film can be improved. However, one embodiment of the present invention is not limited thereto. In the case where the oxide film 230B_1 is formed by a sputtering method, when the proportion of oxygen contained in the sputtering gas is higher than 30% and lower than or equal to 100%, preferably higher than or equal to 70% and lower than or equal to 100%, an oxygen-excess oxide semiconductor is formed. A transistor using an oxygen-excess oxide semiconductor for its channel formation region can have relatively high reliability.

For example, the oxide film 230A_1 is deposited by a sputtering method using a target with In:Ga:Zn=1:1:0.5 [atomic ratio], 2:2:1 [atomic ratio], or 1:3:4 [atomic ratio]. The oxide film 230B is deposited by a sputtering method using a target with In:Ga:Zn=4:2:4.1 [atomic ratio] or 1:1:1 [atomic ratio]. Note that each of the oxide films is preferably formed by appropriate selection of deposition conditions and the atomic ratio to have characteristics required for the oxide 230.

Next, heat treatment may be performed. As the heat treatment conditions, the above-described conditions can be employed. By the heat treatment, impurities such as water and hydrogen contained in the oxide film 230A_1 and the oxide film 230B_1 can be removed, for example. For example, treatment can be performed at 400° C. in a nitrogen atmosphere for one hour, and successively another treatment can be performed at 400° C. in an oxygen atmosphere for one hour.

Then, a conductive film 242Aa_1 is deposited over the oxide film 230B_1 (see FIG. 3B). The conductive film 242Aa_1 can be deposited by a sputtering method, a CVD method, an MBE method, a PLD method, an ALD method, or the like.

Next, the oxide film 230A_1, the oxide film 230B_1, and the conductive film 242Aa_1 are processed to have an island shape. Accordingly, a conductor 242A_1, the oxide 230a_1, and the oxide 230b_1 are formed (see FIG. 3C). For example, the conductive film 242Aa_1 is processed by a lithography method to form the conductor 242A_1, and then the oxide film 230A_1 and the oxide film 230B_1 are processed using the conductor 242A_1 as a hard mask. Here, the oxide 230a_1, the oxide 230b_1, and the conductor 242A_1 are formed to at least partly overlap with the conductor 205_1. The oxide 230a_1, the oxide 230b_1, and the conductor 242A_1 are formed to at least include regions not overlapping with the conductor 205_1. The processing can be performed by a dry etching method or a wet etching method. A dry etching method is suitable for microfabrication.

It is preferable that the side surfaces of the oxide 230a_1, the oxide 230b_1, and the conductor 242A_1 be substantially perpendicular to a top surface of the insulator 222_1. When the side surfaces of the oxide 230a_1, the oxide 230b_1, and the conductor 242A_1 are substantially perpendicular to the top surface of the insulator 222_1, the plurality of transistors 200 and the capacitors 100 can be provided in a smaller area and at a higher density. However, without being limited thereto, the angle formed between the side surfaces of the oxide 230a_1, the oxide 230b_1, and the conductor 242A_1 and the top surface of the insulator 222 may be an acute angle.

In the lithography method, first, a resist is exposed to light through a mask. Next, a region exposed to light is removed or left using a developing solution, so that a resist mask is formed. Then, etching treatment through the resist mask is conducted, whereby a conductor, a semiconductor, an insulator, or the like can be processed into a desired shape. The resist mask is formed, for example, by exposing the resist to KrF excimer laser light, ArF excimer laser light, or EUV (Extreme Ultraviolet) light. A liquid immersion technique may be employed in which a portion between a substrate and a projection lens is filled with a liquid (e.g., water) to perform light exposure. An electron beam or an ion beam may be used instead of the above-described light. Note that a mask is not necessary in the case of using an electron beam or an ion beam. Note that the resist mask can be removed by dry etching treatment such as ashing, wet etching treatment, wet etching treatment after dry etching treatment, or dry etching treatment after wet etching treatment.

As a dry etching apparatus, a capacitively coupled plasma (CCP) etching apparatus including parallel plate electrodes can be used. The capacitively coupled plasma etching apparatus including the parallel plate electrodes may have a structure in which a high-frequency power is applied to one of the parallel plate electrodes. Alternatively, a structure may be employed in which different high-frequency powers are applied to one of the parallel plate electrodes. Alternatively, a structure may be employed in which high-frequency powers with the same frequency are applied to the parallel plate electrodes. Alternatively, a structure may be employed in which high-frequency powers with different frequencies are applied to the parallel plate electrodes. Alternatively, a dry etching apparatus including a high-density plasma source can be used. As the dry etching apparatus including a high-density plasma source, an inductively coupled plasma (ICP) etching apparatus can be used, for example.

Note that in the case where the conductor 242Aa_1 is processed by a lithography method to form the conductor 242A_1 and then the oxide 230A_1 and the oxide 230B_1 are processed using the conductor 242A_1 as a hard mask, the resist mask formed in the processing of the conductive film 242Aa_1 may be removed either before the processing of the oxide film 230A_1 and the oxide film 230B_1 or after the processing.

Figure 3C:
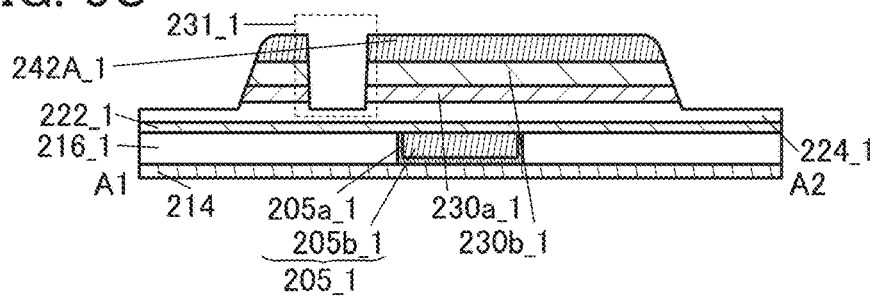

Next, part of the oxide 230a_1, part of the oxide 230b_1, and part of the conductor 242A_1 are processed by a lithography method or the like to form an opening 231_1 reaching the insulator 224 (see FIG. 3C). The opening is preferably formed not to overlap with the conductor 205_1.

Figure 3D:
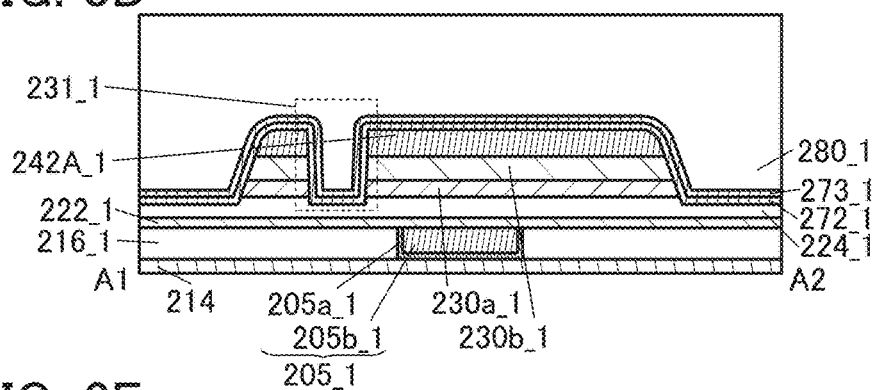

Next, the insulator 272_1 is deposited over the insulator 224_1 and the conductor 242A_1 to be in contact with an inner wall of the opening 231_1 (see FIG. 3D). The insulator 272_1 can be deposited by a sputtering method, a CVD method, an MBE method, a PLD method, an ALD method, or the like. For example, as the insulator 272_1, aluminum oxide can be deposited by a sputtering method. When aluminum oxide is deposited by a sputtering method, oxygen can be injected into the insulator 224_1.

Then, the insulator 273_1 is deposited over the insulator 272_1. The insulator 273_1 can be deposited by a sputtering method, a CVD method, an MBE method, a PLD method, an ALD method, or the like. For example, for the insulator 273_1, aluminum oxide can be deposited by an ALD method (see FIG. 3D).

Next, the insulator 280_1 is deposited. The insulator 280_1 can be deposited by a sputtering method, a CVD method, an MBE method, a PLD method, an ALD method, or the like. For example, for the insulator 280_1, a silicon oxide film is deposited by a sputtering method and another silicon oxide film is deposited thereover by a PEALD method or a thermal ALD method. The insulator 280_1 is preferably deposited by the method using the gas in which hydrogen atoms are reduced or removed. Thus, the hydrogen concentration of the insulator 280_1 can be reduced.

Next, the insulator 280_1 is subjected to CMP treatment, so that the insulator 280_1 having a flat top surface is formed (see FIG. 3D). Note that aluminum oxide may be deposited over the insulator 280_1, for example, by a sputtering method and the aluminum oxide may be subjected to CMP treatment until the insulator 280_1 is reached.

Figure 3E:
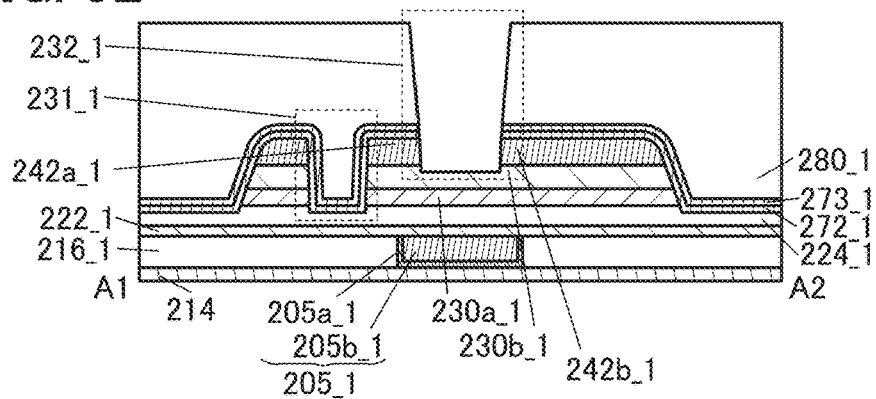

Next, part of the insulator 280_1, part of the insulator 273_1, part of the insulator 272_1, and part of the conductor 242A_1 are processed to form an opening 232_1 reaching the oxide 230b_1 (see FIG. 3E). The opening 232_1 is preferably formed to include a region overlapping with the conductor 205. The conductor 242a_1 and the conductor 242b_1 are formed by the formation of the opening 232_1.

The part of the insulator 280_1, the part of the insulator 273_1, the part of the insulator 272_1, and the part of the conductor 242A_1 can be processed by a dry etching method or a wet etching method. A dry etching method is suitable for microfabrication. The processing may be performed under different conditions. For example, the part of the insulator 280_1 may be processed by a dry etching method, the part of the insulator 273_1 may be processed by a wet etching method, the part of the insulator 272_1 may be processed by a dry etching method, and the part of the conductor 242A_1 may be processed by a dry etching method.

In some cases, the processing such as dry etching performed thus far causes the attachment or diffusion of impurities due to an etching gas or the like to a surface or inside of the oxide 230a_1, the oxide 230b_1, or the like. Examples of the impurities include fluorine and chlorine.

In order to remove the impurities and the like, cleaning is performed. Examples of the cleaning method include wet cleaning using a cleaning solution or the like, plasma treatment using plasma, and cleaning by heat treatment, and any of these cleanings may be performed in appropriate combination.

The wet cleaning may be performed using an aqueous solution in which oxalic acid, phosphoric acid, ammonia water, hydrofluoric acid, or the like is diluted with carbonated water or pure water. Alternatively, ultrasonic cleaning using pure water or carbonated water may be performed.

By the processing such as dry etching performed thus far or the above-described cleaning treatment, the thickness of the oxide 230b_1 in a region not overlapping with the conductor 242a_1 and the conductor 242b_1 is sometimes smaller than the thickness of the oxide 230b_1 in a region overlapping with the conductor 242a_1 and the conductor 242b_1 (see FIG. 3E).

After the etching or the cleaning treatment, heat treatment may be performed. The heat treatment is performed at a temperature higher than or equal to 100° C. and lower than or equal to 450° C., preferably higher than or equal to 350° C. and lower than or equal to 400° C., for example. Note that the heat treatment is performed in a nitrogen gas or inert gas atmosphere, or an atmosphere containing an oxidizing gas at higher than or equal to 10 ppm, higher than or equal to 1%, or higher than or equal to 10%. For example, the heat treatment is preferably performed in an oxygen atmosphere. Accordingly, oxygen can be supplied to the oxide 230a_1 and the oxide 230b_1 to reduce the oxygen vacancies Vo. The heat treatment may be performed under a reduced pressure. Alternatively, the heat treatment may be performed in an oxygen atmosphere, and then another heat treatment may be successively performed in a nitrogen atmosphere without exposure to the air.

Next, an oxide film to be the oxide 230c_1 is deposited. Heat treatment may be performed before the oxide film is deposited. The heat treatment is preferably performed under a reduced pressure. After the heat treatment, the oxide film to be the oxide 230c_1 is preferably successively deposited without exposure to the air. The heat treatment is preferably performed in an oxygen-containing atmosphere. Such treatment can remove moisture and hydrogen adsorbed on the surface of the oxide 230b_1 or the like and can reduce the moisture concentration and the hydrogen concentration in the oxide 230a_1 and the oxide 230b_1. The temperature of the heat treatment is preferably higher than or equal to 100°

C. and lower than or equal to 400° C., further preferably higher than or equal to 150° C. and lower than or equal to 350° C.

The oxide film to be the oxide 230c_1 can be deposited by a sputtering method, a CVD method, an MBE method, a PLD method, an ALD method, or the like. The oxide film can be deposited by a sputtering method using a target with In:Ga:Zn=4:2:4.1 [atomic ratio], a target with In:Ga:Zn=5:1:3 [atomic ratio], a target with In:Ga:Zn=10:1:3 [atomic ratio], a target with In:Ga:Zn=1:3:4 [atomic ratio], or a target of indium oxide, for example. A target with a high proportion of indium for the oxide film to be the oxide 230c_1 can improve the on-state current, the field-effect mobility, or the like of the transistor 200.

Note that the oxide film to be the oxide 230c_1 may have a stacked layer structure. For example, the oxide film may be deposited by a sputtering method using a target with In:Ga:Zn=4:2:4.1 [atomic ratio] and successively using a target with In:Ga:Zn=1:3:4 [atomic ratio].

When the oxide film to be the oxide 230c_1 is deposited, part of oxygen contained in the sputtering gas is supplied to the oxide 230a_1 and the oxide 230b_1 in some cases. Alternatively, when the oxide film to be the oxide 230c_1 is deposited, part of oxygen contained in the sputtering gas is supplied to the insulator 280_1 in some cases. Thus, the proportion of oxygen contained in the sputtering gas is higher than or equal to 70%, preferably higher than or equal to 80%, further preferably 100%.

Next, heat treatment may be performed. Such heat treatment can remove moisture and hydrogen adsorbed on a surface of the oxide film to be the oxide 230c_1 or the like and can reduce the moisture concentration and the hydrogen concentration in the oxide 230a_1, the oxide 230b_1, and the oxide film to be the oxide 230c_1. The temperature of the heat treatment is preferably higher than or equal to 100° C. and lower than or equal to 400° C. In this embodiment, the temperature of the heat treatment is 200° C.

Next, an insulating film to be the insulator 250_1 is deposited over the oxide film to be the oxide 230c_1. The insulating film can be deposited by a sputtering method, a CVD method, an MBE method, a PLD method, an ALD method, or the like. The insulating film to be the insulator 250_1 is preferably deposited by the method using the gas in which hydrogen atoms are reduced or removed. Thus, the hydrogen concentration of the insulating film to be the insulator 250_1 can be reduced. Note that heat treatment may be performed under a reduced pressure after the deposition of the oxide film to be the oxide 230c_1, and the insulating film to be the insulator 250_1 may be successively deposited without exposure to the air.

Next, irradiation with a microwave or a high-frequency wave such as RF may be performed. The microwave or high-frequency wave such as RF used for the irradiation penetrates into the insulator 280_1, the oxide 230b_1, and the oxide 230a_1 and removes hydrogen therein. In particular, in the oxide 230a_1 and the oxide 230b_1, a reaction in which a bond of VoH is cut, i.e., a reaction of "VoH→Vo+ H", occurs, and the oxide 230a_1 and the oxide 230b_1 are dehydrogenated. Part of hydrogen generated at this time is bonded to oxygen to be H₂O, and removed from the oxide 230a_1, the oxide 230b_1, and the insulator 280_1 in some cases. Part of hydrogen is gettered by the conductor 242a_1 and the conductor 242b_1 in some cases. In this manner, irradiation with a microwave or a high-frequency wave such as RF can reduce the hydrogen concentration in the insulator 280_1, the oxide 230b_1, and the oxide 230a_1.

Alternatively, an oxygen gas may be made into plasma with a microwave or a high-frequency wave such as RF to form oxygen radicals. That is, the insulator 280_1, the oxide 230b_1, and the oxide 230a_1 may be subjected to plasma treatment in an oxygen-containing atmosphere. Hereinafter, such treatment is sometimes referred to as oxygen plasma treatment.

The formed oxygen radicals can supply oxygen to the insulator 280_1, the oxide 230b_1, and the oxide 230a_1. In the case where plasma treatment is performed on the insulator 280_1, the oxide 230b_1, and the oxide 230a_1 in an oxygen-containing atmosphere, the oxide 230b_1 and the oxide 230a_1 may be less likely to be irradiated with a microwave or a high-frequency wave such as RF.

Note that oxygen plasma treatment is preferably performed with a microwave processing apparatus including a power source for generating high-density plasma using microwaves, for example. The microwave processing apparatus may include a power source for applying RF to the substrate side. The use of high-density plasma enables high-density oxygen radicals to be generated. Furthermore, application of RF to the substrate side allows oxygen ions generated by the high-density plasma to be efficiently introduced into the insulator 280_1, the oxide 230b_1, and the oxide 230a_1. The oxygen plasma treatment is preferably performed under a reduced pressure, and the pressure is set to higher than or equal to 60 Pa, preferably higher than or equal to 133 Pa, further preferably higher than or equal to 200 Pa, still further preferably higher than or equal to 400 Pa. Furthermore, the oxygen flow rate ratio (O₂/O₂+Ar) is lower than or equal to 50%, preferably higher than or equal to 10% and lower than or equal to 30%. The treatment temperature is approximately 400° C., for example. After the oxygen plasma treatment, heat treatment may be successively performed without exposure to the air.

Next, a conductive film to be the conductor 260a_1 and a conductive film to be the conductor 260b_1 are deposited. The conductive film to be the conductor 260a_1 and the conductive film to be the conductor 260b_1 can be deposited by a sputtering method, a CVD method, an MBE method, a PLD method, an ALD method, or the like. For example, the conductive film to be the conductor 260a_1 is deposited by an ALD method, and the conductive film to be the conductor 260b_1 is deposited by a CVD method.

Figure 4A:
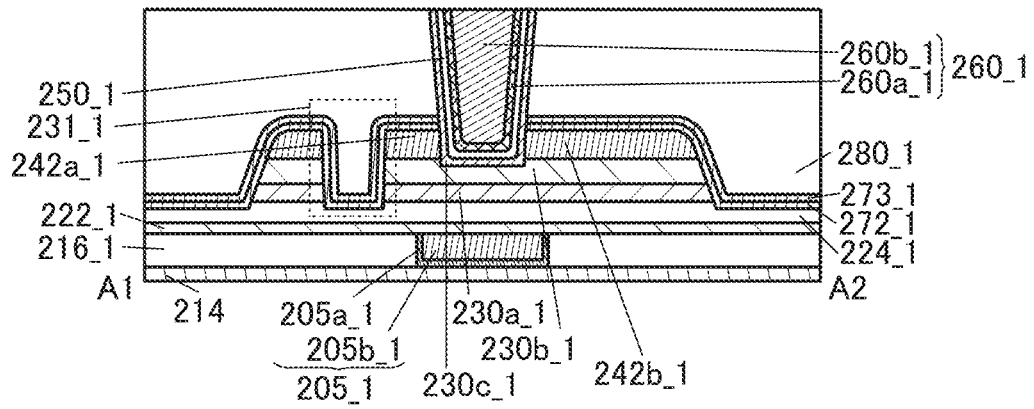
FIG. 4A to FIG. 4C are cross-sectional views illustrating the example of a method for manufacturing a semiconductor device.

Next, by CMP treatment, the oxide film to be the oxide 230c_1, the insulating film to be the insulator 250_1, the conductive film to be the conductor 260a_1, and the conductive film to be the conductor 260b_1 are polished until the insulator 280 is exposed, whereby the oxide 230c_1, the insulator 250_1, and the conductor 260_1 (the conductor 260a_1 and the conductor 260b_1) are formed inside the opening 232_1 (see FIG. 4A).

After that, heat treatment may be performed. For example, the treatment is performed at 400° C. in a nitrogen atmosphere for one hour. The heat treatment can reduce the moisture concentration and the hydrogen concentration in the insulator 250_1 and the insulator 280_1.

Figure 4B:
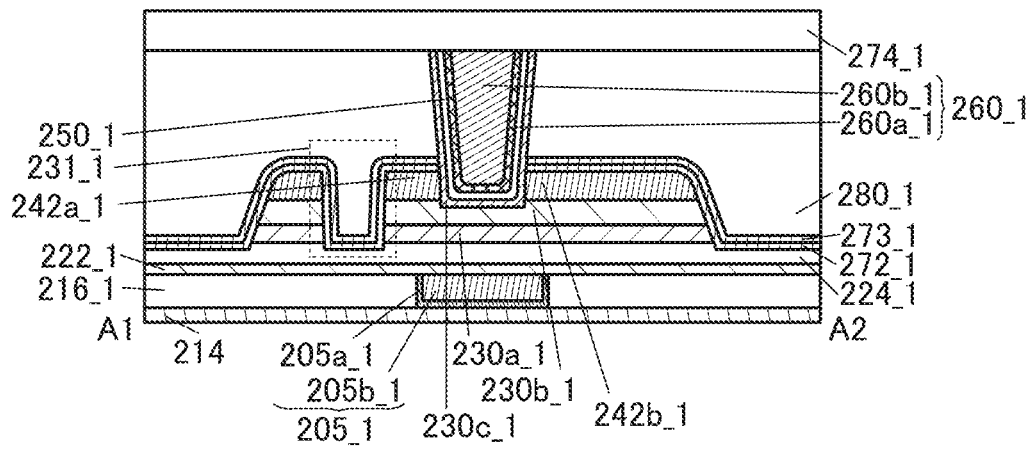

Next, the insulator 274_1 is deposited over the conductor 260_1, the oxide 230c_1, the insulator 250_1, and the insulator 280_1 (see FIG. 4B). An insulating film to be the insulator 274_1 can be deposited by a sputtering method, a CVD method, an MBE method, a PLD method, an ALD method, or the like. The insulator 274_1 is preferably deposited by the method using the gas in which hydrogen atoms are reduced or removed. Thus, the hydrogen concentration of the insulator 274_1 can be reduced. Note that heat treatment may be performed after the formation of the conductor 260_1, and the insulator 274_1 may be successively deposited without exposure to the air after the heat treatment.

Next, an opening 233_1 reaching the insulator 214 is formed in the insulator 274_1, the insulator 280_1, the insulator 273_1, the insulator 272_1, the insulator 224_1, the insulator 222_1, and the insulator 216_1 to include a region overlapping with the opening 231_1. Furthermore, an opening 234_1 reaching the conductor 242b_1 is formed in the insulator 274_1, the insulator 280_1, the insulator 273_1, and the insulator 272_1 (see FIG. 4C). The opening 233_1 and the opening 234_1 are formed by a lithography method or the like.

In the semiconductor device of one embodiment of the present invention, the opening 231_1 is formed before the deposition of the insulator 280_1, and the opening 233_1 is formed to include a region overlapping with the opening 231_1 after the formation of the insulator 280_1 and the insulator 274_1. Accordingly, the oxide 230a_1, the oxide 230b_1, and the conductor 242a_1 do not need to be etched when the opening 233_1 is formed. That is, the opening 233_1 can be formed by etching only the insulators after the formation of the insulator 274_1. Thus, after the formation of the insulator 274_1, the opening 231_1 can be formed under one etching condition. Consequently, the manufacturing process of the semiconductor device of one embodiment of the present invention can be simplified. Therefore, the manufacturing cost of the semiconductor device of one embodiment of the present invention can be reduced, and the yield can be increased. That is, the productivity of the semiconductor device of one embodiment of the present invention can be increased.

Next, a conductive film to be the conductor 244_1 and the conductor 240_1 is deposited. The conductive film desirably has a stacked-layer structure that includes a conductor having a function of inhibiting passage of impurities such as water and hydrogen. For example, a stacked layer of tantalum nitride, titanium nitride, or the like and tungsten, molybdenum, copper, or the like can be employed. The conductive film to be the conductor 244_1 and the conductor 240_1 can be deposited by a sputtering method, a CVD method, an MBE method, a PLD method, an ALD method, or the like.

Figure 5A:
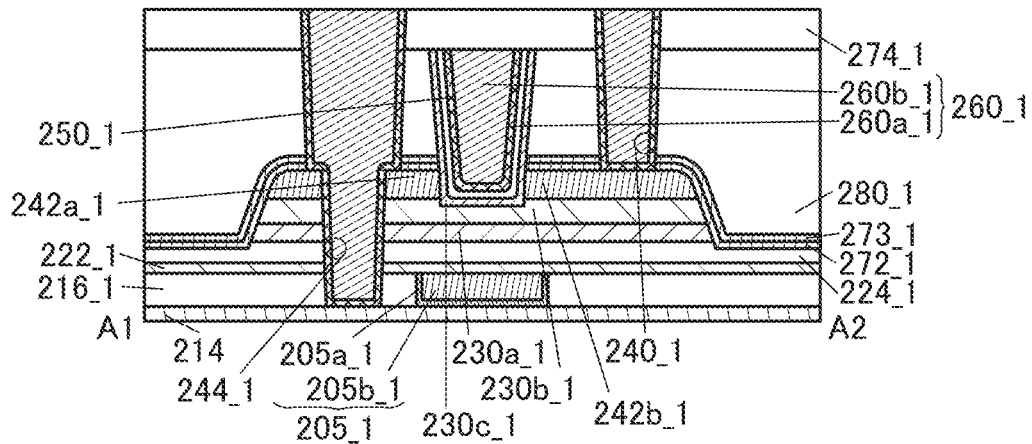
FIG. 5A to FIG. 5C are cross-sectional views illustrating the example of a method for manufacturing a semiconductor device.

Then, CMP treatment is performed to remove part of the conductive film to be the conductor 244_1 and the conductor 240_1, so that the top surface of the insulator 274_1 is exposed. Consequently, the conductive film remains only in the openings. Accordingly, the conductor 244_1 is formed inside the opening 233_1, and the conductor 240_1 is formed inside the opening 234_1 (see FIG. 5A). Note that the top surface of the insulator 274_1 is partly removed by the CMP treatment in some cases.

Figure 5B:
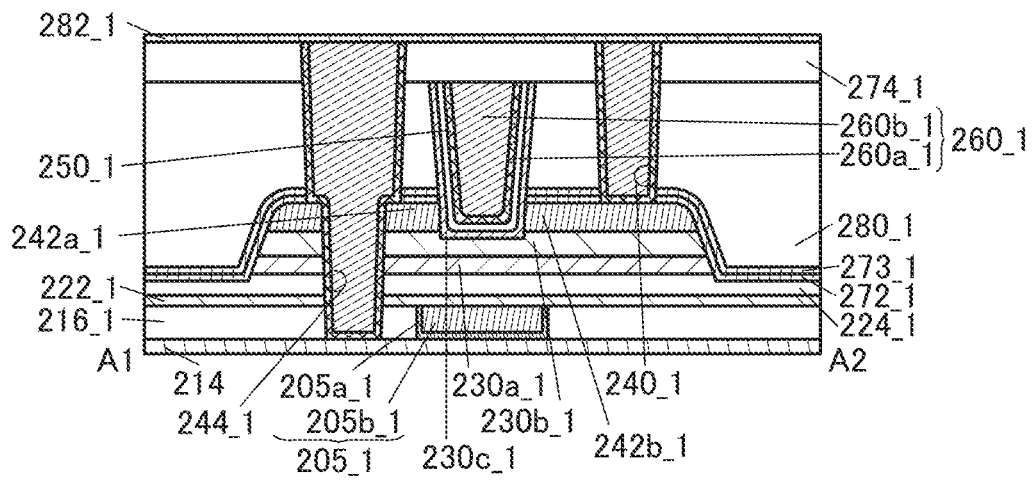

Next, the insulator 282_1 is deposited over the conductor 240_1, the conductor 244_1, and the insulator 274_1 (see FIG. 5B). The insulator 282_1 can be deposited by a sputtering method, a CVD method, an MBE method, a PLD method, an ALD method, or the like.

Figure 5C:
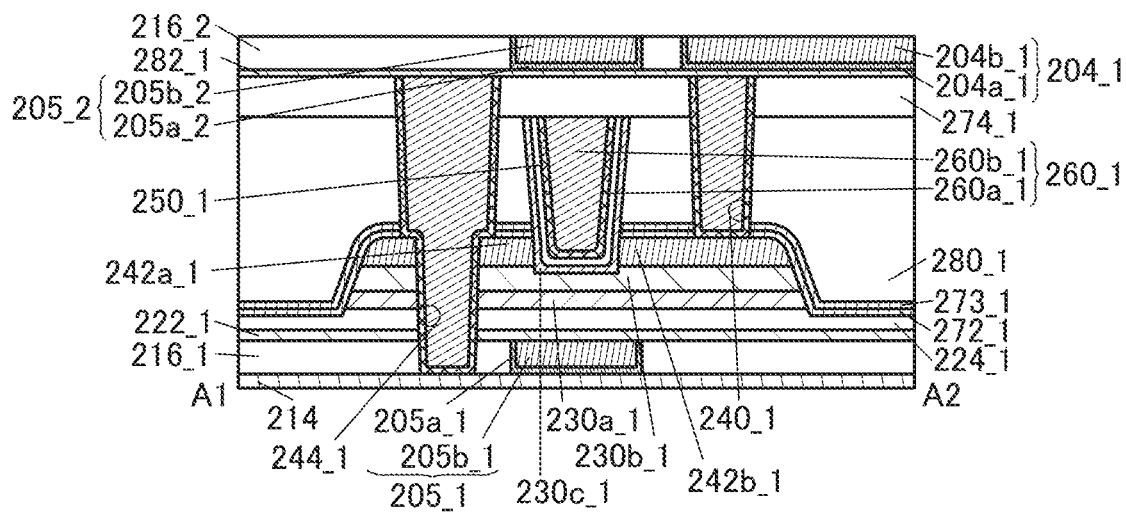

Next, the insulator 216_2 is deposited over the insulator 282_1 (see FIG. 5C). The insulator 216_2 can be deposited in a manner similar to that of the insulator 216_1.

Then, two openings reaching the insulator 282_1 are formed in the insulator 216_2. One opening can be formed to include a region overlapping with the conductor 205_1, and the other opening can be formed to include a region overlapping with the conductor 240_1. Note that the one opening does not necessarily include the region overlapping with the conductor 205_1. These openings can be formed in a manner similar to that of the opening in which the conductor 205_1 is provided.

Here, as the insulator 282_1, it is preferable to select an insulator that functions as an etching stopper film used in forming the opening by etching the insulator 216_2. For example, in the case where an aluminum oxide film or a hafnium oxide film is used for the insulator 282_1, a silicon oxide film or a silicon oxynitride film is preferably used for the insulator 216_2 in which the opening is formed.

After the formation of the openings, a conductive film to be the conductor 204a_1 and the conductor 205a_2 is deposited. The conductive film can be deposited using a method and a material similar to those for the conductive film to be the conductor 205a_1.

After the formation of the openings, a conductive film to be the conductor 204b_1 and the conductor 205b_2 is deposited. The conductive film can be deposited using a method and a material similar to those for the conductive film to be the conductor 205b_1.

Next, CMP treatment is performed to remove the conductive film to be the conductor 204_1 and the conductor 205_2, so that the insulator 216_2 is exposed. As a result, the conductive film remains only in the opening portions. Thus, the conductor 204_1 and the conductor 205_2, which have a planar top surface, can be formed (see FIG. 5C). Note that the insulator 216_2 is partly removed by the CMP treatment in some cases.

Although the conductor 204_1 and the conductor 205_2 are formed to be embedded in the openings in the insulator 216_2 in the above description, one embodiment of the present invention is not limited thereto. For example, a surface of the conductor 204_1 and a surface of the conductor 205_2 may be exposed in the following manner: the conductor 204_1 and the conductor 205_2 are formed over the insulator 282_1, the insulator 216_2 is deposited over the conductor 204_1 and the conductor 205_2, and then the insulator 216_2 is subjected to CMP treatment so that the insulator 216_2 is partly removed.

As described above, in the manufacturing method of the semiconductor device of one embodiment of the present invention, the conductor 204 and the conductor 205 can be formed in the same process. Therefore, the manufacturing process of the semiconductor device of one embodiment of the present invention can be simplified. Therefore, the manufacturing cost of the semiconductor device of one embodiment of the present invention can be reduced, and the yield can be increased. That is, the productivity of the semiconductor device of one embodiment of the present invention can be increased.

Figure 6A:
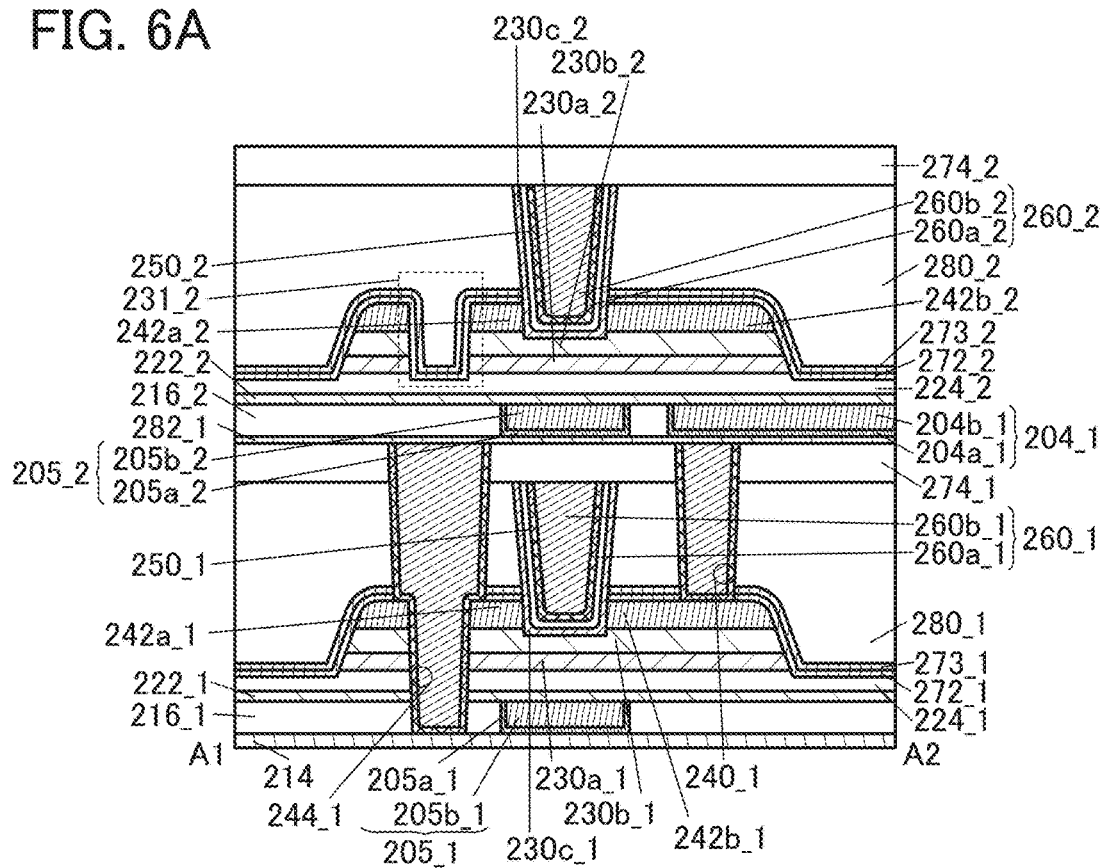
FIG. 6A and FIG. 6B are cross-sectional views illustrating the example of a method for manufacturing a semiconductor device.

Next, the insulator 222_2 is deposited over the conductor 204_1, the conductor 205_2, and the insulator 216_2 (see FIG. 6A). The insulator 222_2 can be deposited using a method and a material similar to those for the insulator 222_1.

Next, the insulator 2242 is formed in a manner similar to that of the insulator 224_1, the oxide 230a_2 is formed in a manner similar to that of the oxide 230a_1, and the oxide 230b_2 is formed in a manner similar to that of the oxide 230b_1. An opening 231_2 is formed in a manner similar to that of the opening 231_1, the insulator 272_2 is formed in a manner similar to that of the insulator 272_1, the insulator 2732 is formed in a manner similar to that of the insulator 273_1, and the insulator 280_2 is formed in a manner similar to that of the insulator 280_1. Furthermore, the conductor 242a_2 is formed in a manner similar to that of the conductor 242a_1, the conductor 242b_2 is formed in a manner similar to that of the conductor 242b_1, the oxide 230c_2 is formed in a manner similar to that of the oxide 230c_1, the insulator 250_2 is formed in a manner similar to that of the insulator 250_1, the conductor 260_2 is formed in a manner similar to that of the conductor 260_1, and the insulator 274_2 is formed in a manner similar to that of the insulator 274_1 (see FIG. 6A).

Figure 6B:
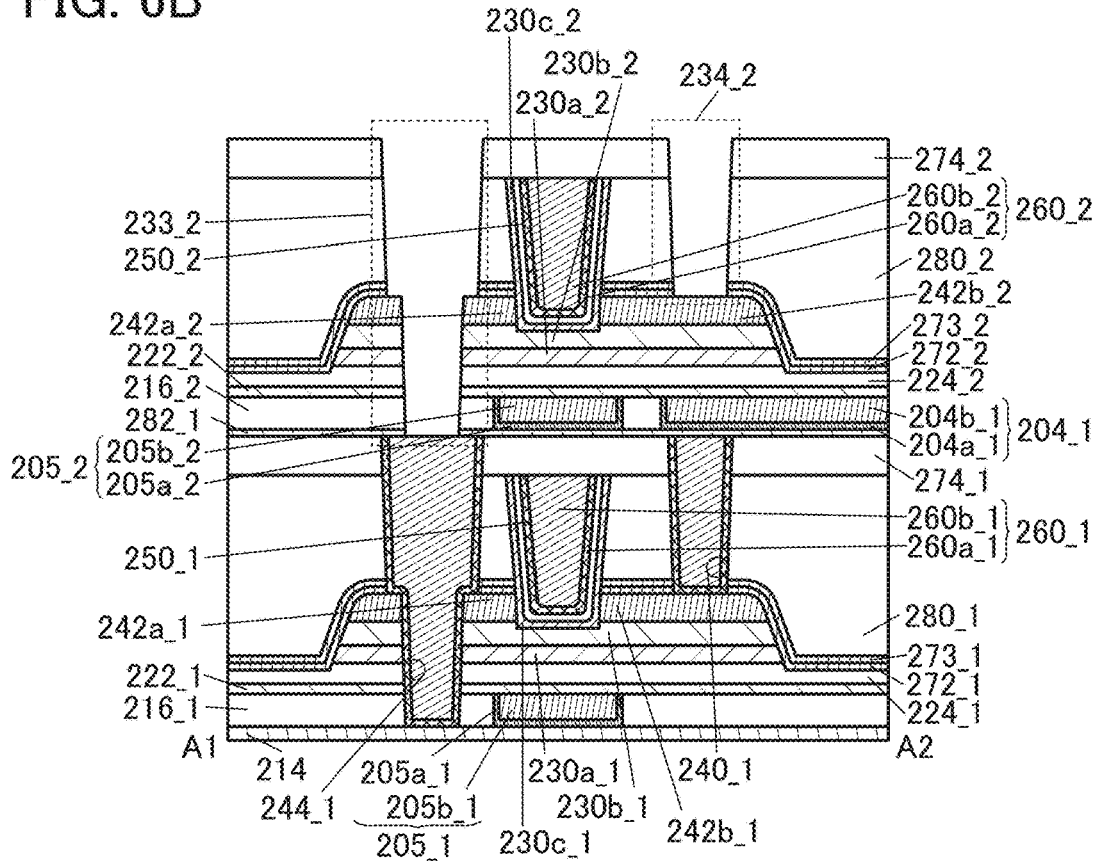

Next, an opening 233_2 reaching the insulator 244_1 is formed in the insulator 274_2, the insulator 280_2, the insulator 273_2, the insulator 272_2, the insulator 224_2, the insulator 222_2, the insulator 216_2, and the insulator 282_2 to include a region overlapping with the opening 231_2. Furthermore, an opening 234_2 reaching the conductor 242b_2 is formed in the insulator 274_2, the insulator 280_2, the insulator 273_2, and the insulator 272_2 (see FIG. 6B). The opening 233_2 and the opening 234_2 are formed by a lithography method or the like.

In the semiconductor device of one embodiment of the present invention, the opening 231_2 is formed before the deposition of the insulator 280_2, and the opening 233_2 is formed to include a region overlapping with the opening 231_2 after the formation of the insulator 280_2 and the insulator 274_2. Accordingly, the oxide 230a_2, the oxide 230b_2, and the conductor 242a_2 do not need to be etched when the opening 233_2 is formed. That is, the opening 233_2 can be formed by etching only the insulators after the formation of the insulator 274_2. Thus, after the formation of the insulator 274_2, the opening 233_2 can be formed under one etching condition. Consequently, the manufacturing process of the semiconductor device of one embodiment of the present invention can be simplified. Therefore, the manufacturing cost of the semiconductor device of one embodiment of the present invention can be reduced, and the yield can be increased. That is, the productivity of the semiconductor device of one embodiment of the present invention can be increased.

Figure 7:
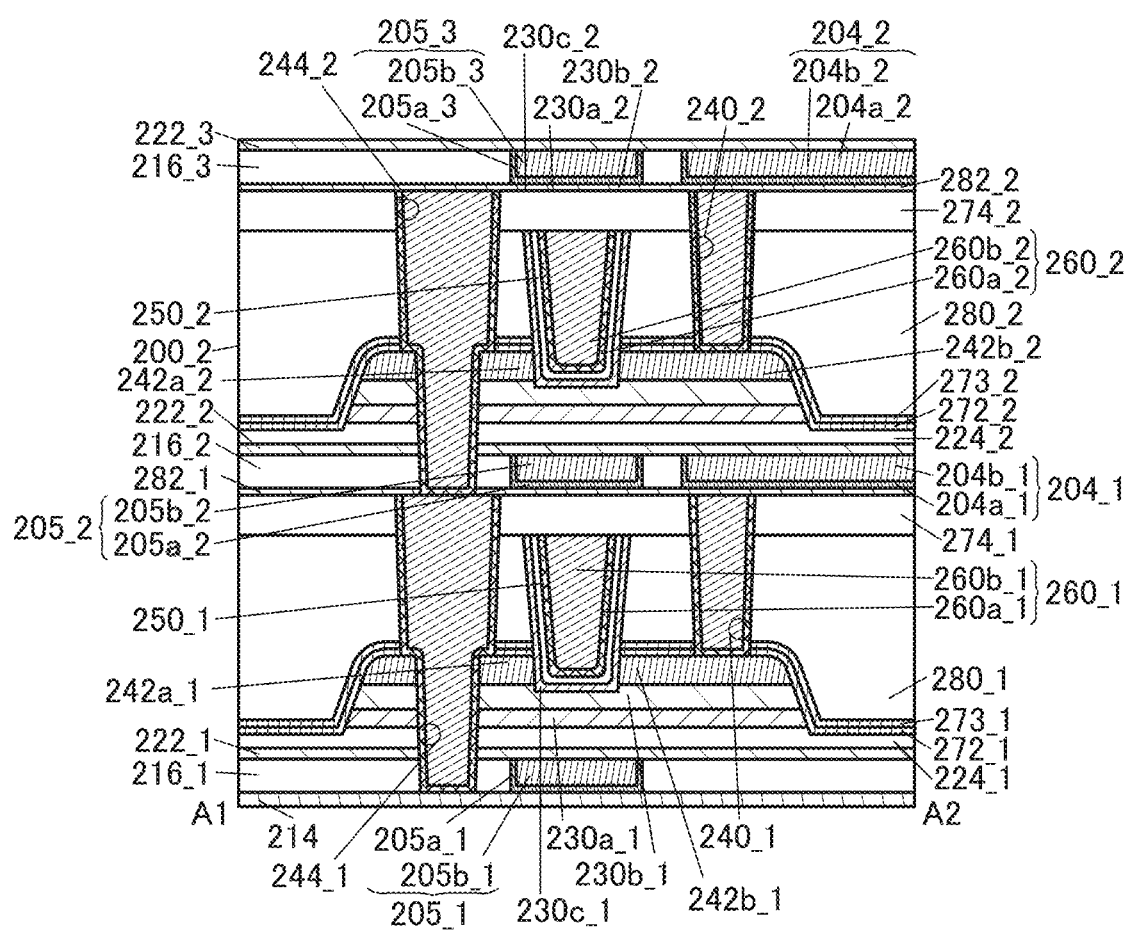
FIG. 7 is a cross-sectional view illustrating the example of a method for manufacturing a semiconductor device.

Next, the conductor 244_2 and the conductor 240_2 are formed in a manner similar to that of the conductor 244_1 and the conductor 240_1, the insulator 282_2 is formed in a manner similar to that of the insulator 282_1, the insulator 216_3 is formed in a manner similar to that of the insulator 216_2, the conductor 204_2 is formed in a manner similar to that of the conductor 204_1, the conductor 205_3 is formed in a manner similar to that of the conductor 205_2, and the insulator 222_3 is formed in a manner similar to that of the insulator 222_2 (see FIG. 7).

Through the above process, the semiconductor device including the transistor 200 and the capacitor 100 illustrated in FIG. 1A, FIG. 1B, FIG. 2A, and FIG. 2B can be manufactured.

Structure Example 2 of Semiconductor Device

Figure 8A:
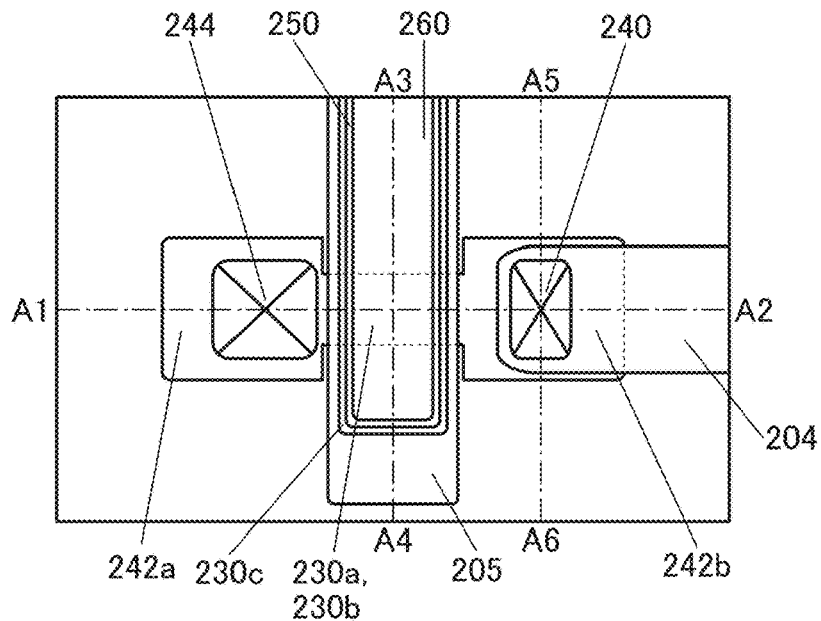
FIG. 8A is a top view illustrating a structure example of a semiconductor device.
Figure 8B:
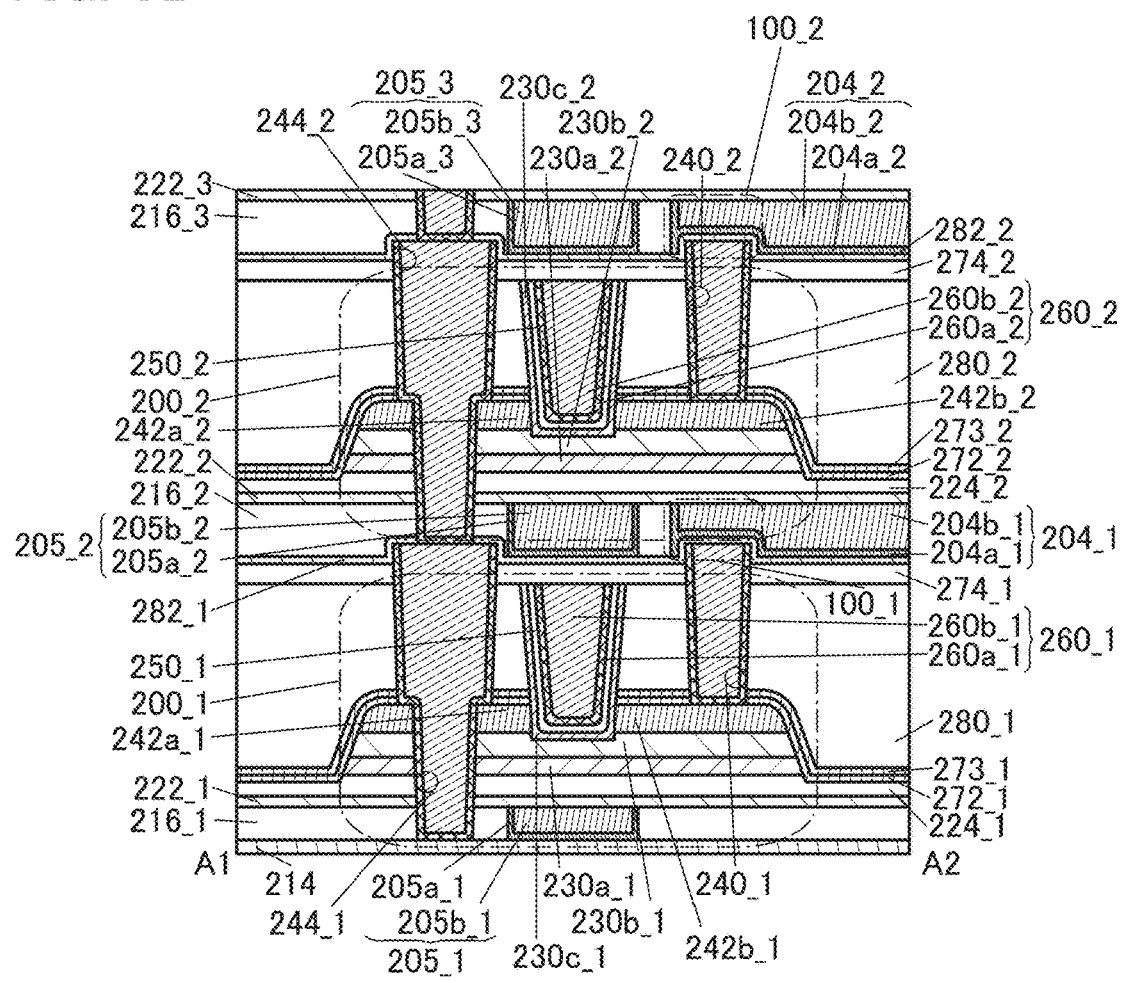
FIG. 8B is a cross-sectional view illustrating a structure example of the semiconductor device.
Figure 9A:
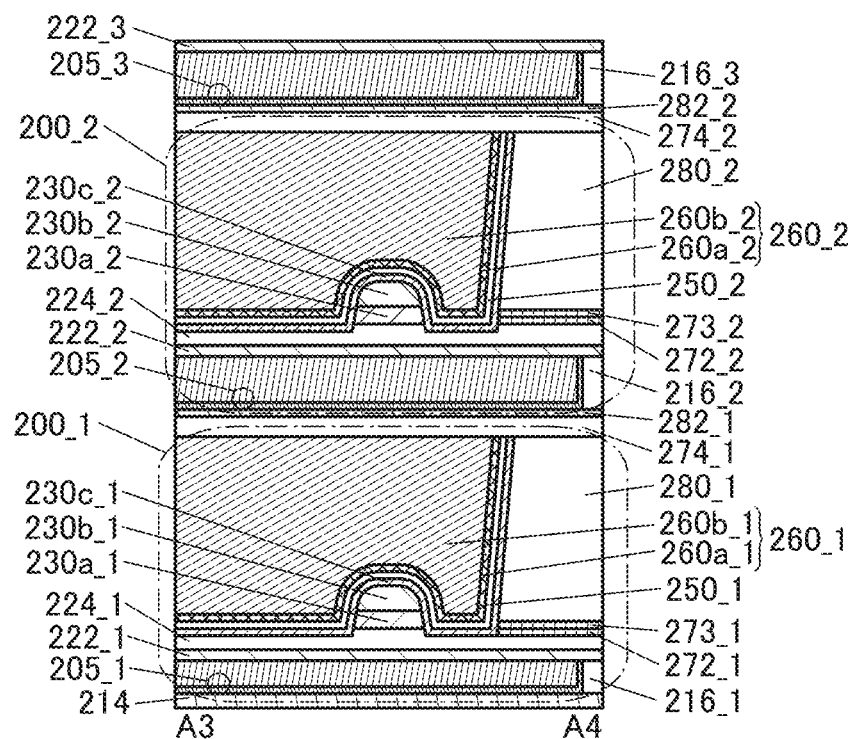
FIG. 9A and FIG. 9B are cross-sectional views illustrating the structure example of the semiconductor device.
Figure 9B:
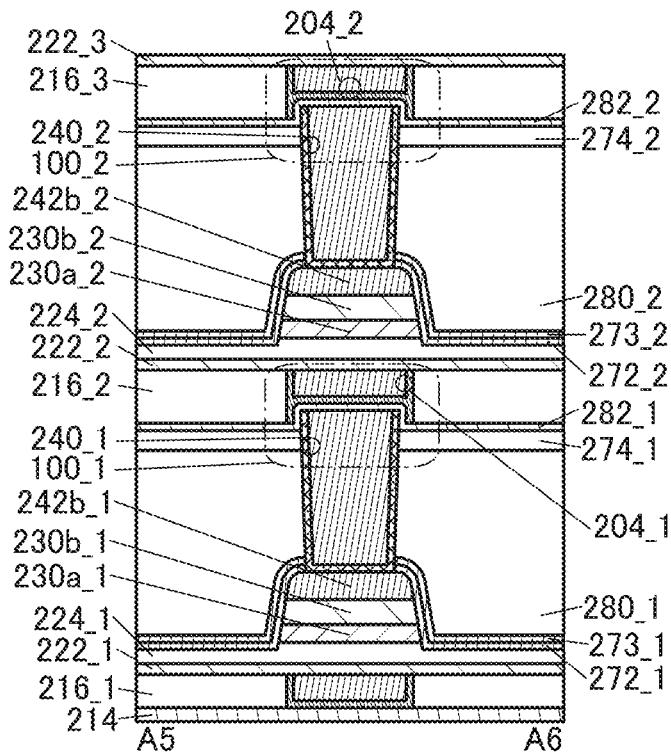

FIG. 8A is a top view illustrating a structure example of the semiconductor device including the transistor 200 and the capacitor 100. FIG. 8B, FIG. 9A, and FIG. 9B are cross-sectional views illustrating the structure example of the semiconductor device. Here, FIG. 8B, FIG. 9A, and FIG. 9B are cross-sectional views illustrating the structure example of the semiconductor device. Here, FIG. 8B is a cross-sectional view of a portion indicated by the dashed-dotted line A1-A2 in FIG. 8A, is a cross-sectional view of the transistor 200 in the channel length direction, and is a cross-sectional view of the capacitor 100 in the direction parallel to the channel length direction. FIG. 9A is a cross-sectional view of a portion indicated by the dashed-dotted line A3-A4 in FIG. 8A, and is a cross-sectional view of the transistor 200 in the channel width direction. FIG. 9B is a cross-sectional view of a portion indicated by the dashed-dotted line A5-A6 in FIG. 8A, and is a cross-sectional view of the capacitor 100 in the direction parallel to the channel width direction of the transistor 200.

In the semiconductor device with the structure described in this embodiment, i.e., illustrated in FIG. 8A, FIG. 8B, FIG. 9A, FIG. 9B, and the like, components having the same functions as the components in the semiconductor device illustrated in FIG. 1A and FIG. 1B are denoted by the same reference numerals. Note that the materials described in detail in <Structure example of semiconductor device> can be used as the constituent materials for the transistor 200 and the capacitor 100 described in this embodiment.

The semiconductor device with the structure illustrated in FIG. 8A, FIG. 8B, FIG. 9A, and FIG. 9B is a modification example of the semiconductor device with the structure illustrated in FIG. 1A, FIG. 1B, FIG. 2A, and FIG. 2B, and is different from the semiconductor device with the structure illustrated in FIG. 1A, FIG. 1B, FIG. 2A, and FIG. 2B in that the insulator 282 and the conductor 204 cover part of a side surface of the conductor 240. With the structure illustrated in FIG. 8A, FIG. 8B, FIG. 9A, and FIG. 9B, the area where the conductor 240 having a function of the one electrode of the capacitor 100 and the conductor 204 having a function of the other electrode of the capacitor 100 overlap with each other with the insulator 282 having a function of the dielectric of the capacitor 100 therebetween can be made larger than the area shown in the top view. In other words, the capacity of the capacitor 100 can be increased without increasing the area in the top view where the one electrode and the other electrode overlap with each other, in which case the capacitor 100 can be miniaturized.

Manufacturing Method Example 2 of Semiconductor Device

Next, an example of a method for manufacturing the semiconductor device including the transistor 200 and the capacitor 100 illustrated in FIG. 8A, FIG. 8B, FIG. 9A, and FIG. 9B is described with reference to the drawings. The drawings are cross-sectional views corresponding to the portion indicated by the dashed-dotted line A1-A2 illustrated in FIG. 8A and correspond to the channel length direction of the transistor 200.

Figure 10A:
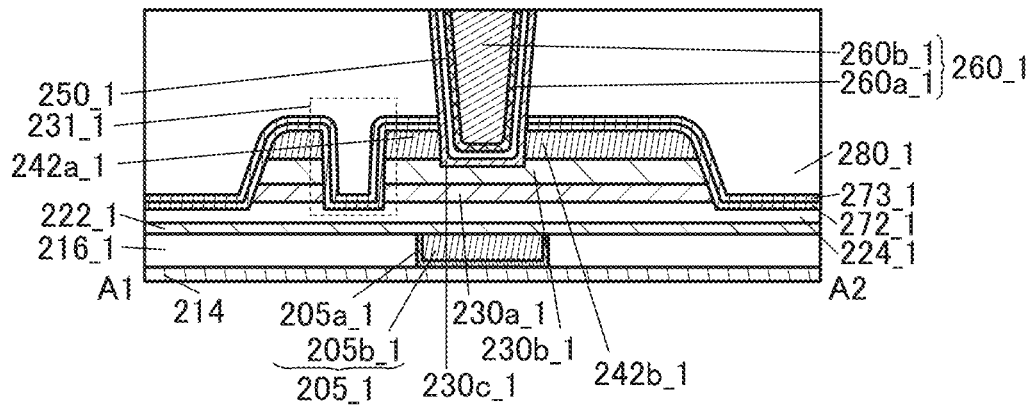
FIG. 10A to FIG. 10C are cross-sectional views illustrating an example of a method for manufacturing a semiconductor device.

First, the insulator 214, the conductor 205_1, the insulator 216_1, the insulator 222_1, the insulator 224_1, the oxide 230a_1, the oxide 230b_1, the opening 231_1, the insulator 272_1, the insulator 273_1, the insulator 280_1, the oxide 230c_1, the conductor 242a_1, the conductor 242b_1, the insulator 250_1, and the conductor 260_1 are formed in a manner similar to that illustrated in FIG. 3A to FIG. 3E and FIG. 4A (see FIG. 10A).

Next, the insulator 274_1 is formed in a manner similar to that illustrated in FIG. 4B. After that, an insulator 275_1 is formed over the insulator 274_1 (see FIG. 10B). Next, an opening reaching the insulator 214 is formed in the insulator 275_1, the insulator 274_1, the insulator 280_1, the insulator 273_1, the insulator 272_1, the insulator 224_1, the insulator 222_1, and the insulator 216_1 to include a region overlapping with the opening 231_1. Furthermore, an opening reaching the conductor 242b_1 is formed in the insulator 275_1, the insulator 274_1, the insulator 280_1, the insulator 273_1, and the insulator 272_1. These openings are formed by a lithography method or the like.

Next, a conductive film to be the conductor 244_1 and the conductor 240_1 is deposited. The conductive film can be deposited by a sputtering method, a CVD method, an MBE method, a PLD method, an ALD method, or the like.

Then, CMP treatment is performed to remove part of the conductive film to be the conductor 244_1 and the conductor 240_1, so that a top surface of the insulator 275_1 is exposed. Consequently, the conductive film remains only in the openings. In this manner, the conductor 244_1 and the conductor 240_1 are formed (see FIG. 10C). Note that the top surface of the insulator 275_1 is partly removed by the CMP treatment in some cases.

Figure 11A:
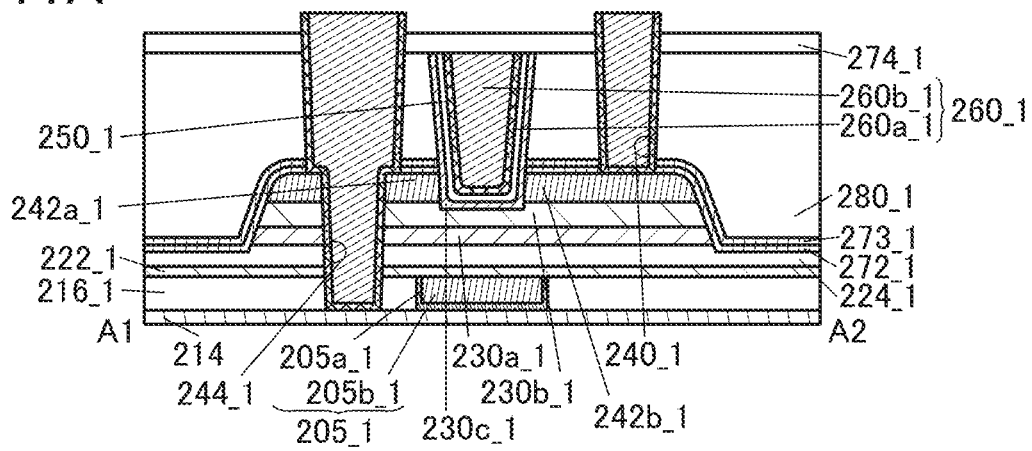
FIG. 11A and FIG. 11B are cross-sectional views illustrating the example of a method for manufacturing a semiconductor device.

Next, the insulator 275_1 is removed by etching, e.g., wet etching (see FIG. 11A). Accordingly, part of a side surface of the conductor 244_1 and part of the side surface of the conductor 240_1 are exposed. By performing wet etching as the method for removing the insulator 275_1, the etching selectivity of the insulator 275_1 and the insulator 274_1 can be improved and the insulator 274_1 can be inhibited from being etched when the insulator 275_1 is etched.

Figure 11B:
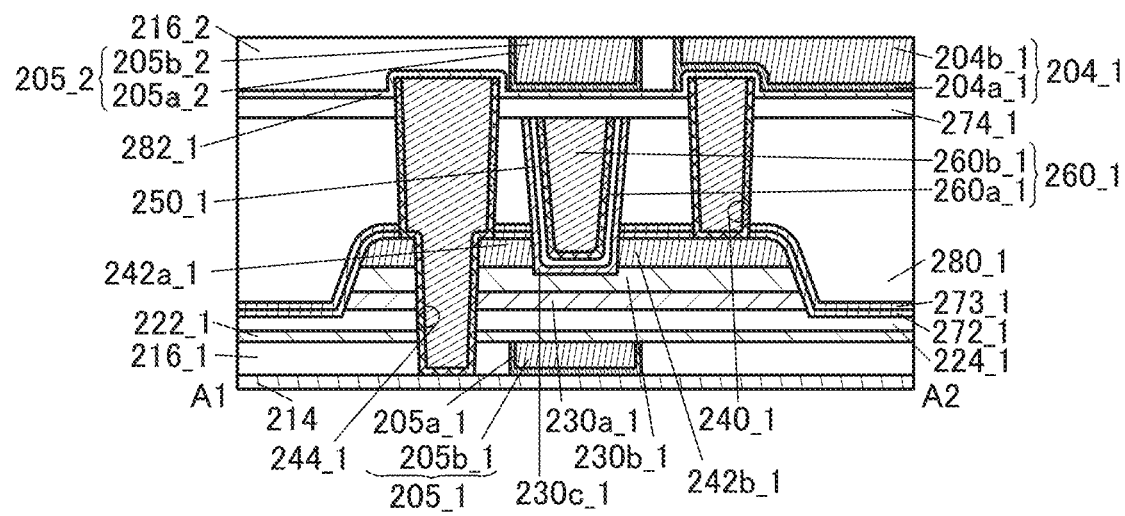

After that, the insulator 282_1, the conductor 204_1, and the conductor 205_2 are formed in a manner similar to that illustrated in FIG. 5B and FIG. 5C (see FIG. 11B).

Figure 10B:
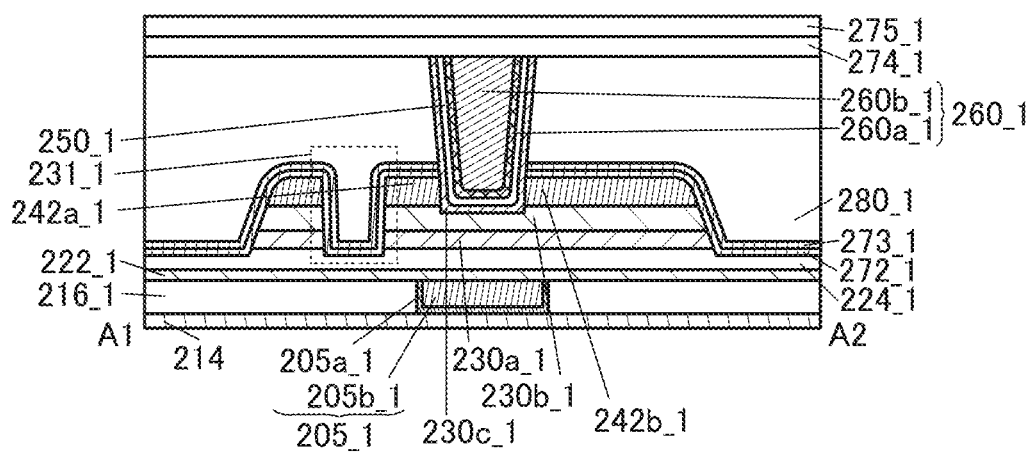
Figure 10C:
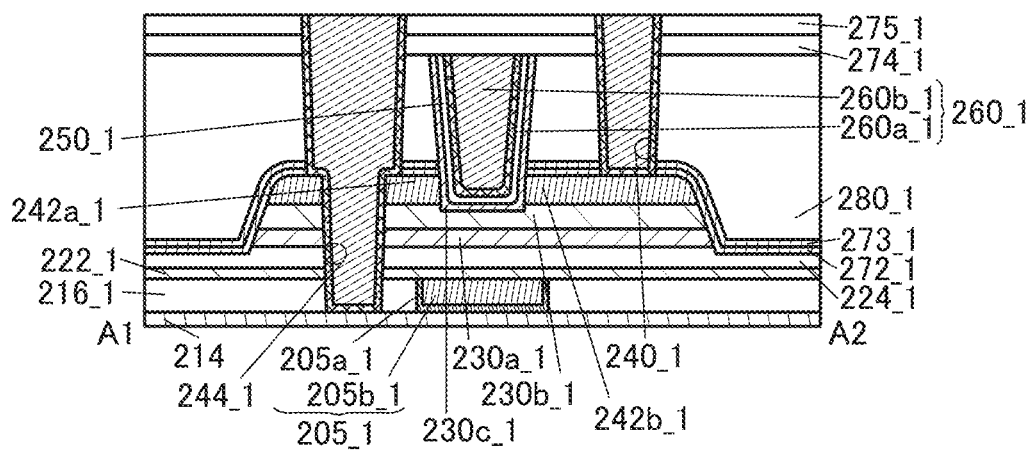
Figure 12A:
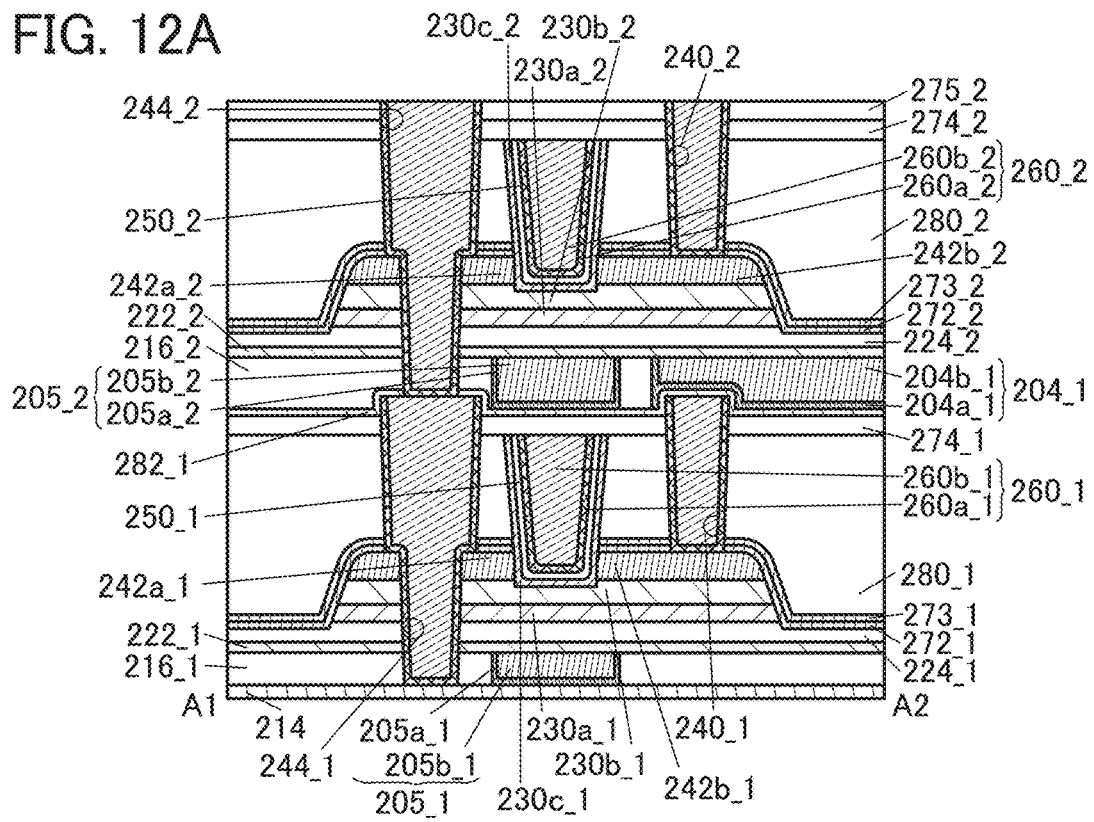
FIG. 12A and FIG. 12B are cross-sectional views illustrating the example of a method for manufacturing a semiconductor device.
Figure 12B:
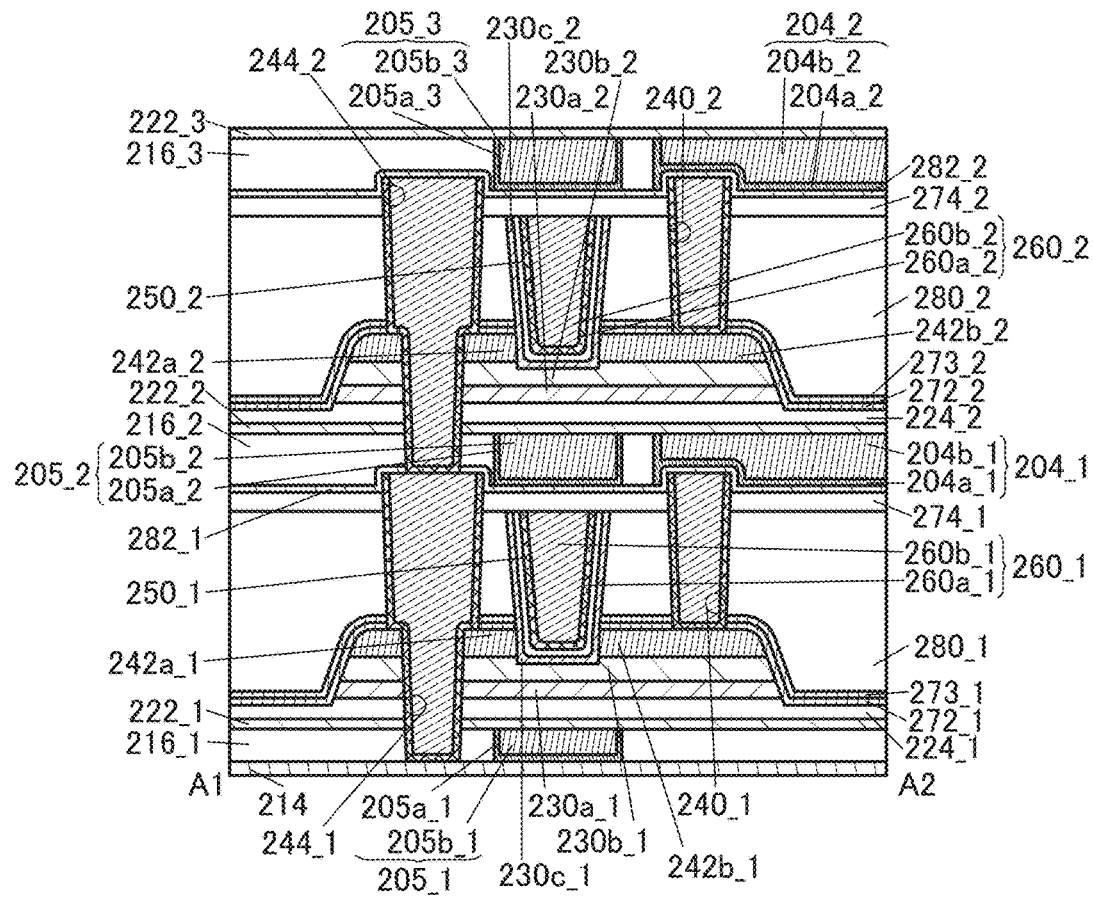

Next, the insulator 222_2, the insulator 224_2, the oxide 230a_2, the oxide 230b_2, the conductor 242a_2, the conductor 242b_2, the insulator 272_2, the insulator 273_2, the insulator 280_2, the oxide 230c_2, the insulator 250_2, the conductor 260_2, the insulator 274_2, the insulator 275_2, the conductor 244_2, and the conductor 240_2 are formed in a manner similar to that illustrated in FIG. 10A to FIG. 10C (see FIG. 12A). After that, the insulator 275_2 is removed, and the insulator 282_2, the insulator 216_3, the conductor 204_2, the conductor 205_3, and the insulator 222_3 are formed in a manner similar to that illustrated in FIG. 11A and FIG. 11B (see FIG. 12B).

Through the above process, the semiconductor device including the transistor 200 and the capacitor 100 illustrated in FIG. 8A, FIG. 8B, FIG. 9A, and FIG. 9B can be manufactured.

Structure Example 3 of Semiconductor Device

Figure 13A:
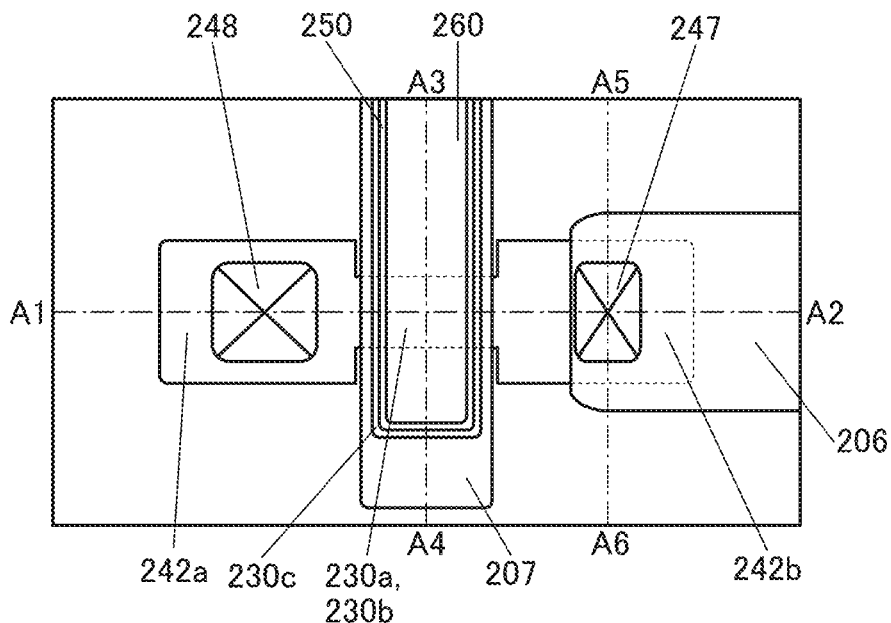
FIG. 13A is a top view illustrating a structure example of a semiconductor device.
Figure 13B:
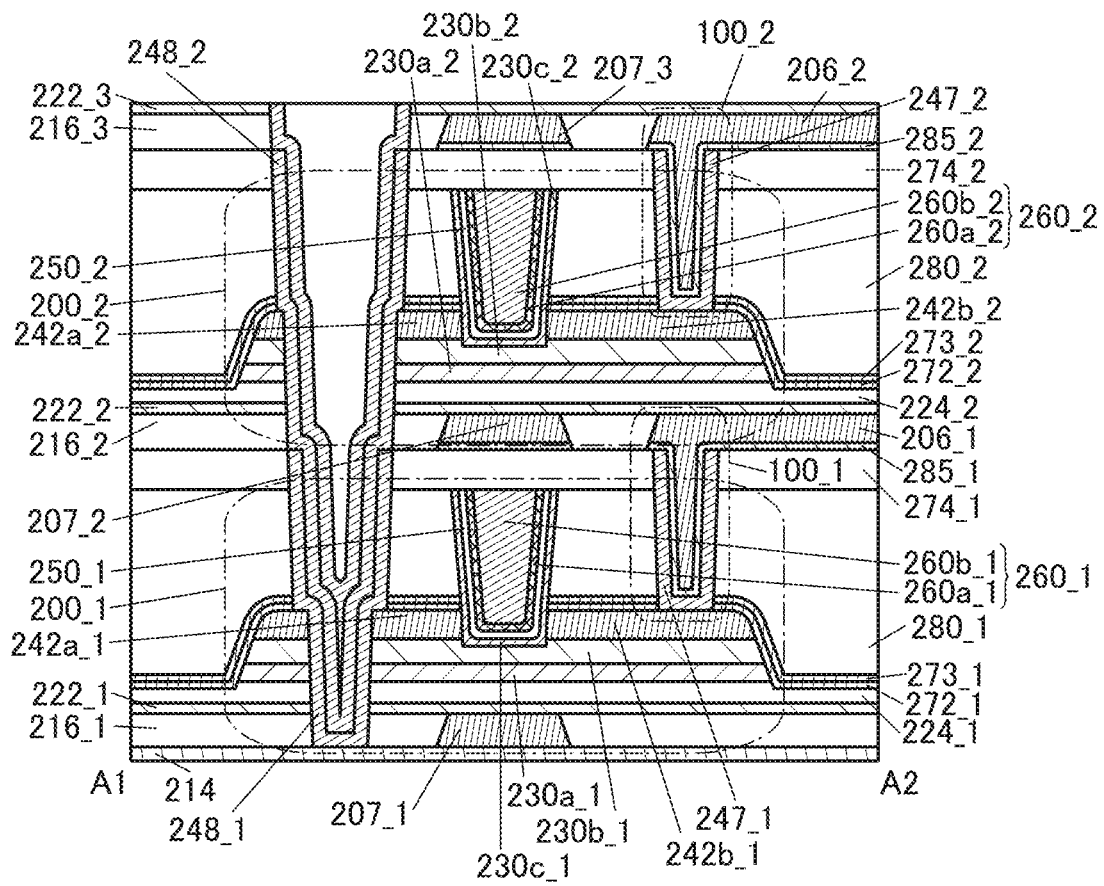
FIG. 13B is a cross-sectional view illustrating a structure example of the semiconductor device.
Figure 14A:
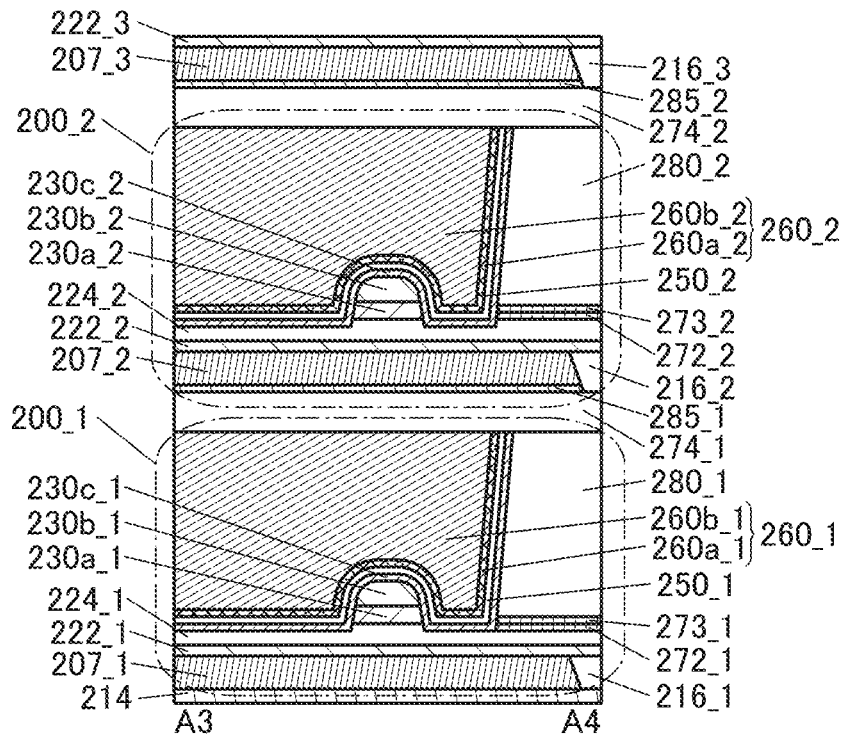
FIG. 14A and FIG. 14B are cross-sectional views illustrating the structure example of the semiconductor device.
Figure 14B:
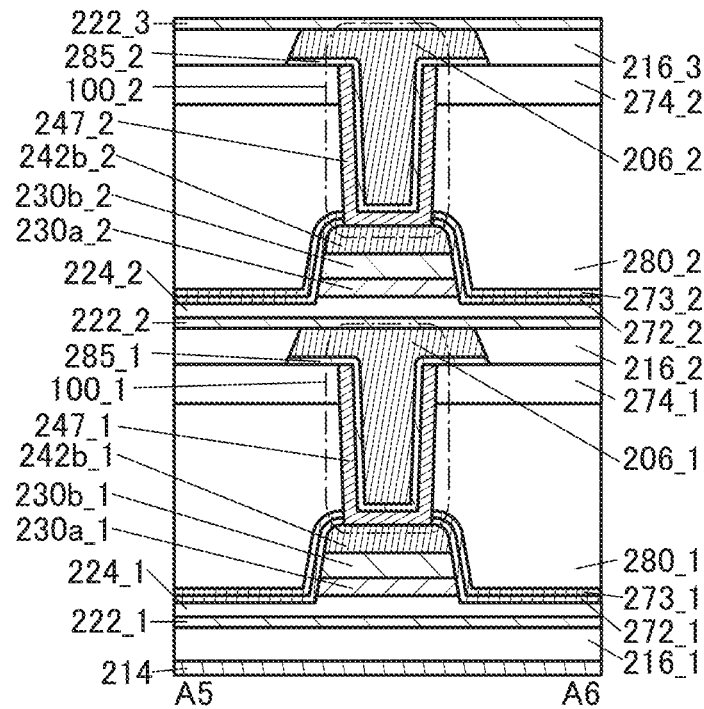

FIG. 13A is a top view illustrating a structure example of the semiconductor device including the transistor 200 and the capacitor 100. FIG. 13B, FIG. 14A, and FIG. 14B are cross-sectional views illustrating the structure example of the semiconductor device. Here, FIG. 13B is a cross-sectional view of a portion indicated by the dashed-dotted line A1-A2 in FIG. 13A, is a cross-sectional view of the transistor 200 in the channel length direction, and is a cross-sectional view of the capacitor 100 in the direction parallel to the channel length direction. FIG. 14A is a cross-sectional view of a portion indicated by the dashed-dotted line A3-A4 in FIG. 13A, and is a cross-sectional view of the transistor 200 in the channel width direction. FIG. 14B is a cross-sectional view of a portion indicated by the dashed-dotted line A5-A6 in FIG. 13A, and is a cross-sectional view of the capacitor 100 in the direction parallel to the channel width direction of the transistor 200.

Like the semiconductor device with the structure illustrated in FIG. 1A, FIG. 1B, FIG. 2A, and FIG. 2B, the semiconductor device with the structure in FIG. 13A, FIG. 13B, FIG. 14A, and FIG. 14B includes the insulator 214 over a substrate (not illustrated), the transistor 200_1 over the insulator 214, the insulator 280_1 over the transistor 200_1, and the insulator 274_1 over the insulator 280_1. The capacitor 100_1 and the transistor 200_2 are provided to include regions overlapping with the transistor 200_1. Furthermore, the insulator 280_2 over the transistor 200_2 and the insulator 274_2 over the insulator 280_2 are included. The capacitor 100_2 is provided to include a region overlapping with the transistor 200_2.

The transistor 200_1 with the structure illustrated in FIG. 13A, FIG. 13B, FIG. 14A, and FIG. 14B includes the insulator 216_1 over the insulator 214; a conductor 207_1 including a region in contact with the insulator 216_1; the insulator 222_1 over the insulator 216_1 and the insulator 207_1; the insulator 224_1 over the insulator 222_1; the oxide 230a_1 over the insulator 224_1; the oxide 230b_1 over the oxide 230a_1; the conductor 242a_1 and the conductor 242b_1 over the oxide 230b_1; the insulator 272_1 including a region in contact with a top surface of the insulator 224_1, a side surface of the oxide 230a_1, a side surface of the oxide 230b_1, and top surfaces and side surfaces of the conductor 242a_1 and the conductor 242b_1; the insulator 273_1 over the insulator 272_1; the oxide 230c_1 over the oxide 230b_1; the insulator 250_1 over the oxide 230c_1; and the conductor 260_1 (the conductor 260a_1 and the conductor 260b_1) positioned over the insulator 250_1 and including a region overlapping with the oxide 230c_1. Here, as in the transistor 200_1 with the structure illustrated in FIG. 1A, FIG. 1B, FIG. 2A, and FIG. 2B, the oxide 230c_1 includes a region in contact with side surfaces of the conductor 242a_1 and the conductor 242b_1, a side surface of the insulator 272_1, a side surface of the insulator 273_1, and a side surface of the insulator 280_1. The conductor 260a_1 is positioned to surround a bottom surface and a side surface of the conductor 260b_1. In addition, a top surface of the oxide 230c_1, a top surface of the insulator 250_1, and a top surface of the conductor 260_1 are positioned to be substantially aligned with a top surface of the insulator 280_1.

The capacitor 100_1 includes a conductor 247_1, an insulator 285_1 over the conductor 247_1 and the insulator 274_1, and a conductor 206_1 over the insulator 285_1.

An opening reaching the conductor 242b_1 is provided in the insulator 274_1, the insulator 280_1, the insulator 273_1, and the insulator 272_1; and the conductor 247_1, the insulator 285_1, and the conductor 206_1 are provided in the opening. Furthermore, an opening reaching the insulator 214 is provided in the insulator 274_1, the insulator 280_1, the insulator 273_1, the insulator 272_1, the conductor 242a_1, the oxide 230b_1, the oxide 230a_1, the insulator 224_1, the insulator 222_1, and the insulator 216_1; and a conductor 248_1 is provided in the opening. Here, the level of a top surface of the conductor 247_1, the level of a top surface of the conductor 248_1, and the level of a top surface of the insulator 274_1 can be the same.

The transistor 2002 with the structure illustrated in FIG. 13A, FIG. 13B, FIG. 14A, and FIG. 14B includes the insulator 216_2 over the insulator 274_1; a conductor 207_2 including a region in contact with the insulator 216_2; the insulator 222_2 over the insulator 216_2, the conductor 206_1, and the insulator 207_2; the insulator 224_2 over the insulator 222_2; the oxide 230a_2 over the insulator 224_2; the oxide 230b_2 over the oxide 230a_2; the conductor 242a_2 and the conductor 242b_2 over the oxide 230b_2; the insulator 272_2 including a region in contact with a top surface of the insulator 224_2, a side surface of the oxide 230a_2, a side surface of the oxide 230b_2, and top surfaces and side surfaces of the conductor 242a_2 and the conductor 242b_2; the insulator 273_2 over the insulator 272_2; the oxide 230c_2 over the oxide 230b_2; the insulator 250_2 over the oxide 230c_2; and the conductor 260_2 (the conductor 260a_2 and the conductor 260b_2) positioned over the insulator 250_2 and including a region overlapping with the oxide 230c_2. Here, as in the transistor 2002 with the structure illustrated in FIG. 1A, FIG. 1B, FIG. 2A, and FIG. 2B, the oxide 230c_2 includes a region in contact with side surfaces of the conductor 242a_2 and the conductor 242b_2, a side surface of the insulator 272_2, a side surface of the insulator 273_2, and a side surface of the insulator 280_2. The conductor 260a_2 is positioned to surround a bottom surface and a side surface of the conductor 260b_2. In addition, a top surface of the oxide 230c_2, a top surface of the insulator 250_2, and a top surface of the conductor 260_2 are positioned to be substantially aligned with a top surface of the insulator 280_2.

The capacitor 100_2 includes a conductor 247_2, an insulator 285_2 over the conductor 247_2 and the insulator 274_2, and a conductor 206_2 over the insulator 285_2.

An opening reaching the conductor 242b_2 is provided in the insulator 274_2, the insulator 280_2, the insulator 273_2, and the insulator 272_2; and the conductor 247_2, the insulator 285_2, and the conductor 206_2 are provided in the opening. Furthermore, an opening reaching the insulator 248_1 is provided in the insulator 274_2, the insulator 280_2, the insulator 273_2, the insulator 272_2, the conductor 242a_2, the oxide 230b_2, the oxide 230a_2, the insulator 224_2, the insulator 222_2, and the insulator 216_2; and a conductor 248_2 is provided in the opening. Thus, the conductor 242a_1 included in the transistor 200_1 and the conductor 242a_2 included in the transistor 200_2 are electrically connected to each other through the conductor 248_1 and the conductor 248_2. Note that the level of a top surface of the conductor 247_2, the level of a top surface of the conductor 248_2, and the level of a top surface of the insulator 274_2 can be the same.

For the insulator 285, a material similar to that for the insulator 282 can be used. For the conductor 207, a material similar to that for the conductor 205b can be used. For the conductor 206, a material similar to that for the conductor 204b can be used. For the conductor 247, a material similar to that for the conductor 240 can be used. For the conductor 248, a material similar to that for the conductor 244 can be used.

Note that although the conductor 207, the conductor 206, the conductor 247, and the conductor 248 have a single layer structure in FIG. 13B, FIG. 14A, and FIG. 14B, one embodiment of the present invention is not limited thereto. For example, at least one of the conductor 207, the conductor 206, the conductor 247, and the conductor 248 may have a stacked-layer structure of two layers or a stacked-layer structure of three or more layers.

Here, the conductor 248 has a function of a plug electrically connected to one of the source and the drain of the transistor 200, and the conductor 247 has a function of a plug electrically connected to the other of the source and the drain of the transistor 200. Thus, the conductor 247 can function as both a plug and one electrode of the capacitor 100.

The transistor 200_1 and the transistor 200_2 are provided to be stacked as illustrated in FIG. 13B and FIG. 14A. In addition, the capacitor 100_1 and the capacitor 100_2 are provided to be stacked as illustrated in FIG. 13B and FIG. 14B. In other words, in the semiconductor device with the structure illustrated in FIG. 13A, FIG. 13B, FIG. 14A, and FIG. 14B, two transistors 200 are provided to be stacked and two capacitors 100 are provided to be stacked as in the semiconductor device with the structure illustrated in FIG. 1A, FIG. 1B, FIG. 2A, and FIG. 2B. Note that three or more transistors 200 and three or more capacitors 100 may be provided to be stacked. In that case, as illustrated in FIG. 13B, FIG. 14A, and FIG. 14B, an insulator 207_3 is provided over the insulator 285_2 over the insulator 274_2, the insulator 216_3 is provided to include a region in contact with a side surface of the conductor 206_2 and a side surface of the conductor 207_2, and the insulator 222_3 is provided over the conductor 206_2, the conductor 207_3, and the insulator 216_3.

The conductor 206 included in the capacitor 100 is formed in the same layer as the conductor 207 included in the transistor 200. For example, the conductor 206_1 is formed in the same layer as the conductor 207_2. Thus, the conductor 206 and the conductor 207 can be formed in the same process, so that the manufacturing process of the semiconductor device with the structure illustrated in FIG. 13A, FIG. 13B, FIG. 14A, and FIG. 14B can be simplified like the semiconductor device with the structure illustrated in FIG. 1A, FIG. 1B, FIG. 2A, and FIG. 2B.

As described above, in the semiconductor device with the structure illustrated in FIG. 13A, FIG. 13B, FIG. 14A, and FIG. 14B, the conductor 247 functions as both a plug and the one electrode of the capacitor 100. When part of components is shared by the transistor 200 and the capacitor 100 as described above, the manufacturing process of the semiconductor device with the structure illustrated in FIG. 13A, FIG. 13B, FIG. 14A, and FIG. 14B can be simplified like the semiconductor device with the structure illustrated in FIG. 1A, FIG. 1B, FIG. 2A, and FIG. 2B.

In the semiconductor device with the structure illustrated in FIG. 13A, FIG. 13B, FIG. 14A, and FIG. 14B, as described above, the insulator 285 and the conductor 206 in addition to the conductor 247 are provided inside the opening provided in the insulator 274, the insulator 280, the insulator 273, and the insulator 272. Thus, the conductor 247 having a function of the one electrode of the capacitor 100 and the conductor 206 having a function of the other electrode of the capacitor 100 include a region overlapping with each other inside the opening with the insulator 285 having a function of a dielectric of the capacitor 100 therebetween. Accordingly, the area where the conductor 247 and the conductor 206 overlap with each other with the insulator 285 therebetween can be made larger than the area shown in the top view. In other words, the capacity of the capacitor 100 can be increased without increasing the area in the top view where the one electrode and the other electrode overlap with each other. In this manner, the capacitor 100 can be miniaturized and the storage capacity of the capacitor 100 can be increased.

Manufacturing Method Example 3 of
Semiconductor Device

Next, an example of a method for manufacturing the semiconductor device including the transistor 200 and the capacitor 100 illustrated in FIG. 13A, FIG. 13B, FIG. 14A, and FIG. 14B is described with reference to the drawings. The drawings are cross-sectional views corresponding to the portion indicated by the dashed-dotted line A1-A2 illustrated in FIG. 13A and correspond to the channel length direction of the transistor 200.

First, a substrate (not illustrated) is prepared, and the insulator 214 is deposited over the substrate. Then, the conductor 207_1 is formed over the insulator 214. After that, the insulator 216_1 is deposited over the insulator 214 and the conductor 207_1. Then, the deposited insulator 216_1 is subjected to CMP treatment to partly remove the insulator 216_1 so that a surface of the conductor 207_1 is exposed. Note that the surface of the conductor 207_1 is not necessarily exposed and the insulator 216_1 may cover the conductor 207_1. In that case, the insulator 216_1 can have a function of a gate insulator of the transistor 200_1.

Figure 15A:
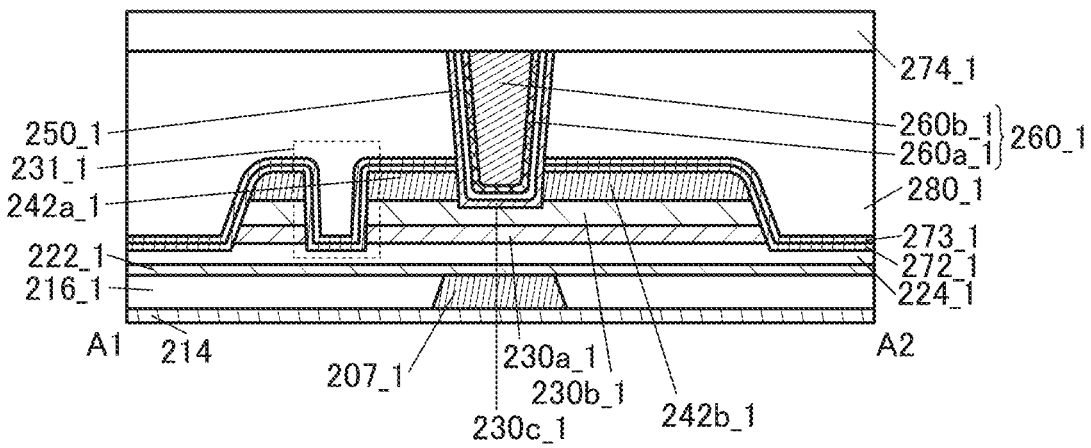
FIG. 15A to FIG. 15C are cross-sectional views illustrating an example of a method for manufacturing a semiconductor device.

Next, the insulator 222_1 is deposited over the conductor 207_1 and the insulator 216_1. Next, the insulator 224_1, the oxide 230a_1, the oxide 230b_1, the conductor 242a_1, the conductor 242b_1, the opening 231_1, the insulator 272_1, the insulator 273_1, the insulator 280_1, the oxide 230c_1, the insulator 250_1, the conductor 260_1, and the insulator 274_1 are formed in a manner similar to that illustrated in FIG. 3B to FIG. 3E, FIG. 4A, and FIG. 4B (see FIG. 15A).

Figure 4C:
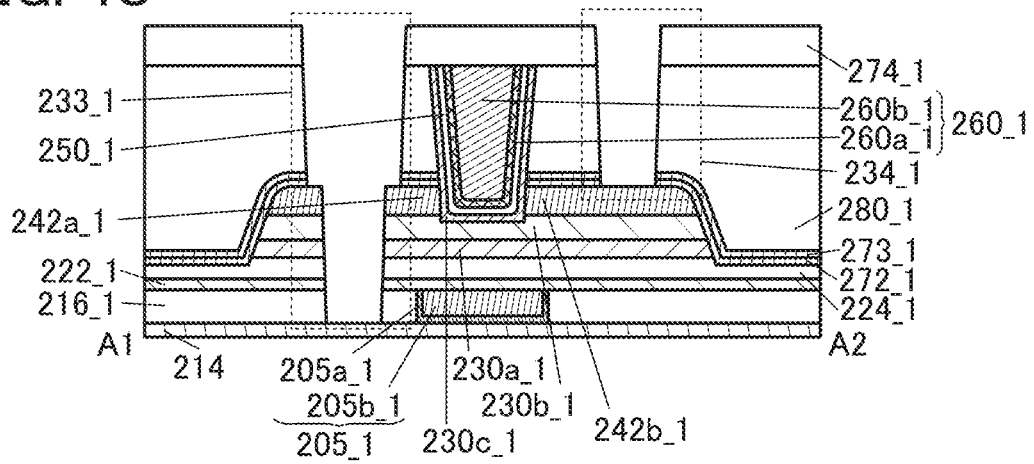
Figure 15B:
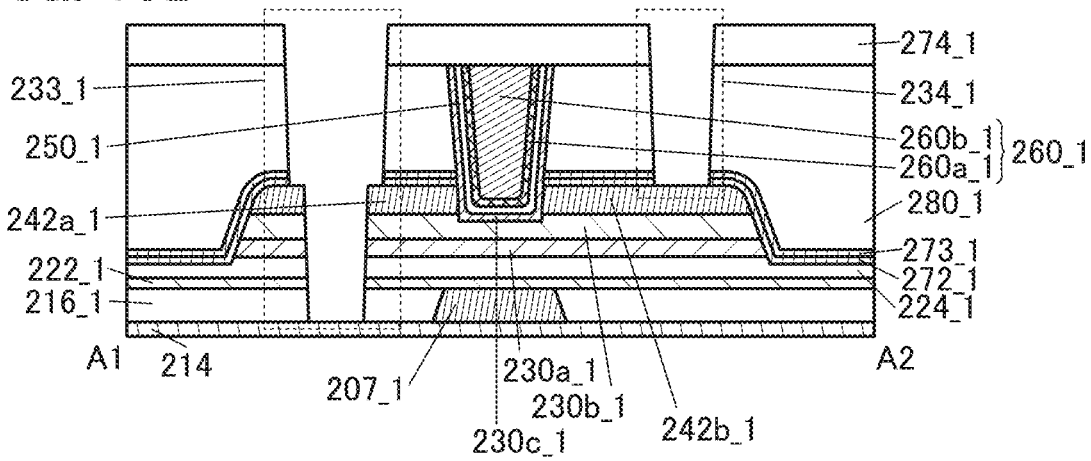
Figure 15C:
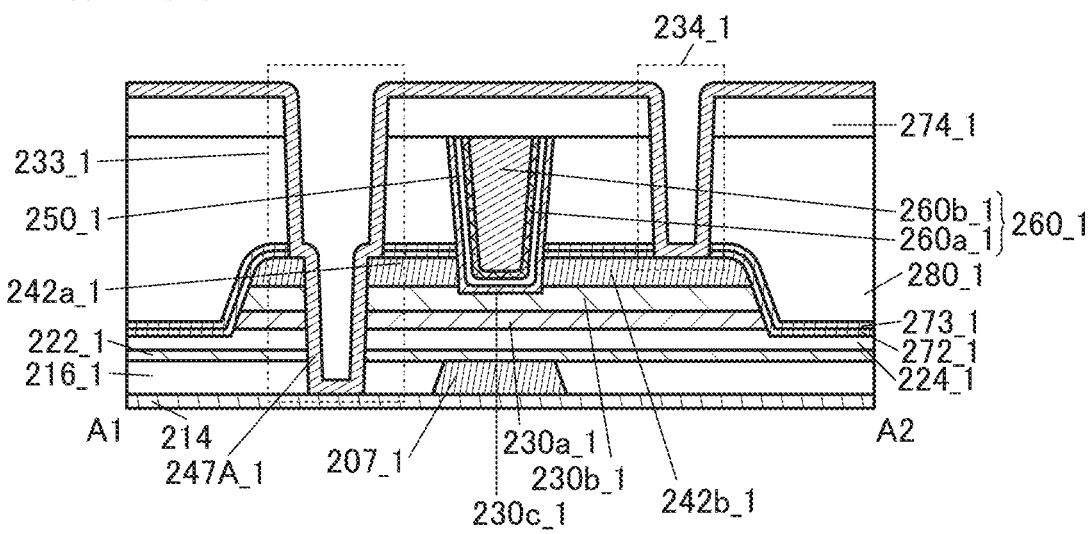

Next, the opening 233_1 and the opening 234_1 are formed in a manner similar to that in FIG. 4C (see FIG. 15B). Then, a conductive film 247A_1 is deposited by a sputtering method, a CVD method, an MBE method, a PLD method, an ALD method, or the like (see FIG. 15C).

Figure 16A:
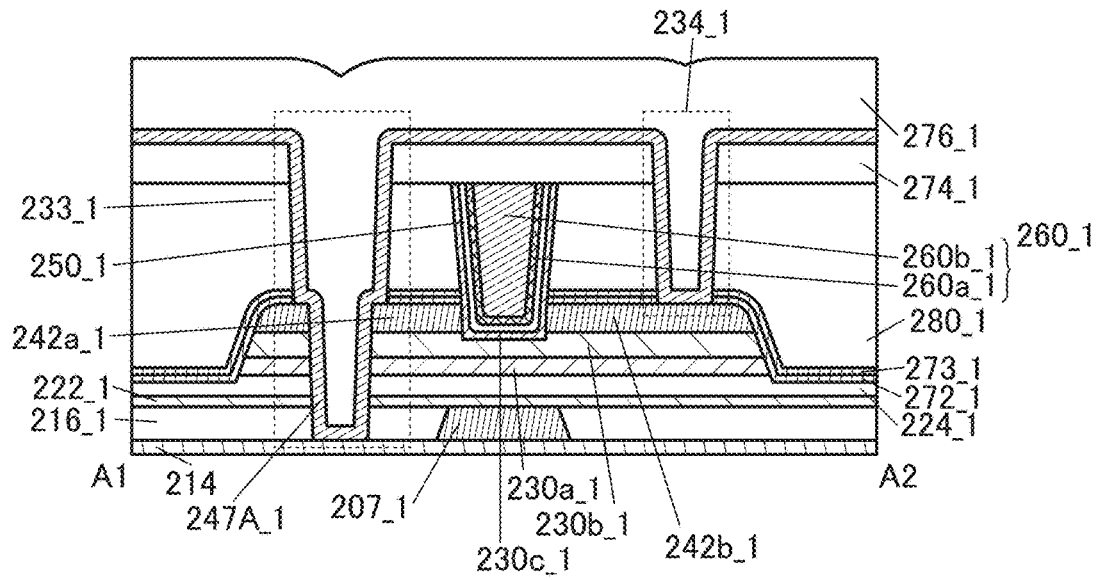
FIG. 16A to FIG. 16C are cross-sectional views illustrating the example of a method for manufacturing a semiconductor device.
Figure 16B:
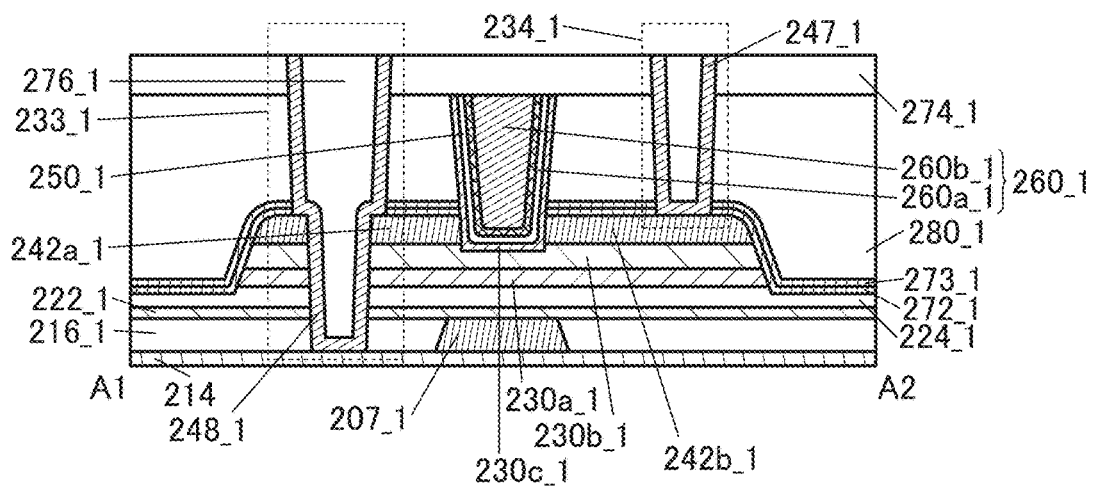

Next, an insulator 276_1 is deposited over the conductive film 247A_1 (see FIG. 16A). After that, part of the insulator 276_1 and the conductive film 247A_1 are removed by CMP treatment. Accordingly, the conductor 248_1 is formed inside the opening 233_1 and the conductor 247_1 is formed inside the opening 234_1. Furthermore, a surface of the insulator 274_1 is exposed. Note that the insulator 276_1 remains on the inner side of the conductor 248_1 in the opening 233_1. Furthermore, the insulator 276_1 remains on the inner side of the conductor 247_1 in the opening 234_1 (see FIG. 16B).

Figure 16C:
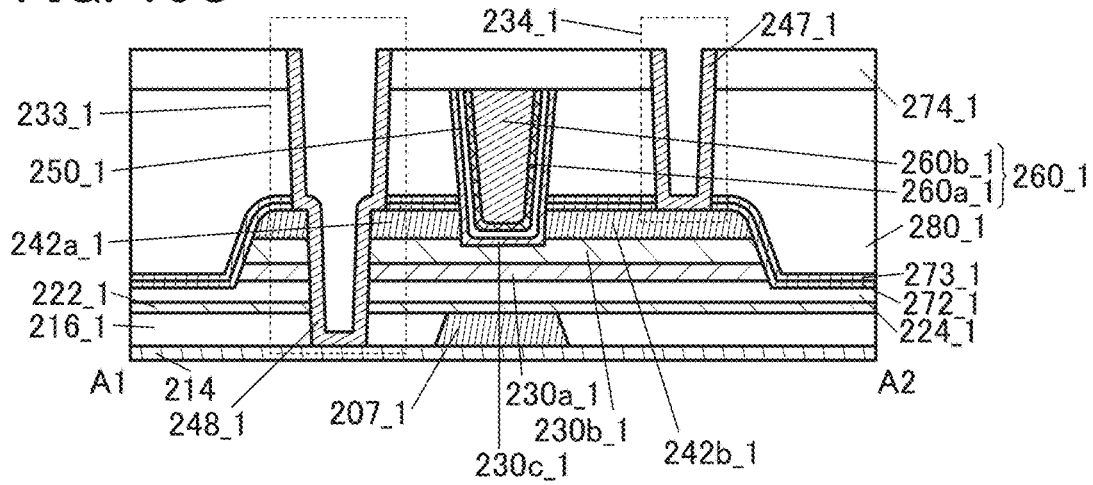

Next, the insulator 276_1 remaining inside the opening 233_1 and inside the opening 234_1 is removed by a dry etching method, a wet etching method, or the like. Accordingly, a surface of the conductor 248_1 and a surface of the conductor 247_1 are exposed (see FIG. 16C).

Figure 17A:
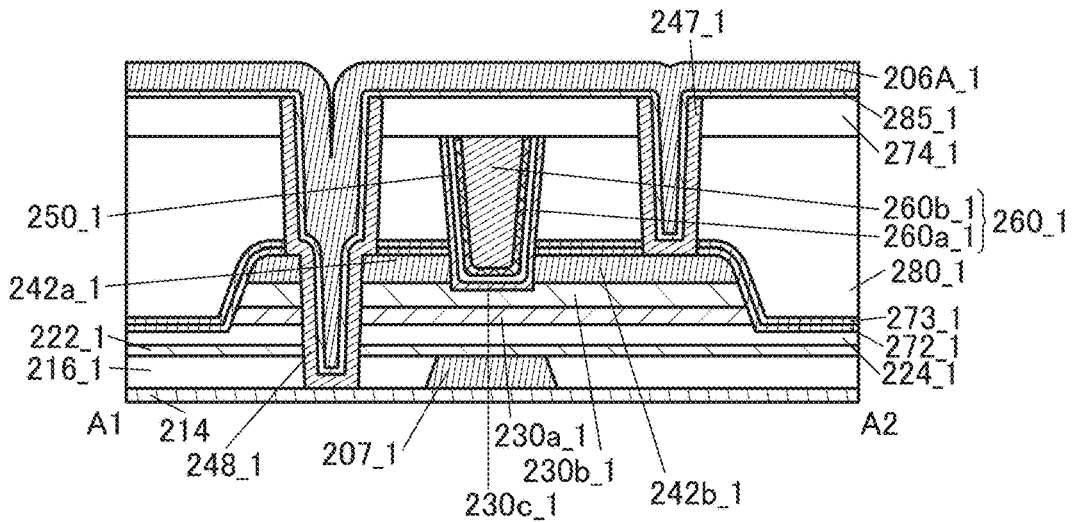
FIG. 17A to FIG. 17C are cross-sectional views illustrating the example of a method for manufacturing a semiconductor device.

Next, the insulator 285_1 is deposited over the conductor 247_1, the conductor 248_1, and the insulator 2741. Thus, the conductor 247_1 and the conductor 248_1 are covered with the insulator 285_1. After that, a conductive film 206A_1 is deposited over the insulator 285_1 (see FIG. 17A). The insulator 285_1 and the conductive film 206A_1 can be deposited by a sputtering method, a CVD method, an MBE method, a PLD method, an ALD method, or the like.

Figure 17B:
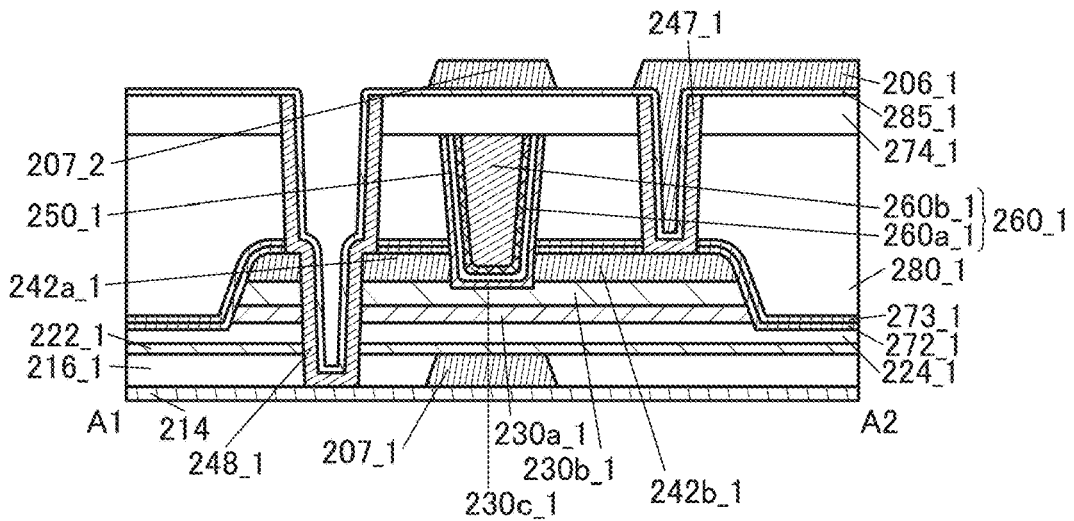

Next, the conductive film 206A_1 is processed by a lithography method or the like, so that the conductor 206_1 and the conductor 207_2 are formed (see FIG. 17B). After that, the insulator 285_1 is processed using the conductor 206_1 and the conductor 207_2 as hard masks. For the processing, a dry etching method or a wet etching method can be employed. As described above, a dry etching method is suitable for microfabrication.

Figure 17C:
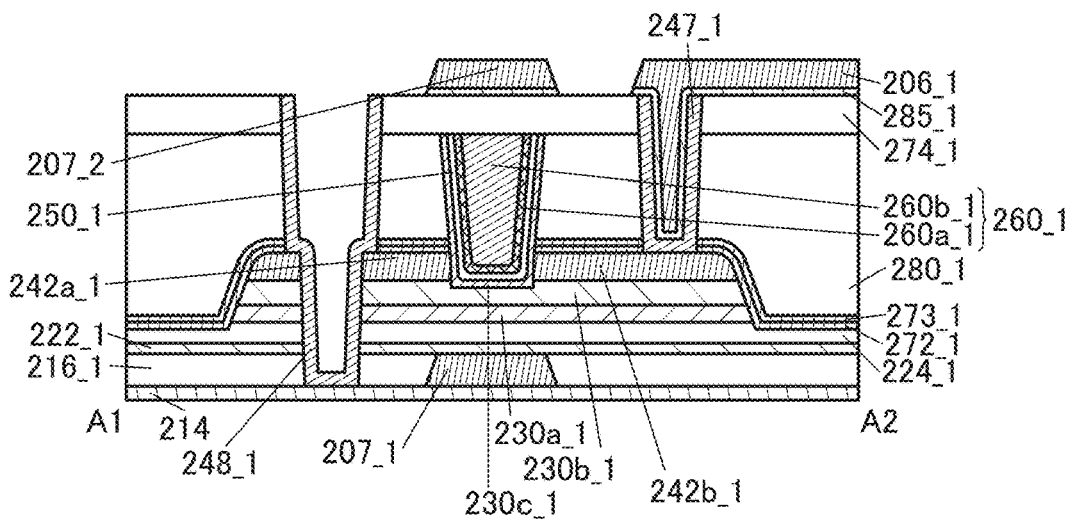

A surface of the conductor 248_1 can be exposed by processing the insulator 285_1 (see FIG. 17C). Note that the conductor 206_1 and the conductor 207_2 are not necessarily used as hard masks for the processing of the insulator 285_1. For example, after the insulator 285_1 is deposited, the deposited insulator may be processed, and then the conductive film 206A_1 may be deposited and processed to form the conductor 206_1 and the conductor 207_2. By processing the insulator 285_1 in this manner, a region where a bottom surface of the conductor 207_2 is in contact with the insulator 274_1 can be included, for example.

Next, the insulator 216_2 is deposited over the conductor 206_1, the conductor 207_2, the conductor 248_1, and the insulator 274_1. The insulator 216_2 can be deposited in a manner similar to that of the insulator 216_1.

Figure 18A:
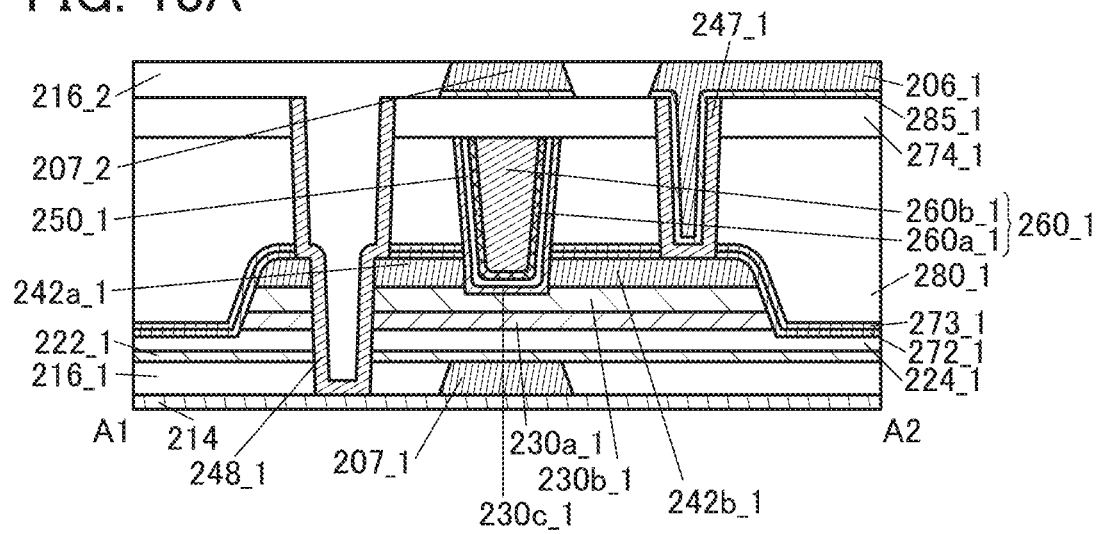
FIG. 18A and FIG. 18B are cross-sectional views illustrating the example of a method for manufacturing a semiconductor device.

Then, the insulator 216_2 is subjected to CMP treatment to partly remove the insulator 216_2 so that a surface of the conductor 206_1 and a surface of the conductor 207_2 are exposed (see FIG. 18A). Note that the surface of the conductor 206_1 and the surface of the conductor 207_2 are not necessarily exposed and the insulator 216_2 may cover the conductor 206_1 and the conductor 207_2. In that case, the insulator 216_2 can have a function of a gate insulator of the transistor 200_2.

As described above, in the fabrication of the semiconductor device with the structure illustrated in FIG. 13A, FIG. 13B, FIG. 14A, and FIG. 14B, the insulator 276 is formed inside the opening 233, the insulator 276 is removed, and then the insulator 216 is formed inside the opening 233. Thus, the insulator 276 is preferably formed using a material similar to that for the insulator 216.

In the method for manufacturing the semiconductor device with the structure illustrated in FIG. 13A, FIG. 13B, FIG. 14A, and FIG. 14B, the conductor 206 and the conductor 207 can be formed in the same process. Accordingly, the manufacturing process of the semiconductor device with the structure illustrated in FIG. 13A, FIG. 13B, FIG. 14A, and FIG. 14B can be simplified like the semiconductor device with the structure illustrated in FIG. 1A, FIG. 1B, FIG. 2A, and FIG. 2B.

Figure 18B:
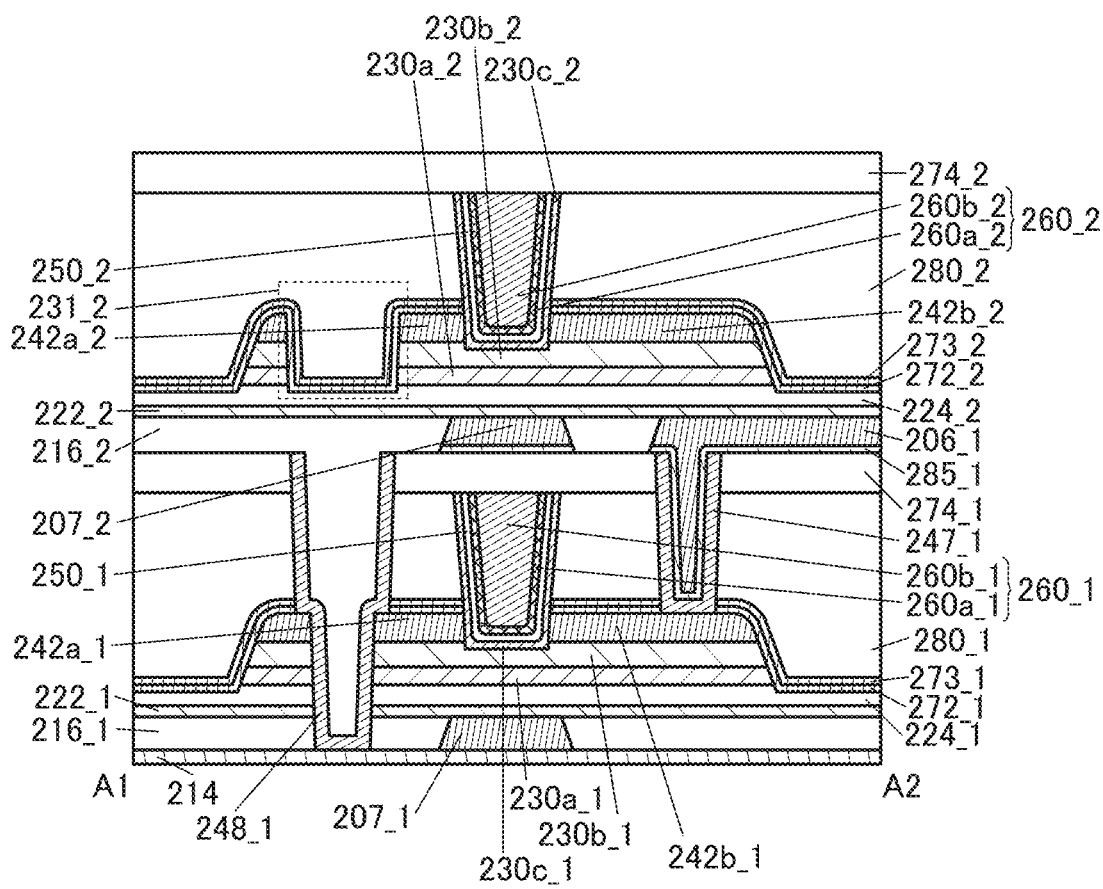

Next, the insulator 222_2, the insulator 224_2, the oxide 230a_2, the oxide 230b_2, the conductor 242a_2, the conductor 242b_2, the opening 231_2, the insulator 272_2, the insulator 273_2, the insulator 280_2, the oxide 230c_2, the insulator 250_2, and the conductor 260_2, and the insulator 274_2 are formed in a manner similar to that illustrated in FIG. 6A (see FIG. 18B).

Next, the opening 234_2 is formed in a manner similar to that illustrated in FIG. 4C. Furthermore, the opening 233_2 reaching the conductor 248_1 is formed in the insulator 274_2, the insulator 280_2, the insulator 273_2, the insulator 272_2, the insulator 224_2, the insulator 222_2, and the insulator 216_2 to include a region overlapping with the opening 231_2 (see FIG. 19A).

Next, the conductor 247_2 and the conductor 248_2 are formed in a manner similar to that of the conductor 247_1 and the conductor 248_1, the insulator 285_2 is formed in a manner similar to that of the insulator 285_1, the insulator 206_2 and the insulator 207_3 are formed in a manner similar to that of the insulator 206_1 and the insulator 207_2, the insulator 216_3 is formed in a manner similar to that of the insulator 216_2, and the insulator 222_3 is formed in a manner similar to that of the insulator 222_2 (see FIG. 19B).

Through the above process, the semiconductor device including the transistor 200 and the capacitor 100 illustrated in FIG. 13A, FIG. 13B, FIG. 14A, and FIG. 14B can be manufactured.

Structure Example 4 of Semiconductor Device

An example of a semiconductor device of one embodiment of the present invention including a transistor 200a, a transistor 200b, a capacitor 100a, and a capacitor 100b is described below.

Figure 20:
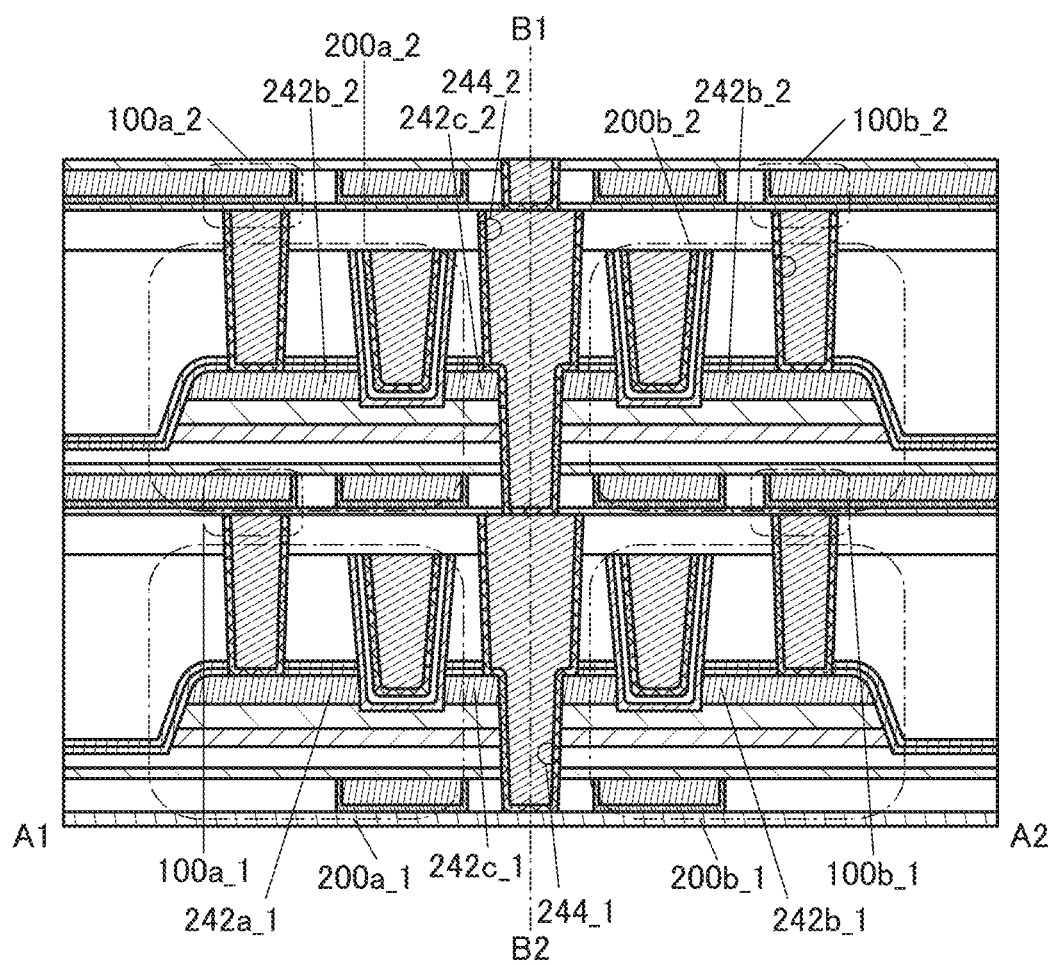
FIG. 20 is a cross-sectional view illustrating a structure example of a semiconductor device.

FIG. 20 is a cross-sectional view of the semiconductor device including the transistor 200a, the transistor 200b, the capacitor 100a, and the capacitor 100b in the channel length direction. As illustrated in FIG. 20, the semiconductor device has a line-symmetric structure with respect to a dashed-dotted line B1-B2. A conductor 242c functions as both one of a source electrode and a drain electrode of the transistor 200a and one of a source electrode and a drain electrode of the transistor 200b. Furthermore, the conductor 244 having a function of a plug is also used for both the transistor 200a and the transistor 200b. As described above, with the structure of the semiconductor device illustrated in FIG. 20, a semiconductor device that can be miniaturized or highly integrated can be provided.

For the structures and the effects of the transistor 200a, the transistor 200b, the capacitor 100a, and the capacitor 100b, the structure examples of the semiconductor device illustrated in FIG. 1A, FIG. 1B, FIG. 2A, FIG. 2B, FIG. 8A, FIG. 8B, FIG. 9A, FIG. 9B, FIG. 13A, FIG. 13B, FIG. 14A, and FIG. 14B can be referred to. Note that in FIG. 20, the transistor 200a, the transistor 200b, the capacitor 100a, and the capacitor 100b have the structure illustrated in FIG. 1B.

Structure Example 5 of Semiconductor Device

Figure 21:
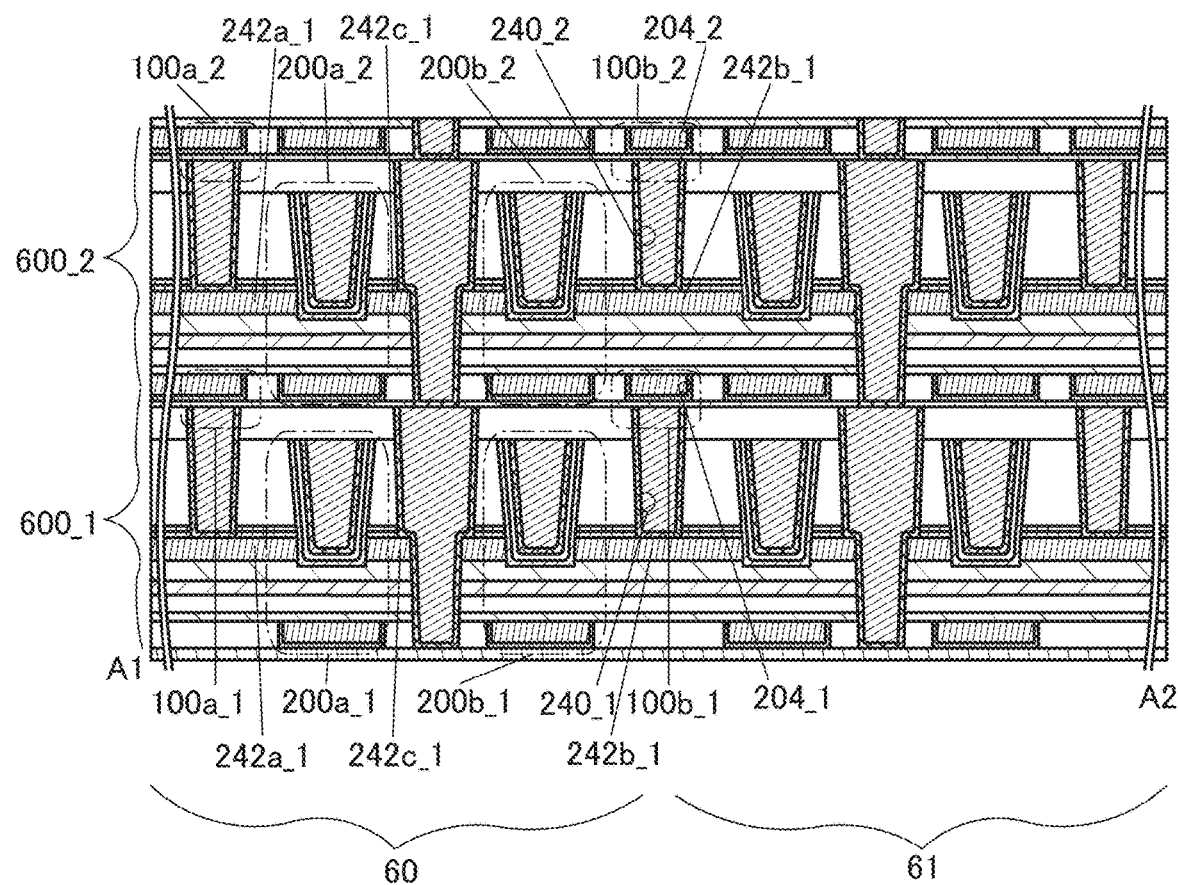
FIG. 21 is a cross-sectional view illustrating a structure example of a semiconductor device.

FIG. 21 is a diagram illustrating a structure example of the semiconductor device of one embodiment of the present invention. In the structure illustrated in FIG. 21, two semiconductor devices are connected to each other through a capacitor portion. In this specification and the like, a semiconductor device including the transistor 200a, the transistor 200b, the capacitor 100a, and the capacitor 100b is referred to as a cell. The above descriptions for the transistor 200a, the transistor 200b, the capacitor 100a, and the capacitor 100b can be referred to for the structures of the transistor 200a, the transistor 200b, the capacitor 100a, and the capacitor 100b.

FIG. 21 is a cross-sectional view of a structure in which a cell 60 including the transistor 200a, the transistor 200b, the capacitor 100a, and the capacitor 100b and a cell 61 having a structure similar to that of the cell 60 are electrically connected through the capacitor portion.

As illustrated in FIG. 21, the conductor 242b having a function of one of the source electrode and the drain electrode of the transistor 200b included in the cell 60 also has a function of one of a source electrode and a drain electrode of a transistor included in the cell 61. Furthermore, the conductor 240 having a function of one electrode of the capacitor 100b included in the cell 60 also has a function of one electrode of a capacitor included in the cell 61. In addition, the conductor 204 having a function of the other electrode of the capacitor 100b included in the cell 60 also has a function of the other electrode of the capacitor included in the cell 61.

Although not illustrated, the conductor 242a having a function of one of the source electrode and the drain electrode of the transistor 200a included in the cell 60 also has a function of one of a source electrode and a drain electrode of a transistor included in a semiconductor device on the left side of the cell 60, that is, a semiconductor device adjacent to the cell 60 in the A1 direction in FIG. 21. Furthermore, although not illustrated, the conductor 240 having a function of one electrode of the capacitor 100a included in the cell 60 also has a function of one electrode of a capacitor included in the adjacent semiconductor device on the left side of the cell 60. In addition, although not illustrated, the conductor 204 having a function of the other electrode of the capacitor 100a included in the cell 60 also has a function of the other electrode of the capacitor included in the adjacent semiconductor on the left side of the cell 60.

In addition, a similar structure can be used for a cell included in a semiconductor device on the right side of the cell 61, that is, a semiconductor device adjacent to the cell 61 in the A2 direction in FIG. 21. Thus, a cell array 600 in which a plurality of cells are arranged can be formed. Note that FIG. 21 illustrates a cell array 600_1 including a transistor 200a_1, a transistor 200b_1, a capacitor 100a_1, and a capacitor 100b_1, and a cell array 600_2 including a transistor 200a_2, a transistor 200b_2, a capacitor 100a_2, and a capacitor 100b_2.

When the cell array 600 has the structure illustrated in FIG. 21, the space between the adjacent cells can be reduced; thus, the projected area of the cell array 600 can be reduced. Thus, the semiconductor device of one embodiment of the present invention can be miniaturized or highly integrated.

Structure Example 6 of Semiconductor Device

Figure 22:
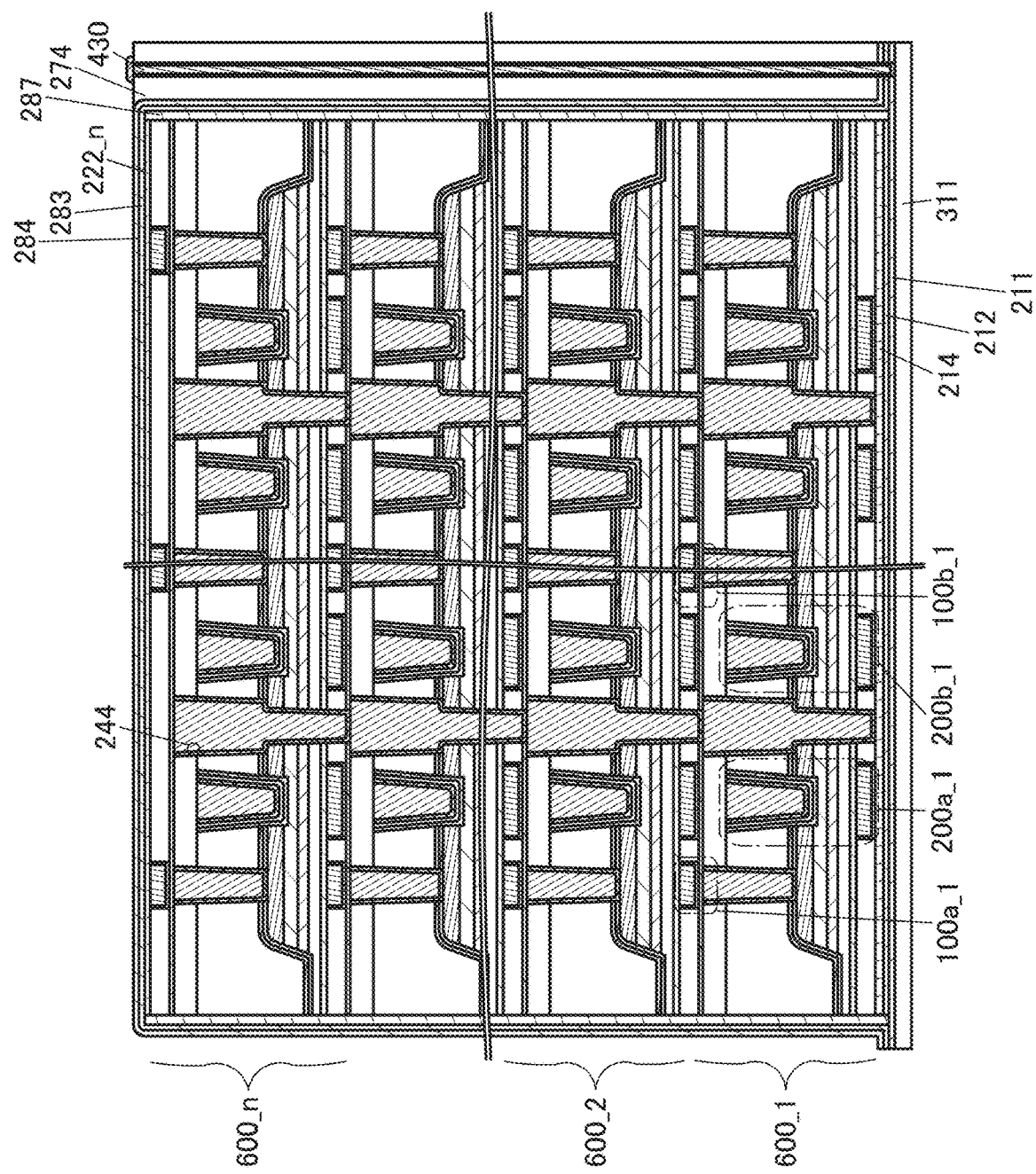
FIG. 22 is a cross-sectional view illustrating a structure example of a semiconductor device.

FIG. 22 is a cross-sectional view illustrating a structure example of a semiconductor device including the cell array 600 illustrated in FIG. 21. The semiconductor device illustrated in FIG. 22 includes a substrate 311, an insulator 211 over the substrate 311, an insulator 212 over the insulator 211, and the insulator 214 over the insulator 212, and a 3D cell array in which n cell arrays 600 are stacked is positioned over the insulator 214. That is, the cell array 600_1 to the cell array 600_n are positioned over the insulator 214. The stacked cell arrays 600 are electrically connected to each other through the conductors 244 having a function of plugs. The 3D cell array is sealed by the insulator 211, the insulator 212, the insulator 214, an insulator 287, an insulator 222_n, an insulator 283, and an insulator 284 (such a structure is referred to as a sealing structure below for convenience). The insulator 274 is provided in the periphery of the insulator 284. A conductor 430 is provided in the insulator 274, the insulator 284, the insulator 283, and the insulator 211, and is electrically connected to the substrate 311.

The insulator 211, the insulator 283, and the insulator 284 are suitably formed using a material having a high blocking property against hydrogen. The insulator 214, the insulator 222, and the insulator 287 are suitably formed using a material having a function of capturing or fixing hydrogen.

Examples of the material having a high blocking property against hydrogen include silicon nitride and silicon nitride oxide. Examples of the material having a function of capturing or fixing hydrogen include aluminum oxide, hafnium oxide, and an oxide containing aluminum and hafnium (hafnium aluminate).

Note that in this specification and the like, a barrier property means a function of inhibiting diffusion of a targeted substance (or low permeability). Alternatively, a barrier property means a function of trapping and fixing (or gettering) a targeted substance.

Materials used for the insulator 211, the insulator 212, the insulator 214, the insulator 287, the insulator 222, the insulator 283, and the insulator 284 can have an amorphous or crystalline structure, although the crystal structure of the materials is not limited thereto. For example, an amorphous aluminum oxide film is suitably used for the material having a function of capturing or fixing hydrogen. Amorphous aluminum oxide may capture or fix hydrogen more than aluminum oxide with high crystallinity.

With the above structure, the hydrogen concentration in an oxide semiconductor included in an OS transistor provided in the cell array 600 can be reduced. Accordingly, a semiconductor device with high reliability can be provided. According to one embodiment of the present invention, a semiconductor device with favorable electrical characteristics can be provided.

<Constituent Material of Semiconductor Device>

Constituent materials that can be used for the semiconductor device are described below.

[Substrate]

As a substrate where the transistor 200 is formed, an insulator substrate, a semiconductor substrate, or a conductor substrate is used, for example. Examples of the insulator substrate include a glass substrate, a quartz substrate, a sapphire substrate, a stabilized zirconia substrate (an yttria-stabilized zirconia substrate or the like), and a resin substrate. Examples of the semiconductor substrate include a semiconductor substrate of silicon, germanium, or the like and a compound semiconductor substrate of silicon carbide, silicon germanium, gallium arsenide, indium phosphide, zinc oxide, or gallium oxide. Another example is a semiconductor substrate in which an insulator region is included in the semiconductor substrate, e.g., an SOI (Silicon On Insulator) substrate. Examples of the conductor substrate include a graphite substrate, a metal substrate, an alloy substrate, and a conductive resin substrate. Other examples include a substrate including a metal nitride and a substrate including a metal oxide. Other examples include an insulator substrate provided with a conductor or a semiconductor, a semiconductor substrate provided with a conductor or an insulator, and a conductor substrate provided with a semiconductor or an insulator. Alternatively, these substrates provided with elements may be used. Examples of the element provided for the substrate include a capacitor, a resistor, a switching element, a light-emitting element, and a memory element.

[Insulator]

Examples of an insulator include an insulating oxide, an insulating nitride, an insulating oxynitride, an insulating nitride oxide, an insulating metal oxide, an insulating metal oxynitride, and an insulating metal nitride oxide.

As miniaturization and high integration of transistors progress, for example, a problem such as leakage current may arise because of a thinner gate insulator. When a high-k material is used for the insulator functioning as a gate insulator, the voltage during operation of the transistor can be lowered while the physical thickness of the gate insulator is maintained. In contrast, when a material with a low dielectric constant is used for the insulator functioning as an interlayer film, the parasitic capacitance generated between wirings can be reduced. Thus, a material is preferably selected depending on the function of an insulator.

Examples of the insulator having a high dielectric constant include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium.

Examples of the insulator with a low dielectric constant include silicon oxide, silicon oxynitride, silicon nitride oxide, silicon oxide to which fluorine is added, silicon oxide to which carbon is added, silicon oxide to which carbon and nitrogen are added, porous silicon oxide, and a resin.

When a transistor using an oxide semiconductor is surrounded by an insulator having a function of inhibiting transmission of oxygen and impurities such as hydrogen, the electrical characteristics of the transistor can be stable. As the insulator having a function of inhibiting transmission of oxygen and impurities such as hydrogen, a single layer or stacked layers of an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum is used. Specifically, as the insulator having a function of inhibiting transmission of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide or a metal nitride such as aluminum nitride, aluminum titanium nitride, titanium nitride, silicon nitride oxide, or silicon nitride can be used.

The insulator functioning as the gate insulator is preferably an insulator including a region containing oxygen released by heating. For example, when a structure is employed in which silicon oxide or silicon oxynitride including a region containing oxygen released by heating is in contact with the oxide 230, oxygen vacancies included in the oxide 230 can be filled.

[Conductor]

For a conductor, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal elements; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that hold their conductivity even after absorbing oxygen. A semiconductor having high electrical conductivity, typified by polycrystalline silicon containing an impurity element such as phosphorus, or silicide such as nickel silicide may be used.

A stack including a plurality of conductive layers formed of the above materials may be used. For example, a stacked-layer structure combining a material containing the above metal element and a conductive material containing oxygen may be employed. A stacked-layer structure combining a material containing the above metal element and a conductive material containing nitrogen may be employed. A stacked-layer structure combining a material containing the above metal element, a conductive material containing oxygen, and a conductive material containing nitrogen may be employed.

Note that when an oxide is used for the channel formation region of the transistor, a stacked-layer structure combining a material containing the above metal element and a conductive material containing oxygen is preferably used for the conductor functioning as the gate electrode. In this case, the conductive material containing oxygen is preferably provided on the channel formation region side. When the conductive material containing oxygen is provided on the channel formation region side, oxygen released from the conductive material is easily supplied to the channel formation region.

It is particularly preferable to use, for the conductor functioning as the gate electrode, a conductive material containing oxygen and a metal element contained in a metal oxide where the channel is formed. A conductive material containing any of the above metal elements and nitrogen may be used. For example, a conductive material containing nitrogen, such as titanium nitride or tantalum nitride, may be used. Indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon is added may be used. Indium gallium zinc oxide containing nitrogen may also be used. With the use of such a material, hydrogen contained in the metal oxide where the channel is formed can be captured in some cases. Alternatively, hydrogen entering from a surrounding insulator or the like can be captured in some cases.

[Metal Oxide]

A metal oxide functioning as an oxide semiconductor is preferably used as the oxide 230 (the oxide 230a, the oxide 230b, and the oxide 230c). A metal oxide that can be used as the oxide 230 according to the present invention is described below.

The metal oxide preferably contains at least indium or zinc. In particular, indium and zinc are preferably contained. Furthermore, aluminum, gallium, yttrium, tin, or the like is preferably contained in addition to them. Furthermore, one or more kinds selected from boron, titanium, iron, nickel, germanium, zirconium, molybdenum, lanthanum, cerium, neodymium, hafnium, tantalum, tungsten, magnesium, and the like may be contained.

Here, the case where the metal oxide is an In-M-Zn oxide containing indium, an element M, and zinc is considered. Note that the element M is aluminum, gallium, yttrium, tin, or the like. Examples of other elements that can be used as the element M include boron, titanium, iron, nickel, germanium, zirconium, molybdenum, lanthanum, cerium, neodymium, hafnium, tantalum, tungsten, and magnesium. Note that it is sometimes acceptable to use a plurality of the above-described elements in combination as the element M.

Note that in this specification and the like, a metal oxide containing nitrogen is also collectively referred to as a metal oxide in some cases. A metal oxide containing nitrogen may be referred to as a metal oxynitride.

A CAC-OS (Cloud-Aligned Composite Oxide Semiconductor) and a CAAC-OS, which are metal oxides that can be used in the OS transistor, are described.

<Composition of Metal Oxide>

A CAC-OS has a conducting function in part of the material and has an insulating function in another part of the material; as a whole, the CAC-OS has a function of a semiconductor. In the case where the CAC-OS or the CAC-metal oxide is used in an active layer of a transistor, the conducting function is a function of allowing electrons (or holes) serving as carriers to flow, and the insulating function is a function of not allowing electrons serving as carriers to flow. By the complementary action of the conducting function and the insulating function, a switching function (On/Off function) can be given to the CAC-OS or the CAC-metal oxide. In the CAC-OS or the CAC-metal oxide, separation of the functions can maximize each function.

The CAC-OS or the CAC-metal oxide includes conductive regions and insulating regions. The conductive regions have the above-described conducting function, and the insulating regions have the above-described insulating function. Furthermore, in some cases, the conductive regions and the insulating regions in the material are separated at the nanoparticle level. Furthermore, in some cases, the conductive regions and the insulating regions are unevenly distributed in the material. Furthermore, in some cases, the conductive regions are observed to be coupled in a cloud-like manner with their boundaries blurred.

In the CAC-OS or the CAC-metal oxide, the conductive regions and the insulating regions each have a size greater than or equal to 0.5 nm and less than or equal to 10 nm, preferably greater than or equal to 0.5 nm and less than or equal to 3 nm and are dispersed in the material in some cases.

The CAC-OS or the CAC-metal oxide includes components having different band gaps. For example, the CAC-OS or the CAC-metal oxide includes a component having a wide gap due to the insulating region and a component having a narrow gap due to the conductive region. In the case of the structure, when carriers flow, carriers mainly flow in the component having a narrow gap. Furthermore, the component having a narrow gap complements the component having a wide gap, and carriers also flow in the component having a wide gap in conjunction with the component having a narrow gap. Therefore, in the case where the above-described CAC-OS or CAC-metal oxide is used in a channel formation region of a transistor, high current drive capability in the on state of the transistor, that is, a high on-state current and high field-effect mobility can be obtained.

In other words, the CAC-OS or the CAC-metal oxide can also be referred to as a matrix composite or a metal matrix composite.

[Structure of Metal Oxide]

Oxide semiconductors can be classified into a single crystal oxide semiconductor and a non-single-crystal oxide semiconductor. Examples of the non-single-crystal oxide semiconductors include a CAAC-OS, a polycrystalline oxide semiconductor, an nc-OS (nanocrystalline oxide semiconductor), an amorphous-like oxide semiconductor (a-like OS), and an amorphous oxide semiconductor.

Oxide semiconductors might be classified in a manner different from the above-described one when classified in terms of the crystal structure. Here, the classification of the crystal structures of an oxide semiconductor is described with reference to FIG. 23A. FIG. 23A is a diagram showing the classification of crystal structures of an oxide semiconductor, typically IGZO (a metal oxide containing In, Ga, and Zn).

As shown in FIG. 23A, IGZO is roughly classified into Amorphous, Crystalline, and Crystal. Amorphous includes completely amorphous. Crystalline includes CAAC (c-axis aligned crystalline), nc (nanocrystalline), and CAC (Cloud-Aligned Composite). Note that single crystal, poly crystal, and completely amorphous are excluded from the category of "Crystalline". Crystal includes single crystal and poly crystal.

Note that the structures in the thick frame in FIG. 23A are in an intermediate state between Amorphous and Crystal, and belong to a new crystalline phase. This structure is positioned in a boundary region between Amorphous and Crystal. In other words, these structures are completely different from Amorphous, which is energetically unstable, and Crystal.

A crystal structure of a film or a substrate can be analyzed with X-ray diffraction (XRD) images. Here, XRD spectra of quartz glass and IGZO, which has a crystal structure classified into Crystalline (also referred to as Crystalline IGZO), are shown in FIG. 23B and FIG. 23C. FIG. 23B shows an XRD spectrum of quartz glass and FIG. 23C shows an XRD spectrum of Crystalline IGZO. Note that the Crystalline IGZO shown in FIG. 23C has a composition in vicinity of In:Ga:Zn=4:2:3 [atomic ratio]. Furthermore, the Crystalline IGZO shown in FIG. 23C has a thickness of 500 nm.

As indicated by arrows in FIG. 23B, the XRD spectrum of the quartz glass shows a peak with a substantially bilaterally symmetrical shape. In contrast, as indicated by arrows in FIG. 23C, the XRD spectrum of the Crystalline IGZO shows a peak with an asymmetrical shape. The asymmetrical peak of the XRD spectrum clearly shows the existence of crystal. In other words, the structure cannot be regarded as Amorphous unless it has a bilaterally symmetrical peak in the XRD spectrum. Note that in FIG. 23C, a crystal phase (IGZO crystal phase) is explicitly denoted at 2θ of 31° or in the vicinity thereof. The asymmetrical peak of the XRD spectrum probably results from the crystal phase (microcrystal).

Specifically, in the XRD spectrum of the Crystalline IGZO shown in FIG. 23C, the peak is at 2θ of 34° or in the vicinity thereof. Furthermore, the peak of the microcrystal is at 2θ of 31° or in the vicinity thereof. In the case of evaluating an oxide semiconductor film with an X-ray diffraction pattern, as shown in FIG. 23C, the spectral width on the low angle side of the peak at 2θ of 34° or in the vicinity thereof is wider. This indicates that the oxide semiconductor film includes a microcrystal having the peak at 2θ of 31° or in the vicinity thereof.

A crystal structure of a film can be evaluated with a diffraction pattern obtained by a nanobeam electron diffraction method (NBED) (such a pattern is also referred to as a nanobeam electron diffraction pattern). FIG. 23D shows a diffraction pattern of an IGZO film formed with the substrate temperature set at room temperature. Note that the IGZO film of FIG. 23D is formed by a sputtering method using an oxide target with In:Ga:Zn=1:1:1 [atomic ratio]. In the nanobeam electron diffraction method, electron diffraction is performed with a probe diameter of 1 nm.

As shown in FIG. 23D, not a halo pattern but a spot-like pattern is observed in the diffraction pattern of the IGZO film formed at room temperature. Thus, it is presumed that the IGZO film formed at room temperature is in an intermediate state, which is neither a crystal state nor an amorphous state, and it cannot be concluded that the IGZO film is in an amorphous state.

The CAAC-OS has c-axis alignment, a plurality of nanocrystals are connected in the a-b plane direction, and its crystal structure has distortion. Note that the distortion refers to a portion where the direction of a lattice arrangement changes between a region with a regular lattice arrangement and another region with a regular lattice arrangement in a region where the plurality of nanocrystals are connected.

The nanocrystal is basically a hexagon but is not always a regular hexagon and is a non-regular hexagon in some cases. Furthermore, a pentagonal or heptagonal lattice arrangement, for example, is included in the distortion in some cases. Note that a clear crystal grain boundary (also referred to as grain boundary) cannot be observed even in the vicinity of distortion in the CAAC-OS. That is, formation of a crystal grain boundary is inhibited by the distortion of lattice arrangement. This is probably because the CAAC-OS can tolerate distortion owing to a low density of arrangement of oxygen atoms in the a-b plane direction, an interatomic bond length changed by substitution of a metal element, and the like.

A crystal structure in which a clear crystal grain boundary (grain boundary) is observed is what is called a polycrystal. It is highly probable that the crystal grain boundary becomes a recombination center and traps carriers and thus decreases the on-state current or field-effect mobility of a transistor. Thus, the CAAC-OS in which no clear crystal grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a crystal grain boundary as compared with an In oxide.

The CAAC-OS tends to have a layered crystal structure (also referred to as a layered structure) in which a layer containing indium and oxygen (hereinafter, In layer) and a layer containing the element M, zinc, and oxygen (hereinafter, (M,Zn) layer) are stacked. Note that indium and the element M can be replaced with each other, and when the element M in the (M,Zn) layer is replaced with indium, the layer can also be referred to as an (In,M,Zn) layer. Furthermore, when indium in the In layer is replaced with the element M, the layer can be referred to as an (In,M) layer.

The CAAC-OS is an oxide semiconductor with high crystallinity. Meanwhile, in the CAAC-OS, a reduction in electron mobility due to a crystal grain boundary is less likely to occur because a clear crystal grain boundary cannot be observed. Moreover, since the crystallinity of an oxide semiconductor might be decreased by entry of impurities, formation of defects, or the like, the CAAC-OS can be regarded as an oxide semiconductor that has small amounts of impurities and defects (e.g., oxygen vacancies). Thus, an oxide semiconductor including the CAAC-OS is physically stable. Therefore, the oxide semiconductor including the CAAC-OS is resistant to heat and has high reliability. In addition, the CAAC-OS is stable with respect to high temperature in the manufacturing process (what is called thermal budget). Accordingly, the use of the CAAC-OS for the OS transistor can extend the degree of freedom of the manufacturing process.

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor by some analysis methods.

The a-like OS is an oxide semiconductor having a structure between those of the nc-OS and the amorphous oxide semiconductor. The a-like OS contains a void or a low-density region. That is, the a-like OS has low crystallinity as compared with the nc-OS and the CAAC-OS.

An oxide semiconductor has various structures with different properties. Two or more of the amorphous oxide semiconductor, the polycrystalline oxide semiconductor, the a-like OS, the nc-OS, and the CAAC-OS may be included in an oxide semiconductor of one embodiment of the present invention.

[Transistor Including Oxide Semiconductor]

Next, the case where the above oxide semiconductor is used for a transistor is described.

When the above oxide semiconductor is used for a transistor, a transistor with high field-effect mobility can be achieved. In addition, a transistor having high reliability can be achieved.

An oxide semiconductor with a low carrier concentration is preferably used for the transistor. In the case where the carrier concentration of an oxide semiconductor film is lowered, the impurity concentration in the oxide semiconductor film is lowered to decrease the density of defect states. In this specification and the like, a state with a low impurity concentration and a low density of defect states is referred to as a highly purified intrinsic or substantially highly purified intrinsic state.

A highly purified intrinsic or substantially highly purified intrinsic oxide semiconductor film has a low density of defect states and thus has a low density of trap states in some cases.

Electric charge trapped by the trap states in the oxide semiconductor takes a long time to disappear and might behave like fixed electric charge. Thus, a transistor whose channel formation region is formed in an oxide semiconductor with a high density of trap states has unstable electrical characteristics in some cases.

Accordingly, in order to obtain stable electrical characteristics of a transistor, reducing the impurity concentration in an oxide semiconductor is effective. In order to reduce the impurity concentration in the oxide semiconductor, it is preferable that the impurity concentration in an adjacent film be also reduced. Examples of impurities include hydrogen, nitrogen, alkali metal, alkaline earth metal, iron, nickel, and silicon.

[Impurities]

Here, the influence of each impurity in the oxide semiconductor is described.

When silicon or carbon, which is one of Group 14 elements, is contained in the oxide semiconductor, defect states are formed in the oxide semiconductor. Thus, the concentration of silicon or carbon in the oxide semiconductor and the concentration of silicon or carbon at an interface, for example, between an insulator and the oxide semiconductor and in the vicinity of the interface (the concentration obtained by secondary ion mass spectrometry (SIMS)) are each set lower than or equal to $2\times10^{18}$ atoms/cm$^3$, preferably lower than or equal to $2\times10^{17}$ atoms/cm$^3$.

When the oxide semiconductor contains an alkali metal or an alkaline earth metal, defect states are formed and carriers are generated in some cases. Thus, a transistor using an oxide semiconductor that contains an alkali metal or an alkaline earth metal is likely to have normally-on characteristics. Accordingly, it is preferable to reduce the concentration of an alkali metal or an alkaline earth metal in the oxide semiconductor. Specifically, the concentration of an alkali metal or an alkaline earth metal in the oxide semiconductor that is obtained by SIMS is set lower than or equal to $1\times10^{18}$ atoms/cm$^3$, preferably lower than or equal to $2\times10^{16}$ atoms/cm$^3$.

When the oxide semiconductor contains nitrogen, the oxide semiconductor easily becomes n-type by generation of electrons serving as carriers and an increase in carrier concentration. As a result, a transistor using an oxide semiconductor containing nitrogen as a semiconductor is likely to have normally-on characteristics. For this reason, nitrogen in the oxide semiconductor is preferably reduced as much as possible. For example, the nitrogen concentration in the oxide semiconductor is lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$ in SIMS.

Hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, bonding of part of hydrogen to oxygen bonded to a metal atom causes generation of an electron serving as a carrier in some cases. Thus, a transistor using an oxide semiconductor containing hydrogen is likely to have normally-on characteristics. Accordingly, hydrogen in the oxide semiconductor is preferably reduced as much as possible. Specifically, the hydrogen concentration in the oxide semiconductor that is obtained by SIMS is set lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$.

When an oxide semiconductor with sufficiently reduced impurities is used for the channel formation region of the transistor, stable electrical characteristics can be given.

[Other Semiconductor Materials]

A semiconductor material that can be used for the oxide 230 is not limited to the above metal oxides. A semiconductor material having a band gap (a semiconductor material that is not a zero-gap semiconductor) may be used for the oxide 230. For example, a single element semiconductor such as silicon, a compound semiconductor such as gallium arsenide, or a layered material (also referred to as an atomic layered material or a two-dimensional material) functioning as a semiconductor is preferably used as the semiconductor material. The layered material functioning as a semiconductor is particularly suitable as the semiconductor material.

Here, in this specification and the like, the layered material generally refers to a group of materials having a layered crystal structure. The layered crystal structure refers to a structure in which layers formed by a covalent bond or an ionic bond are stacked with a bond that is weaker than the covalent bond or the ionic bond, such as a van der Waals force. The layered material has high electrical conductivity in a monolayer, that is, high two-dimensional electrical conductivity. With the use of a material functioning as a semiconductor and having high two-dimensional electrical conductivity in a channel formation region, a transistor with a high on-state current can be provided.

Examples of the layered material include graphene, silicene, and chalcogenide. Chalcogenide is a compound containing chalcogen. Chalcogen is a general term of elements belonging to Group 16, which includes oxygen, sulfur, selenium, tellurium, polonium, and livermorium. Examples of chalcogenide include transition metal chalcogenide and chalcogenide of Group 13 elements.

For the oxide 230, a transition metal chalcogenide functioning as a semiconductor is preferably used, for example. Specific examples of the transition metal chalcogenide which can be used for the oxide 230 include molybdenum sulfide (typically MoS$_2$), molybdenum selenide (typically MoSe$_2$), molybdenum telluride (typically MoTe$_2$), tungsten sulfide (typically WS$_2$), tungsten selenide (typically WSe$_2$), tungsten telluride (typically WTe$_2$), hafnium sulfide (typically HfS$_2$), hafnium selenide (typically HfSe$_2$), zirconium sulfide (typically ZrS$_2$), and zirconium selenide (typically ZrSe$_2$).

The structures, methods, and the like described in this embodiment can be used in combination as appropriate with the structures, configurations, methods, and the like described in the other embodiments.

Embodiment 2

In this embodiment, a memory device including a semiconductor device of one embodiment of the present invention is described.

Figure 24:
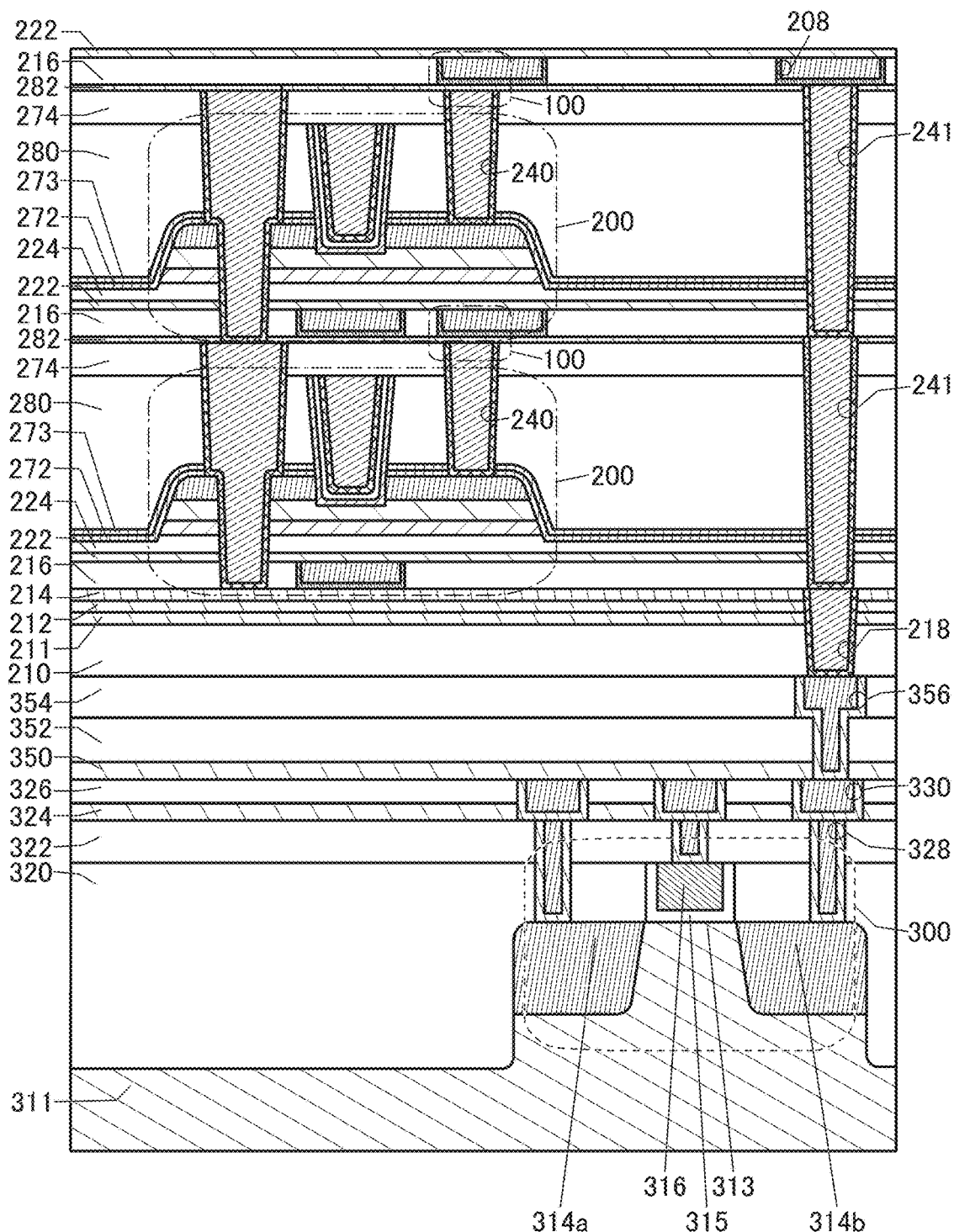
FIG. 24 is a cross-sectional view illustrating a structure example of a memory device.

A memory device illustrated in FIG. 24 includes the transistor 200, the capacitor 100, and a transistor 300. FIG. 24 is a cross-sectional view of the transistor 200 and the transistor 300 in the channel length direction. In FIG. 24, a cross-sectional view of the capacitor 100 is also illustrated.

As described in Embodiment 1, the transistor 200 is a transistor whose channel is formed in a semiconductor containing an oxide semiconductor. Since the transistor 200 has a low off-state current as described in Embodiment 1, a memory device including the transistor 200 can retain stored data for a long time. Thus, refresh operation can be unnecessary or the frequency of the refresh operation can be extremely small. Consequently, the power consumption of the memory device can be reduced sufficiently.

The memory device of one embodiment of the present invention includes the transistor 300, the transistor 200, and the capacitor 100 as illustrated in FIG. 24. The transistor 200 and the capacitor 100 are provided above the transistor 300. Although two transistors 200 and two capacitors 100 are provided in FIG. 24, one embodiment of the present invention is not limited thereto. For example, three or more transistors 200 and three or more capacitors 100 may be provided. For example, three or more transistors 200 may be provided in different layers and three or more capacitors 100 may be provided in different layers.

Embodiment 1 can be referred to for the structures of the transistor 200 and the capacitor 100.

The transistor 300 is provided over the substrate 311 and includes a conductor 316, an insulator 315, a semiconductor region 313, a low-resistance region 314a, and a low-resistance region 314b. Here, the semiconductor region 313, the low-resistance region 314a, and the low-resistance region 314b can be included in the substrate 311. In that case, the low-resistance region 314a has a function of one of a source region and a drain region, and the low-resistance region 314b has a function of the other of the source region and the drain region.

The transistor 300 may be a p-channel transistor or an n-channel transistor.

A region of the semiconductor region 313 where a channel is formed, a region in the vicinity thereof, the low-resistance region 314a and the low-resistance region 314b, and the like preferably contain a semiconductor such as a silicon-based semiconductor, and preferably contain single crystal silicon. Alternatively, the regions may be formed using a material containing Ge (germanium), SiGe (silicon germanium), GaAs (gallium arsenide), GaAlAs (gallium aluminum arsenide), or the like. A structure may be employed in which silicon whose effective mass is controlled by applying stress to the crystal lattice and changing the lattice spacing is used. Alternatively, the transistor 300 may be an HEMT (High Electron Mobility Transistor) with the use of GaAs and GaAlAs, or the like.

The low-resistance region 314a and the low-resistance region 314b contain an element that imparts n-type conductivity, such as arsenic or phosphorus, or an element that imparts p-type conductivity, such as boron, in addition to a semiconductor material used for the semiconductor region 313.

For the conductor 316 functioning as a gate electrode, a semiconductor material such as silicon containing an element that imparts n-type conductivity, such as arsenic or phosphorus, or an element that imparts p-type conductivity, such as boron, or a conductive material such as a metal material, an alloy material, or a metal oxide material can be used.

Note that the work function depends on a material of the conductor; thus, the threshold voltage can be adjusted by changing the material of the conductor. Specifically, it is preferable to use a material such as titanium nitride or tantalum nitride for the conductor. Moreover, in order to ensure both conductivity and embeddability, it is preferable to use stacked layers of metal materials such as tungsten and aluminum for the conductor, and it is particularly preferable to use tungsten in terms of heat resistance.

Note that the transistor 300 illustrated in FIG. 24 is an example and the structure is not limited thereto; an appropriate transistor is used in accordance with a circuit structure or a driving method.

An insulator 320, an insulator 322, an insulator 324, and an insulator 326 are provided to be stacked in this order to cover the transistor 300.

For the insulator 320, the insulator 322, the insulator 324, and the insulator 326, silicon oxide, silicon oxynitride, silicon nitride oxide, silicon nitride, aluminum oxide, aluminum oxynitride, aluminum nitride oxide, or aluminum nitride is used, for example.

The insulator 322 may have a function of a planarization film for planarizing a level difference caused by the transistor 300 or the like provided below the insulator 322. For example, a top surface of the insulator 322 may be planarized by planarization treatment using a CMP method or the like to increase planarity.

In addition, for the insulator 324, it is preferable to use a film having a barrier property that prevents diffusion of hydrogen or impurities from the substrate 311, the transistor 300, or the like into a region where the transistor 200 is provided.

For the film having a barrier property against hydrogen, silicon nitride formed by a CVD method can be used, for example. Here, diffusion of hydrogen into a semiconductor element including an oxide semiconductor, such as the transistor 200, degrades the characteristics of the semiconductor element in some cases. Therefore, a film that inhibits diffusion of hydrogen is preferably used between the transistor 200 and the transistor 300. The film that inhibits diffusion of hydrogen is specifically a film from which a small amount of hydrogen is released.

The amount of released hydrogen can be analyzed by thermal desorption spectroscopy (TDS), for example. The amount of hydrogen released from the insulator 324 that is converted into hydrogen atoms per area of the insulator 324 is smaller than or equal to $10 \times 10^{15}$ atoms/cm$^2$, preferably smaller than or equal to $5 \times 10^{15}$ atoms/cm$^2$ in TDS analysis in a film-surface temperature range of 50° C. to 500° C., for example.

Note that the permittivity of the insulator 326 is preferably lower than that of the insulator 324. For example, the dielectric constant of the insulator 326 is preferably lower than 4, further preferably lower than 3. Furthermore, for example, the dielectric constant of the insulator 326 is preferably 0.7 times or less, further preferably 0.6 times or less the dielectric constant of the insulator 324. When a material with a low permittivity is used for an interlayer film, the parasitic capacitance generated between wirings can be reduced.

Furthermore, a conductor 328, a conductor 330, and the like that are electrically connected to the transistor 300 are embedded in the insulator 320, the insulator 322, the insulator 324, and the insulator 326. Note that the conductor 328 and the conductor 330 function as plugs or wirings. In addition, a plurality of conductors functioning as plugs or wirings are collectively denoted by the same reference numeral in some cases. Furthermore, in this specification and the like, a wiring and a plug electrically connected to the wiring may be a single component. That is, there are a case where part of a conductor functions as a wiring and a case where part of a conductor functions as a plug.

As a material for each of plugs and wirings (the conductor 328, the conductor 330, and the like), a single layer or stacked layers of a conductive material such as a metal material, an alloy material, a metal nitride material, or a metal oxide material can be used. It is preferable to use a high-melting-point material that has both heat resistance and conductivity, such as tungsten or molybdenum, and it is preferable to use tungsten. Alternatively, a low-resistance conductive material such as aluminum or copper is preferably used. The use of a low-resistance conductive material can reduce wiring resistance.

A wiring layer may be provided over the insulator 326 and the conductor 330. For example, in FIG. 24, an insulator 350, an insulator 352, and an insulator 354 are stacked in this order. Furthermore, a conductor 356 is formed in the insulator 350, the insulator 352, and the insulator 354. The conductor 356 has a function of a plug or a wiring. Note that the conductor 356 can be provided using a material similar to those for the conductor 328 and the conductor 330.

As the insulator 350, it is preferable to use, for example, an insulator having a barrier property against hydrogen, like the insulator 324. Furthermore, the conductor 356 preferably includes a conductor having a barrier property against hydrogen. In particular, the conductor 356 having a barrier property against hydrogen is formed in an opening portion provided in the insulator 350 having a barrier property against hydrogen, whereby the transistor 300 and the transistor 200 can be separated from each other by a barrier layer. Accordingly, diffusion of hydrogen from the transistor 300 into the transistor 200 can be inhibited.

For the conductor having a barrier property against hydrogen, tantalum nitride is preferably used, for example. In addition, the use of a stack including tantalum nitride and tungsten, which has high conductivity, can inhibit diffusion of hydrogen from the transistor 300 while the conductivity of a wiring is maintained. In that case, a structure is preferable in which a tantalum nitride layer having a barrier property against hydrogen is in contact with the insulator 350 having a barrier property against hydrogen.

In the above, a wiring layer including the conductor 356 is described; however, the memory device of this embodiment is not limited thereto. Three or less wiring layers that are similar to the wiring layer including the conductor 356 may be provided, or five or more wiring layers that are similar to the wiring layer including the conductor 356 may be provided.

An insulator 210, the insulator 211, the insulator 212, and the insulator 214 are provided to be stacked over the insulator 354 in this order. A material having a barrier property against oxygen and hydrogen is preferably used for any of the insulator 210, the insulator 211, the insulator 212, and the insulator 214.

A material similar to that for the insulator 320 can be used for the insulator 210, for example. When a material with a relatively low permittivity is used for an interlayer film, the parasitic capacitance between wirings can be reduced. A silicon oxide film, a silicon oxynitride film, or the like can be used for the insulator 211 and the insulator 212, for example.

For example, for the insulator 211 and the insulator 212, it is preferable to use a film having a barrier property that prevents diffusion of hydrogen or impurities from the substrate 311, a region where the transistor 300 is provided, or the like into a region where the transistor 200 is provided. Thus, a material similar to that for the insulator 324 can be used for the insulator 211 and the insulator 212.

For the film having a barrier property against hydrogen, silicon nitride formed by a CVD method can be used, for example. Here, diffusion of hydrogen into a semiconductor element including an oxide semiconductor, such as the transistor 200, degrades the characteristics of the semiconductor element in some cases. Therefore, a film that inhibits diffusion of hydrogen is preferably used between the transistor 200 and the transistor 300. The film that inhibits diffusion of hydrogen is specifically a film from which a small amount of hydrogen is released.

As the film having a barrier property against hydrogen, a metal oxide such as aluminum oxide, hafnium oxide, or tantalum oxide is preferably used for the insulator 214, for example.

In particular, aluminum oxide has an excellent blocking effect that prevents passage of both oxygen and impurities such as hydrogen and moisture which are factors in a change in electrical characteristics of the transistor. Accordingly, aluminum oxide can prevent entry of impurities such as hydrogen and moisture into the transistor 200 during the manufacturing process and after the manufacturing of the transistor. In addition, release of oxygen from the oxide included in the transistor 200 can be inhibited. Therefore, aluminum oxide is suitably used for a protective film of the transistor 200.

A conductor 218 is embedded in the insulator 210, the insulator 211, the insulator 212, and the insulator 214. Note that the conductor 218 has a function of a plug or a wiring. The conductor 218 can be provided using a material similar to those for the conductor 328 and the conductor 330.

The conductor 218 is preferably a conductor having a barrier property against oxygen, hydrogen, and water. Accordingly, diffusion of oxygen, hydrogen, and water from the transistor 300 into the transistor 200 can be inhibited.

The transistor 200 and the capacitor 100 are provided above the insulator 214. Note that the structures of the transistor 200 and the capacitor 100 described in Embodiment 1 and the like can be used as those of the transistor 200 and the capacitor 100. The structures of the transistor 200 and the capacitor 100 illustrated in FIG. 24 are an example and are not limited thereto; a transistor or the like with an appropriate structure is used in accordance with a circuit structure or a driving method.

An opening is provided in the insulator 282, the insulator 274, the insulator 280, the insulator 273, the insulator 272, the insulator 224, the insulator 222, and the insulator 216, and a conductor 241 is provided in the opening. The conductor 241 can be provided using a material similar to that for the conductor 240 described in Embodiment 1. A conductor 208 is provided above the conductor 241. FIG. 24 illustrates a structure in which the transistor 300 is electrically connected to the conductor 208 through the conductor 328, the conductor 330, the conductor 356, the conductor 218, and the conductor 241.

The above is the description of the structure example. With the use of the structure, a semiconductor device using a transistor including an oxide semiconductor can have a small variation in electrical characteristics and higher reliability.

The structures, methods, and the like described in this embodiment can be used in combination as appropriate with the structures, configurations, methods, and the like described in the other embodiments.

Embodiment 3

In this embodiment, a memory device including an OS transistor (hereinafter referred to as an OS memory device in some cases) is described. The OS memory device includes at least a capacitor and an OS transistor that controls the charging and discharging of the capacitor. Since the OS transistor has an extremely low off-state current, the OS memory device has excellent retention characteristics and thus can function as a nonvolatile memory.

Figure 25:
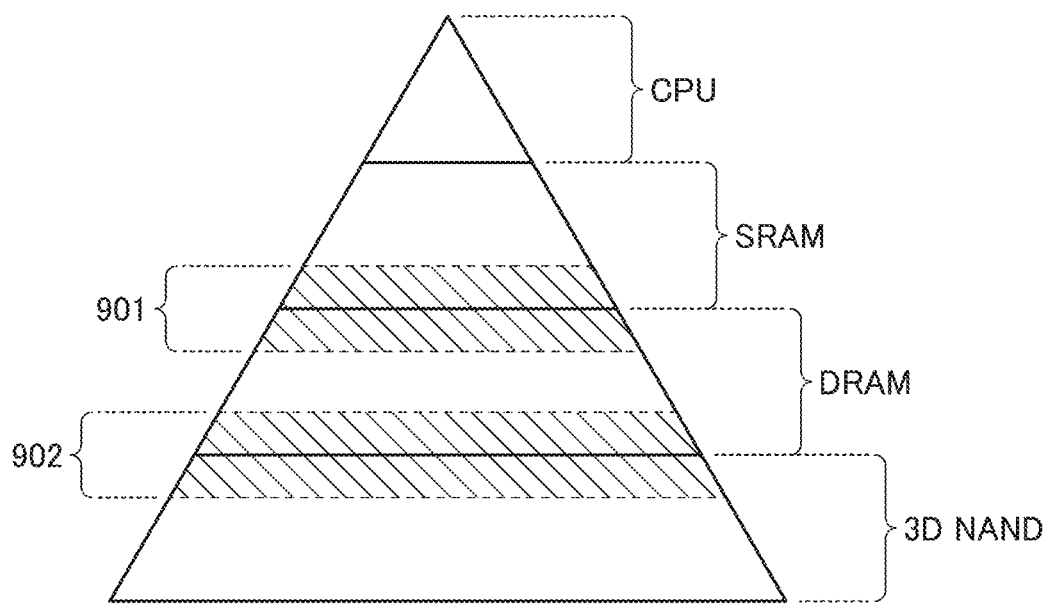
FIG. 25 is a diagram illustrating a hierarchy of various kinds of memory devices.

In general, a variety of memory devices (memories) are used in semiconductor devices such as computers in accordance with the intended use. FIG. 25 shows a hierarchy of memory devices. The memory devices at upper levels require higher access speed and those at lower levels require larger memory capacity and higher recording density. In FIG. 25, sequentially from the top level, a memory combined as a register in an arithmetic processing device such as a CPU, an SRAM (Static Random Access Memory), a DRAM (Dynamic Random Access Memory), and a 3D NAND memory are shown.

A memory combined as a register in an arithmetic processing device such as a CPU is used for temporary storage of arithmetic operation results, for example, and thus is very frequently accessed by the arithmetic processing device. Accordingly, high operation speed is required rather than memory capacity. In addition, the register also has a function of retaining setting information of the arithmetic processing device, for example.

An SRAM is used for a cache, for example. A cache has a function of duplicating and retaining part of information retained in a main memory. When the frequently used data is duplicated and retained in the cache, the access speed to the data can be increased.

A DRAM is used for a main memory, for example. A main memory has a function of retaining a program or data read from a storage. A DRAM has a recording density of approximately 0.1 to 0.3 Gbit/mm$^2$.

A 3D NAND memory is used for a storage, for example. A storage has a function of retaining data that needs to be retained for a long time or a variety of programs used in an arithmetic processing device, for example. Therefore, a storage needs to have high memory capacity and a high recording density rather than operation speed. A memory device used for a storage has a recording density of approximately 0.6 to 6.0 Gbit/mm$^2$.

The memory device of one embodiment of the present invention has a high operation speed and can retain data for a long time. The memory device of one embodiment of the present invention can be suitably used as a memory device in a boundary region 901 that includes both the level to which a cache belongs and the level to which a main memory belongs. The memory device of one embodiment of the present invention can be suitably used as a memory device in a boundary region 902 that includes both the level to which the main memory belongs and the level to which a storage belongs.

Structure Example of Memory Device

Figure 26A:
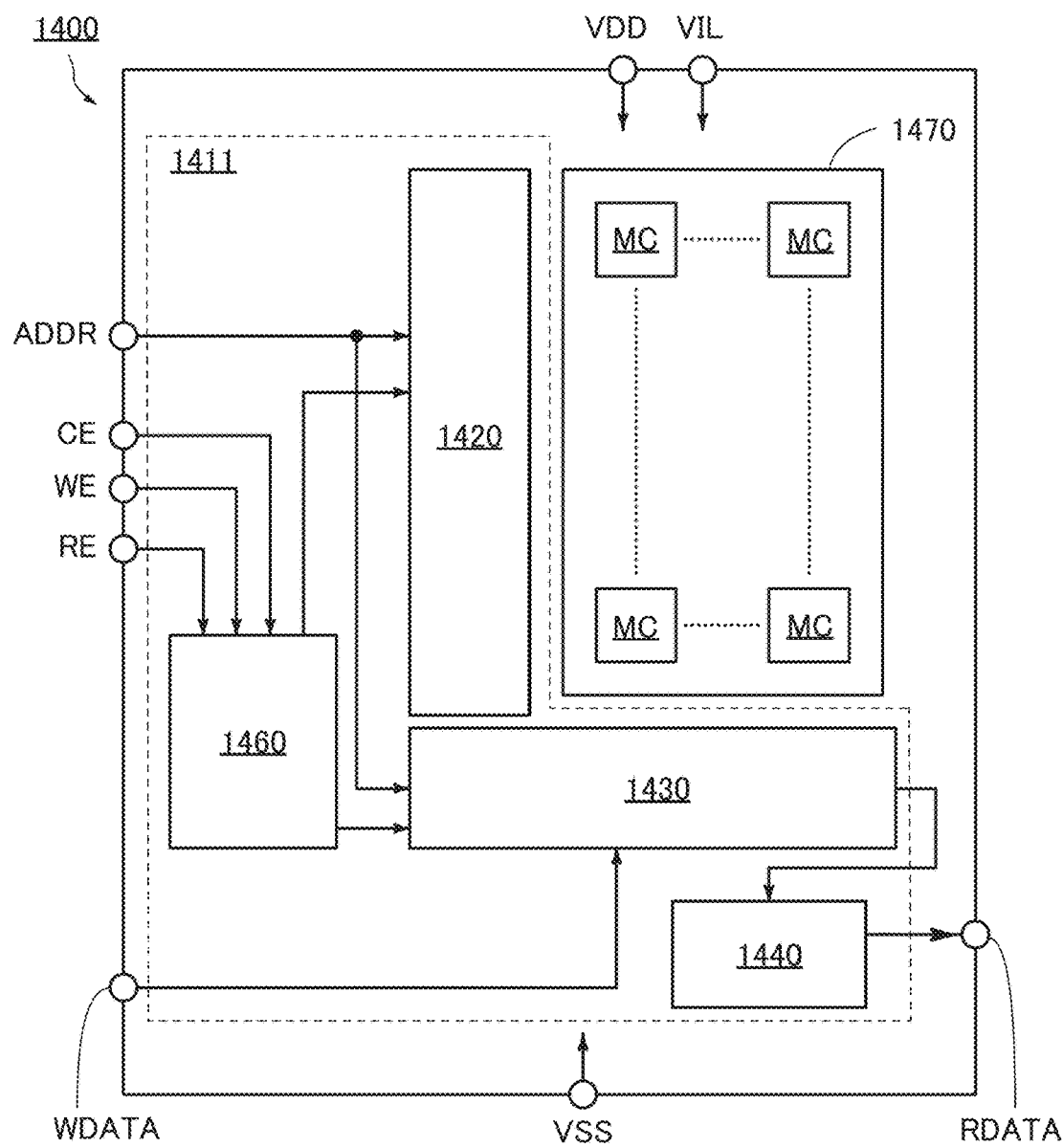
FIG. 26A is a block diagram illustrating a structure example of a memory device.

FIG. 26A illustrates an example of the structure of an OS memory device. A memory device 1400 includes a peripheral circuit 1411 and a memory cell array 1470. The peripheral circuit 1411 includes a row circuit 1420, a column circuit 1430, an output circuit 1440, and a control logic circuit 1460.

The column circuit 1430 includes, for example, a column decoder, a precharge circuit, a sense amplifier, a write circuit, and the like. The precharge circuit has a function of precharging wirings. The sense amplifier has a function of amplifying a data signal read from a memory cell. Note that the wirings are connected to the memory cell included in the memory cell array 1470, and are described later in detail. The amplified data signal is output as a data signal RDATA to the outside of the memory device 1400 through the output circuit 1440. The row circuit 1420 includes, for example, a row decoder and a word line driver circuit, and can select a row to be accessed.

As power supply voltages from the outside, a low power supply voltage (VSS), a high power supply voltage (VDD) for the peripheral circuit 1411, and a high power supply voltage (VIL) for the memory cell array 1470 are supplied to the memory device 1400. Control signals (CE, WE, and RE), an address signal ADDR, and a data signal WDATA are also input to the memory device 1400 from the outside. The address signal ADDR is input to the row decoder and the column decoder, and WDATA is input to the write circuit.

The control logic circuit 1460 processes the signals (CE, WE, and RE) input from the outside, and generates control signals for the row decoder and the column decoder. CE is a chip enable signal, WE is a write enable signal, and RE is a read enable signal. Signals processed by the control logic circuit 1460 are not limited thereto, and other control signals may be input as necessary.

The memory cell array 1470 includes a plurality of memory cells MC arranged in a matrix and a plurality of wirings. Note that the number of the wirings that connect the memory cell array 1470 to the row circuit 1420 depends on the structure of the memory cell MC, the number of the memory cells MC in a column, and the like. The number of the wirings that connect the memory cell array 1470 to the column circuit 1430 depends on the structure of the memory cell MC, the number of the memory cells MC in a row, and the like.

Figure 26B:
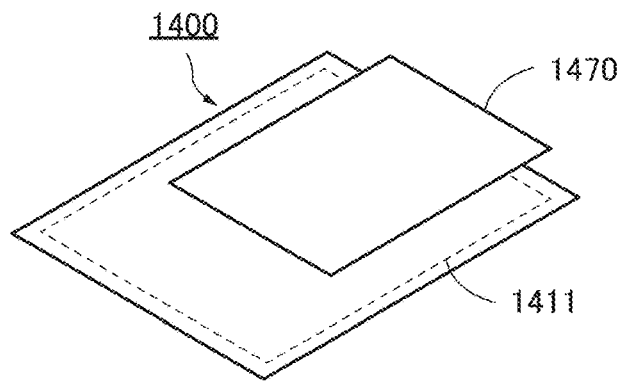
FIG. 26B is a perspective view illustrating a structure example of the memory device.

Note that FIG. 26A illustrates an example in which the peripheral circuit 1411 and the memory cell array 1470 are formed on the same plane; however, this embodiment is not limited thereto. For example, as illustrated in FIG. 26B, the memory cell array 1470 may be provided over the peripheral circuit 1411 to partly overlap with the peripheral circuit 1411. For example, the sense amplifier may be provided below the memory cell array 1470 so that they overlap with each other.

Figure 27A:
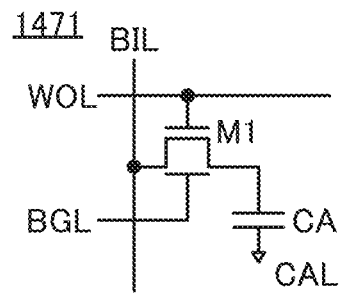
FIG. 27A to FIG. 27C are circuit diagrams illustrating structure examples of a memory device.
Figure 27B:
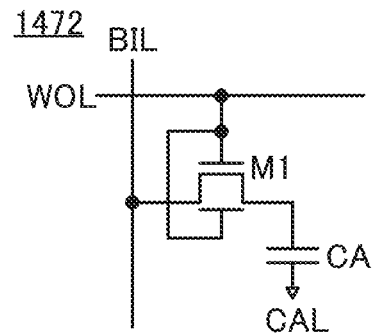
Figure 27C:
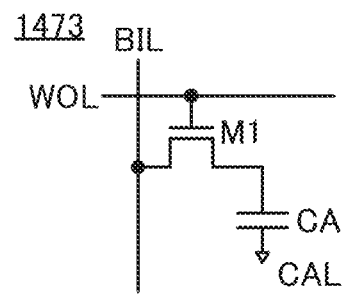

FIG. 27A to FIG. 27C illustrate structure examples of memory cells applicable to the memory cell MC.

<DOSRAM>

FIG. 27A to FIG. 27C each illustrate a circuit structure example of a memory cell of a DRAM. In this specification and the like, a DRAM using a memory cell including one OS transistor and one capacitor is referred to as a DOSRAM (Dynamic Oxide Semiconductor Random Access Memory) in some cases. A memory cell 1471 illustrated in FIG. 27A includes a transistor M1 and a capacitor CA. Note that the transistor M1 includes a gate (also referred to as a front gate in some cases) and a back gate.

A first terminal of the transistor M1 is connected to a first terminal of the capacitor CA. A second terminal of the transistor M1 is connected to a wiring BIL. A gate of the transistor M1 is connected to a wiring WOL. A back gate of the transistor M1 is connected to a wiring BGL. A second terminal of the capacitor CA is connected to a wiring CAL.

The wiring BIL functions as a bit line, and the wiring WOL functions as a word line. The wiring CAL functions as a wiring for applying a predetermined potential to the second terminal of the capacitor CA. In the time of data writing and data reading, a low-level potential is preferably applied to the wiring CAL. The wiring BGL functions as a wiring for applying a potential to the back gate of the transistor M1. Applying a given potential to the wiring BGL can increase or decrease the threshold voltage of the transistor M1.

The memory cell MC is not limited to the memory cell 1471, and the circuit structure can be changed. For example, like a memory cell 1472 illustrated in FIG. 27B, a structure may be employed in which the back gate of the transistor M1 is connected not to the wiring BGL but to the wiring WOL in the memory cell MC. Alternatively, for example, the memory cell MC may be a memory cell including a single-gate transistor, that is, the transistor M1 not including a back gate, as in a memory cell 1473 illustrated in FIG. 27C.

In the case where the semiconductor device described in the above embodiment is used in the memory cell 1471 and the like, the transistor 200 can be used as the transistor M1, and the capacitor 100 can be used as the capacitor CA. When an OS transistor is used as the transistor M1, the leakage current of the transistor M1 can be extremely low. That is, with the use of the transistor M1, written data can be retained for a long time, and thus the frequency of the refresh operation for the memory cell can be decreased. In addition, refresh operation for the memory cell can be omitted. In addition, since the transistor M1 has an extremely low leakage current, multi-level data or analog data can be retained in the memory cell 1471, the memory cell 1472, and the memory cell 1473.

In the DOSRAM, when the sense amplifier is provided below the memory cell array 1470 so that they overlap with each other as described above, the bit line can be shortened. Thus, the bit line capacitance can be small, and the storage capacitance of the memory cell can be reduced.

The structures, methods, and the like described in this embodiment can be used in combination as appropriate with the structures, configurations, methods, and the like described in the other embodiments.

Embodiment 4

In this embodiment, examples of electronic components and electronic devices in which the memory device or the like described in the above embodiment is incorporated are described.

First, examples of electronic components in which a memory device 1000 is incorporated are described with reference to FIG. 28A and FIG. 28B.

Figure 28A:
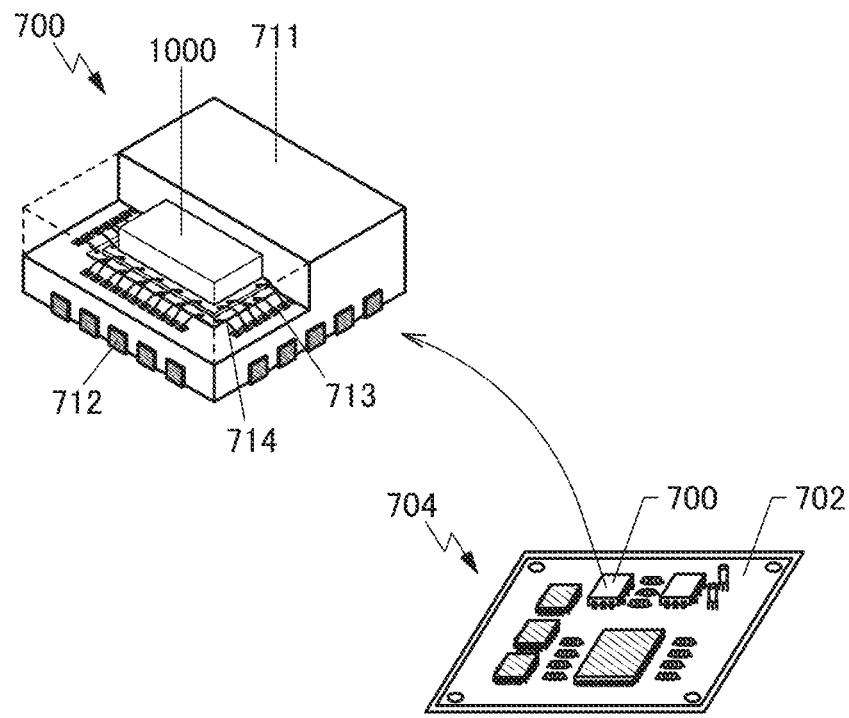
FIG. 28A and FIG. 28B are diagrams illustrating examples of electronic components.

FIG. 28A is a perspective view of an electronic component 700 and a substrate (a mounting board 704) on which the electronic component 700 is mounted. The electronic component 700 illustrated in FIG. 28A includes the memory device 1000 in a mold 711. To illustrate the inside of the electronic component 700, some portions are omitted in FIG. 28A. The electronic component 700 includes a land 712 outside the mold 711. The land 712 is electrically connected to an electrode pad 713, and the electrode pad 713 is electrically connected to the memory device 1000 via a wire 714. The electronic component 700 is mounted on a printed circuit board 702, for example. A plurality of such electronic components are combined and electrically connected to each other on the printed circuit board 702, whereby the mounting board 704 is completed.

Figure 28B:
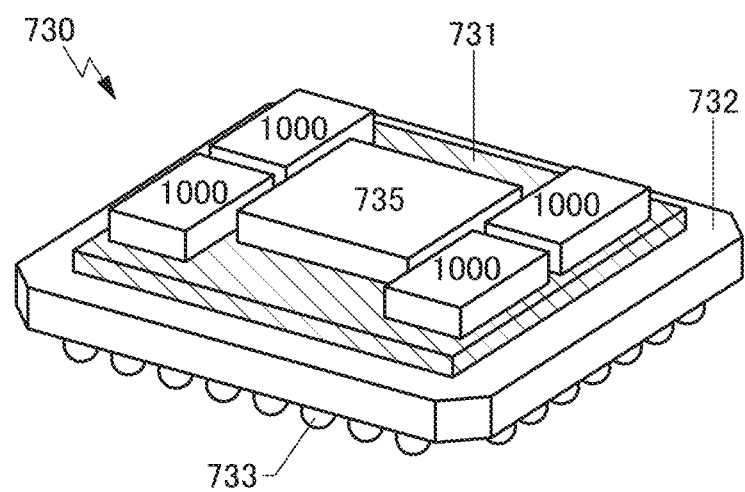

FIG. 28B is a perspective view of an electronic component 730. The electronic component 730 is an example of a SiP (System in package) or an MCM (Multi Chip Module). In the electronic component 730, an interposer 731 is provided on a package substrate 732 (a printed circuit board), and a semiconductor device 735 and a plurality of memory devices 1000 are provided on the interposer 731.

The electronic component 730 using the memory devices 1000 as a high bandwidth memory (HBM) is illustrated as an example. An integrated circuit (a semiconductor device) such as a CPU, a GPU, or an FPGA can be used as the semiconductor device 735.

As the package substrate 732, a ceramic substrate, a plastic substrate, a glass epoxy substrate, or the like can be used. As the interposer 731, a silicon interposer, a resin interposer, or the like can be used.

The interposer 731 includes a plurality of wirings and has a function of electrically connecting a plurality of integrated circuits with different terminal pitches. The plurality of wirings are provided in a single layer or multiple layers. Moreover, the interposer 731 has a function of electrically connecting an integrated circuit provided on the interposer 731 to an electrode provided on the package substrate 732. Accordingly, the interposer is sometimes referred to as a "redistribution substrate" or an "intermediate substrate". A through electrode may be provided in the interposer 731 and used for electrically connecting an integrated circuit and the package substrate 732. For a silicon interposer, a TSV (Through Silicon Via) can also be used as the through electrode.

A silicon interposer is preferably used as the interposer 731. A silicon interposer can be manufactured at lower cost than an integrated circuit because it is not necessary to provide an active element. In contrast, wirings of a silicon interposer can be formed through a semiconductor process. Thus, formation of minute wirings, which is difficult for a resin interposer, can be easy for a silicon interposer.

In order to achieve a wide memory bandwidth, many wirings need to be connected to an HBM. Therefore, formation of minute and high-density wirings is required for an interposer on which an HBM is mounted. For this reason, a silicon interposer is preferably used as the interposer on which an HBM is mounted.

In a SiP, an MCM, or the like using a silicon interposer, the decrease in reliability due to a difference in the expansion coefficient in an integrated circuit and the expansion coefficient in the interposer is less likely to occur. Furthermore, the surface of a silicon interposer has high planarity, so that a poor connection between the silicon interposer and an integrated circuit provided on the silicon interposer is less likely to occur. It is particularly preferable to use a silicon interposer for a 2.5D package (2.5-dimensional mounting) in which a plurality of integrated circuits are arranged side by side on an interposer.

A heat sink (a radiator plate) may be provided to overlap with the electronic component 730. In the case of providing a heat sink, the heights of integrated circuits provided on the interposer 731 are preferably equal to each other. For example, in the electronic component 730 described in this embodiment, the heights of the memory device 1000 and the semiconductor device 735 are preferably equal to each other.

To mount the electronic component 730 on another substrate, an electrode 733 may be provided on the bottom portion of the package substrate 732. FIG. 28B illustrates an example in which the electrode 733 is formed of a solder ball. When solder balls are provided in a matrix on the bottom portion of the package substrate 732, BGA (Ball Grid Array) mounting can be achieved. Alternatively, the electrode 733 may be formed of a conductive pin. When conductive pins are provided in a matrix on the bottom portion of the package substrate 732, PGA (Pin Grid Array) mounting can be achieved.

The electronic component 730 can be mounted on another substrate by various mounting methods not limited to BGA and PGA. For example, a mounting method such as SPGA (Staggered Pin Grid Array), LGA (Land Grid Array), QFP (Quad Flat Package), QFJ (Quad Flat J-leaded package), or QFN (Quad Flat Non-leaded package) can be employed.

This embodiment can be implemented in an appropriate combination with the structures described in the other embodiments and the like.

Embodiment 5

In this embodiment, application examples of the memory device using the semiconductor device described in the above embodiment are described. The semiconductor device described in the above embodiment can be applied to, for example, memory devices of a variety of electronic devices (e.g., information terminals, computers, smartphones, e-book readers, digital cameras (including video cameras), video recording/reproducing devices, and navigation systems). Here, the computers refer not only to tablet computers, notebook computers, and desktop computers, but also to large computers such as server systems. Alternatively, the semiconductor device described in the above embodiment is applied to removable memory devices such as memory cards (e.g., SD cards), USB memories, and SSDs (solid state drives). FIG. 29A to FIG. 29E schematically illustrate some structure examples of removable memory devices. The semiconductor device described in the above embodiment is processed into a packaged memory chip and used in a variety of storage devices and removable memories, for example.

FIG. 29A is a schematic diagram of a USB memory. A USB memory 1100 includes a housing 1101, a cap 1102, a USB connector 1103, and a substrate 1104. The substrate 1104 is held in the housing 1101. For example, a memory chip 1105 and a controller chip 1106 are attached to the substrate 1104. The semiconductor device described in the above embodiment can be incorporated in the memory chip 1105 or the like on the substrate 1104.

FIG. 29B is a schematic external diagram of an SD card, and FIG. 29C is a schematic diagram of the internal structure of the SD card. An SD card 1110 includes a housing 1111, a connector 1112, and a substrate 1113. The substrate 1113 is held in the housing 1111. For example, a memory chip 1114 and a controller chip 1115 are attached to the substrate 1113. When the memory chip 1114 is also provided on the rear surface side of the substrate 1113, the capacity of the SD card 1110 can be increased. In addition, a wireless chip with a radio communication function may be provided on the substrate 1113. With this, data can be read from and written in the memory chip 1114 by radio communication between a host device and the SD card 1110. The semiconductor device described in the above embodiment can be incorporated in the memory chip 1114 or the like on the substrate 1113.

FIG. 29D is a schematic external diagram of an SSD, and FIG. 29E is a schematic diagram of the internal structure of the SSD. An SSD 1150 includes a housing 1151, a connector 1152, and a substrate 1153. The substrate 1153 is held in the housing 1151. For example, a memory chip 1154, a memory chip 1155, and a controller chip 1156 are attached to the substrate 1153. The memory chip 1155 is a work memory for the controller chip 1156, and a DOSRAM chip can be used, for example. When the memory chip 1154 is also provided on the rear surface side of the substrate 1153, the capacity of the SSD 1150 can be increased. The semiconductor device described in the above embodiment can be incorporated in the memory chip 1154 or the like on the substrate 1153.

The structures, methods, and the like described in this embodiment can be used in combination as appropriate with the structures, configurations, methods, and the like described in the other embodiments.

Embodiment 6

In this embodiment, specific examples of electronic devices to which the semiconductor device of one embodiment of the present invention can be applied are described with reference to FIG. 30A to FIG. 30F.

More specifically, the semiconductor device of one embodiment of the present invention can be used for a processor such as a CPU and a GPU or a chip. FIG. 30A to FIG. 30F illustrate specific examples of electronic devices including a processor such as a CPU and a GPU or a chip of one embodiment of the present invention.

The GPU or the chip of one embodiment of the present invention can be mounted on a variety of electronic devices. Examples of electronic devices include a digital camera, a digital video camera, a digital photo frame, a mobile phone, a portable game console, a portable information terminal, and an audio reproducing device in addition to electronic devices provided with a relatively large screen, such as a television device, a desktop or laptop personal computer, a monitor for a computer and the like, digital signage, and a large game machine like a pachinko machine. In addition, when the integrated circuit or the chip of one embodiment of the present invention is provided in the electronic device, the electronic device can include artificial intelligence.

The electronic device of one embodiment of the present invention may include an antenna. When a signal is received by the antenna, a video, data, or the like can be displayed on a display portion. When the electronic device includes the antenna and a secondary battery, the antenna may be used for contactless power transmission.

The electronic device of one embodiment of the present invention may include a sensor (a sensor having a function of measuring force, displacement, a position, speed, acceleration, angular velocity, rotational frequency, distance, light, liquid, magnetism, temperature, a chemical substance, sound, time, hardness, an electric field, current, voltage, electric power, radioactive rays, a flow rate, humidity, gradient, oscillation, a smell, or infrared rays).

The electronic device of one embodiment of the present invention can have a variety of functions. For example, the electronic device can have a function of displaying a variety of data (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium. FIG. 30A to FIG. 30F illustrate examples of the electronic device.

<Mobile Phone>

Figure 30A:
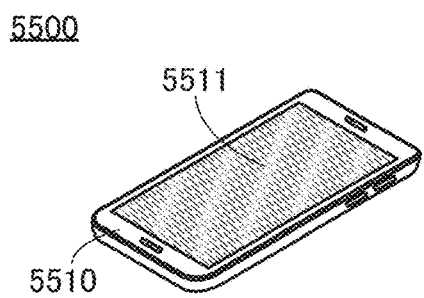

FIG. 30A illustrates a mobile phone (smartphone) which is a type of an information terminal. An information terminal 5500 includes a housing 5510 and a display portion 5511, and as input interfaces, a touch panel is provided in the display portion 5511 and a button is provided in the housing 5510.

The information terminal 5500 can execute an application utilizing artificial intelligence with the use of the chip of one embodiment of the present invention. Examples of the application utilizing artificial intelligence include an application for recognizing a conversation and displaying the contents of the conversation on the display portion 5511; an application for recognizing letters, figures, and the like input to the touch panel of the display portion 5511 by a user and displaying them on the display portion 5511; and an application for performing biometric authentication using fingerprints, voice prints, or the like.

<Information Terminal 1>

Figure 30B:
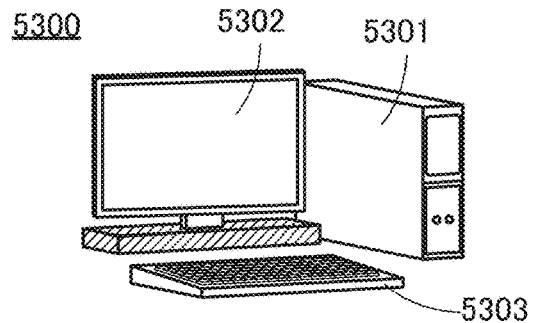

FIG. 30B illustrates a desktop information terminal 5300. The desktop information terminal 5300 includes a main body 5301 of the information terminal, a display 5302, and a keyboard 5303.

The desktop information terminal 5300 can execute an application utilizing artificial intelligence with the use of the chip of one embodiment of the present invention as the information terminal 5500 described above. Examples of the application utilizing artificial intelligence include design-support software, text correction software, and software for automatic menu generation. Furthermore, with the use of the desktop information terminal 5300, novel artificial intelligence can be developed.

Note that although FIG. 30A and FIG. 30B illustrate the smartphone and the desktop information terminal as examples of the electronic device as described above, application to information terminals other than a smartphone and a desktop information terminal is also possible. Examples of information terminals other than a smartphone and a desktop information terminal include a PDA (Personal Digital Assistant), a laptop information terminal, and a workstation.

<Household Appliance>

Figure 30C:
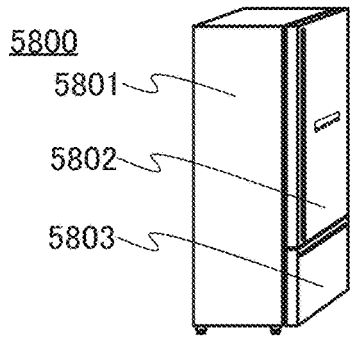

FIG. 30C illustrates an electric refrigerator-freezer 5800 which is an example of a household appliance. The electric refrigerator-freezer 5800 includes a housing 5801, a refrigerator door 5802, a freezer door 5803, and the like.

When the chip of one embodiment of the present invention is applied to the electric refrigerator-freezer 5800, the electric refrigerator-freezer 5800 including artificial intelligence can be obtained. Utilizing the artificial intelligence enables the electric refrigerator-freezer 5800 to have a function of automatically making a menu based on foods stored in the electric refrigerator-freezer 5800, expiration dates of the foods, or the like, a function of automatically adjusting the temperature to be appropriate for the foods stored in the electric refrigerator-freezer 5800, and the like.

Although the electric refrigerator-freezer is described in this example as a household appliance, examples of other household appliances include a vacuum cleaner, a microwave oven, a combination microwave and oven, a rice cooker, a water heater, an IH cooker, a water server, a heating-cooling combination appliance such as an air conditioner, a washing machine, a drying machine, and an audio visual appliance.

<Game Console>

Figure 30D:
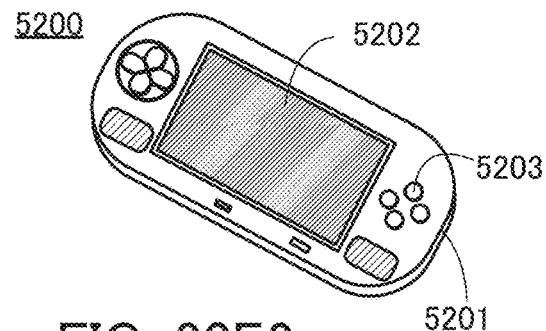
Figure 30D:
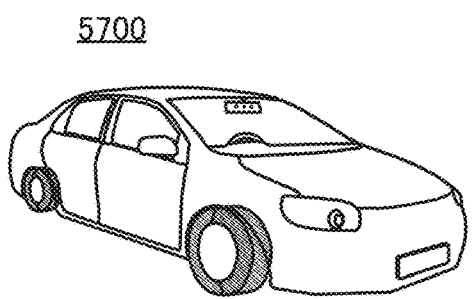
Figure 30D:
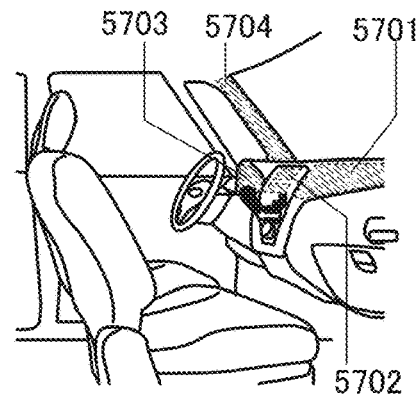

FIG. 30D illustrates a portable game console 5200 which is an example of a game console. The portable game console 5200 includes a housing 5201, a display portion 5202, a button 5203, and the like.

With the use of the GPU or the chip of one embodiment of the present invention in the portable game console 5200, the portable game console 5200 with low power consumption can be obtained. Furthermore, heat generation from a circuit can be reduced owing to low power consumption; thus, the influence of heat generation on the circuit itself, the peripheral circuit, and the module can be reduced.

Moreover, with the use of the GPU or the chip of one embodiment of the present invention in the portable game console 5200, the portable game console 5200 including artificial intelligence can be obtained.

Basically, the progress of a game, the actions and words of game characters, and expressions of a phenomenon or the like that occurs in the game are determined by a program of the game; however, the use of artificial intelligence in the portable game console 5200 enables expressions not limited by the program of the game. For example, expressions are possible in which questions posed by the player, the progress of the game, time, and the actions and words of game characters are changed.

When a game requiring a plurality of players is played on the portable game console 5200, the artificial intelligence can create a virtual game player; thus, the game can be played alone with the game player created by the artificial intelligence as an opponent.

Although the portable game console is illustrated in FIG. 30D as an example of a game machine, the game machine using the GPU or the chip of one embodiment of the present invention is not limited thereto. Examples of the game machine using the GPU or the chip of one embodiment of the present invention include a home stationary game machine, an arcade game machine installed in entertainment facilities (a game center, an amusement park, and the like), a throwing machine for batting practice installed in sports facilities, and the like.

<Moving Vehicle>

The GPU or the chip of one embodiment of the present invention can be used in an automobile, which is a moving vehicle, and around a driver's seat in the automobile.

FIG. 30E1 illustrates an automobile 5700 which is an example of a moving vehicle, and FIG. 30E2 illustrates the periphery of a windshield inside the automobile. FIG. 30E2 illustrates a display panel 5701, a display panel 5702, and a display panel 5703 that are attached to a dashboard and a display panel 5704 that is attached to a pillar.

The display panel 5701 to the display panel 5703 can provide a variety of kinds of information by displaying a speedometer, a tachometer, mileage, a fuel gauge, a gear state, air-condition setting, and the like. The content, layout, or the like of the display on the display panels can be changed appropriately to suit the user's preferences, so that the design can be improved. The display panel 5701 to the display panel 5703 can also be used as lighting devices.

The display panel 5704 displays an image taken by an imaging device (not illustrated) provided for the automobile 5700, whereby the view obstructed by the pillar (blind areas) can be complemented. That is, display of an image taken by an imaging device provided on the outside of the automobile 5700 can fill in blind areas and improve safety. In addition, display of an image that complements the area that cannot be seen makes it possible to confirm safety more naturally and comfortably. The display panel 5704 can also be used as a lighting device.

Because the GPU or the chip of one embodiment of the present invention can be used as a component of artificial intelligence, the chip can be used in an automatic driving system of the automobile 5700, for example. The chip can also be used for a system for navigation, risk prediction, or the like. The display panel 5701 to the display panel 5704 may display information regarding navigation, risk prediction, and the like.

Although an automobile is described above as an example of a moving vehicle, moving vehicles are not limited to an automobile. Examples of a moving vehicle include a train, a monorail train, a ship, and a flying object (a helicopter, an unmanned aircraft (a drone), an airplane, and a rocket), and these moving vehicles can include a system utilizing artificial intelligence when equipped with the chip of one embodiment of the present invention.

<Broadcasting System>

The GPU or the chip of one embodiment of the present invention can be used in a broadcasting system.

Figure 30F:
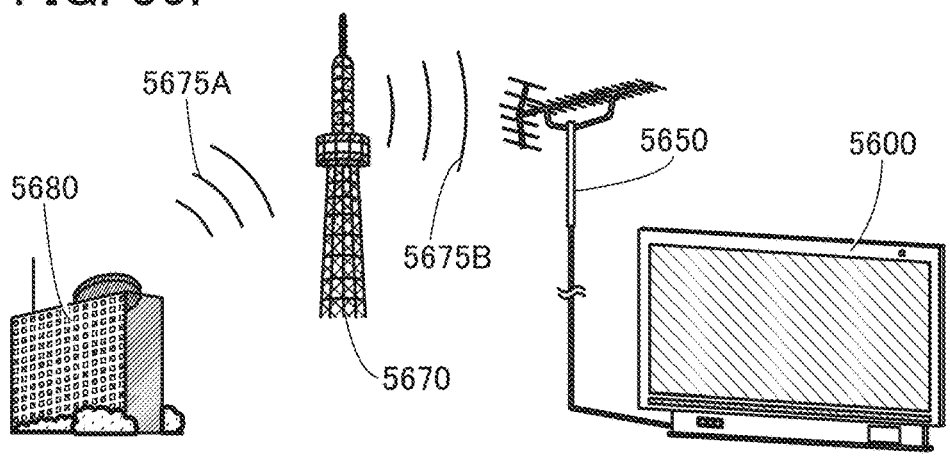

FIG. 30F schematically illustrates data transmission in a broadcasting system. Specifically, FIG. 30F illustrates a path in which a radio wave (a broadcast signal) transmitted from a broadcast station 5680 is delivered to a television receiver (TV) 5600 of each household. The TV 5600 includes a receiving device (not illustrated), and the broadcast signal received by an antenna 5650 is transmitted to the TV 5600 through the receiving device.

Although an UHF (Ultra High Frequency) antenna is illustrated as the antenna 5650 in FIG. 30F, a BS/110° CS antenna, a CS antenna, or the like can also be used as the antenna 5650.

A radio wave 5675A and a radio wave 5675B are broadcast signals for terrestrial broadcasting; a radio wave tower 5670 amplifies the received radio wave 5675A and transmits the radio wave 5675B. Each household can view terrestrial TV broadcasting on the TV 5600 by receiving the radio wave 5675B with the antenna 5650. Note that the broadcasting system is not limited to the terrestrial broadcasting illustrated in FIG. 30F and may be satellite broadcasting using an artificial satellite, data broadcasting using an optical line, or the like.

The above-described broadcasting system may be a broadcasting system utilizing artificial intelligence by including the chip of one embodiment of the present invention. When the broadcast data is transmitted from the broadcast station 5680 to the TV 5600 of each household, the broadcast data is compressed by an encoder. When the antenna 5650 receives the compressed broadcast data, the compressed broadcast data is decompressed by a decoder of the receiving device in the TV 5600. Utilizing the artificial intelligence enables, for example, recognition of a display pattern included in a displayed image in motion compensation prediction, which is one of the compressing methods for the encoder. In addition, in-frame prediction or the like can also be performed utilizing the artificial intelligence. Furthermore, for example, when the broadcast data with low resolution is received and the broadcast data is displayed on the TV 5600 with high resolution, image interpolation processing such as upconversion can be performed in the broadcast data decompression by the decoder.

The above-described broadcasting system utilizing artificial intelligence is suitable for ultra-high definition television (UHDTV: 4K and 8K) broadcasting, which needs a large amount of broadcast data.

As the application of artificial intelligence in the TV 5600, a recording device with artificial intelligence may be provided in the TV 5600, for example. With such a structure, the artificial intelligence can learn the user's preference, so that TV programs that suit the user's preference can be recorded automatically in the recording device.

The electronic device and the functions of the electronic device, the application example of the artificial intelligence and its effects, and the like described in this embodiment can be combined as appropriate with the description of another electronic device.

The structures, methods, and the like described in this embodiment can be used in combination as appropriate with the structures, configurations, methods, and the like described in the other embodiments.

REFERENCE NUMERALS

60: cell, 61: cell, 100: capacitor, 100_1: capacitor, 100_2: capacitor, 100*a*: capacitor, 100*a*_1: capacitor, 100*a*_2: capacitor, 100*b*: capacitor, 100*b*_1: capacitor, 100*b*_2: capacitor, 200: transistor, 200_1: transistor, 2002: transistor, 200*a*: transistor, 200*a*_1: transistor, 200*a*_2: transistor, 200*b*: transistor, 200*b*_1: transistor, 200*b*_2: transistor, 204: conductor, 204_1: conductor, 204_2: conductor, 204*a*: conductor, 204*a*_1: conductor, 204*a*_2: conductor, 204*b*: conductor, 204*b*_1: conductor, 204*b*_2: conductor, 205: conductor, 205_1: conductor, 205_2: conductor, 205_3: conductor, 205*a*: conductor, 205*a*_1: conductor, 205*a*_2: conductor, 205*a*_3: conductor, 205*b*: conductor, 205*b*_1: conductor, 205*b*_2: conductor, 205*b*_3: conductor, 206: conductor, 206_1: conductor, 206_2: conductor, 206A_1: conductive film, 207: conductor, 207_1: conductor, 207_2: conductor, 207_3: conductor, 208: conductor, 210: insulator, 211: insulator, 212: insulator, 214: insulator, 216: insulator, 216_1: insulator, 216_2: insulator, 216_3: insulator, 218: conductor, 222: insulator, 222_*n*: insulator, 222_1: insulator, 222_2: insulator, 222_3: insulator, 224: insulator, 224_1: insulator, 224_2: insulator, 230: oxide, 230*a*: oxide, 230*a*_1: oxide, 230*a*_2: oxide, 230A_1: oxide film, 230*b*: oxide, 230*b*_1: oxide, 230*b*_2: oxide, 230B: oxide film, 230B_1: oxide film, 230*c*: oxide, 230*c*_1: oxide, 230*c*_2: oxide, 231_1: opening, 231_2: opening, 232_1: opening, 233: opening, 233_1: opening, 233_2: opening, 234_1: opening, 234_2: opening, 240: conductor, 240_1: conductor, 240_2: conductor, 241: conductor, 242: conductor, 242*a*: conductor, 242*a*_1: conductor, 242*a*_2: conductor, 242A_1: conductor, 242Aa_1: conductive film, 242*b*: conductor, 242*b*_1: conductor, 242*b*_2: conductor, 242*c*: conductor, 244: conductor, 244_1: conductor, 244_2: conductor, 247: conductor, 247_1: conductor, 247_2: conductor, 247A_1: conductive film, 248: conductor, 248_1: conductor, 248_2: conductor, 250: insulator, 250_1: insulator, 250_2: insulator, 260: conductor, 260_1: conductor, 260_2: conductor, 260*a*: conductor, 260*a*_1: conductor, 260*a*_2: conductor, 260*b*: conductor, 260*b*_1: conductor, 260*b*_2: conductor, 272: insulator, 272_1: insulator, 272_2: insulator, 273: insulator, 273_1: insulator, 273_2: insulator, 274: insulator, 274_1: insulator, 274_2: insulator, 275_1: insulator, 275_2: insulator, 276: insulator, 276_1: insulator, 280: insulator, 280_1: insulator, 280_2: insulator, 282: insulator, 282_1: insulator, 282_2: insulator, 283: insulator, 284: insulator, 285: insulator, 285_1: insulator, 285_2: insulator, 287: insulator, 300: transistor, 311: insulator, 313: semiconductor region, 314*a*: low-resistance region, 314*b*: low-resistance region, 315: insulator, 316: conductor, 320: insulator, 322: insulator, 324: insulator, 326: insulator, 328: conductor, 330: conductor, 350: insulator, 352: insulator, 354: insulator, 356: conductor, 430: conductor, 600: cell array, 600_1: cell array, 600_2: cell array, 600_*n*: cell array, 700: electronic component, 702: printed circuit board, 704: mounting board, 711: mold, 712: land, 713: electrode pad, 714: wire, 730: electronic component, 731: interposer, 732: package substrate, 733: electrode, 735: semiconductor device, 901: boundary region, 902: boundary region, 1000: memory device, 1100: USB memory, 1101: housing, 1102: cap, 1103: USB connector, 1104: substrate, 1105: memory chip, 1106: controller chip, 1110: SD card, 1111: housing, 1112: connector, 1113: substrate, 1114: memory chip, 1115: controller chip, 1150: SSD, 1151: housing, 1152: connector, 1153: substrate, 1154: memory chip, 1155: memory chip, 1156: controller chip, 1400: memory device, 1411: peripheral circuit, 1420: row circuit, 1430: column circuit, 1440: output circuit, 1460: control logic circuit, 1470: memory cell array, 1471: memory cell, 1472: memory cell, 1473: memory cell, 5200: portable game console, 5201: housing, 5202: display portion, 5203: button, 5300: desktop information terminal, 5301: main body, 5302: display, 5303: keyboard, 5500: information terminal, 5510: housing, 5511: display portion, 5600: TV, 5650: antenna, 5670: radio wave tower, 5675A: radio wave, 5675B: radio wave, 5680: broadcast station, 5700: automobile, 5701: display panel, 5702: display panel, 5703: display panel, 5704: display panel, 5800: electric refrigerator-freezer, 5801: housing, 5802: refrigerator door, 5803: freezer door

The invention claimed is:

1. A semiconductor device comprising:
   a first transistor; and
   a second transistor and a capacitor over the first transistor,
   wherein the first transistor comprises:
   a first conductor functioning as a first back gate electrode;
   a first oxide over the first conductor, the first oxide comprising a first channel formation region;
   a second conductor over the first oxide, the second conductor functioning as a first gate electrode;
   a third conductor over and in contact with the first oxide, the third conductor functioning as one of a source electrode and a drain electrode,
   wherein the second transistor comprises:
   a fourth conductor functioning as a second back gate electrode;
   a second oxide over the fourth conductor, the second oxide comprising a second channel formation region; and
   a fifth conductor over the second oxide, the fifth conductor functioning as a second gate electrode,
   wherein the capacitor comprises:
   a sixth conductor functioning as one electrode of the capacitor;
   a first insulator over the sixth conductor; and
   a seventh conductor over the first insulator, the seventh conductor functioning as the other electrode of the capacitor,
   wherein the sixth conductor is over and in contact with the third conductor,
   wherein the fourth conductor and the seventh conductor are over and in contact with the first insulator, and
   wherein the sixth conductor overlaps the seventh conductor and does not overlap the fourth conductor.

2. The semiconductor device according to claim 1,
   wherein the first transistor further comprises an eighth conductor functioning as the other of the source electrode and the drain electrode of the first transistor,
   wherein the second transistor further comprises a ninth conductor functioning as one of a source electrode and a drain electrode of the second transistor,
   wherein the eighth conductor is over and in contact with the first oxide,
   wherein the ninth conductor is over and in contact with the second oxide,
   wherein a tenth conductor is in contact with a side surface of the first oxide and a side surface of the eighth conductor, and
   wherein the eighth conductor and the ninth conductor are electrically connected to each other through the tenth conductor.

3. The semiconductor device according to claim 2,
   wherein a top surface of the sixth conductor and a top surface of the tenth conductor are aligned with each other.

4. The semiconductor device according to claim 1,
   wherein each of the first and second oxides contains In, Ga, and Zn.

5. The semiconductor device according to claim 1,
   wherein the fourth conductor and the seventh conductor are provided in the same layer.

6. The semiconductor device according to claim 1,
   wherein a top surface of the fourth conductor and a top surface of the seventh conductor are aligned with each other.

7. The semiconductor device according to claim 1, further comprising:
   a second insulator over the first oxide; and
   a third insulator over the second insulator,
   wherein the second conductor is embedded in a first opening of the second insulator, and
   wherein the sixth conductor is embedded in a second opening of the second insulator and a first opening of the third insulator.

* * * * *